US012564095B2

(12) United States Patent
Choi et al.

(10) Patent No.: US 12,564,095 B2
(45) Date of Patent: Feb. 24, 2026

(54) DISPLAY DEVICE AND METHOD FOR FABRICATION THEREOF

(71) Applicant: Samsung Display Co., LTD., Yongin-si (KR)

(72) Inventors: Jin Woo Choi, Seoul (KR); Min Woo Kim, Hwaseong-si (KR); Sung Kook Park, Suwon-si (KR); Sung Eun Baek, Suwon-si (KR); Hae Yun Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 830 days.

(21) Appl. No.: 17/745,577

(22) Filed: May 16, 2022

(65) Prior Publication Data

US 2023/0048385 A1     Feb. 16, 2023

(30) Foreign Application Priority Data

Aug. 10, 2021     (KR) ........................ 10-2021-0105309

(51) Int. Cl.
H01L 25/18 (2023.01)
H01L 25/00 (2006.01)
(Continued)

(52) U.S. Cl.
CPC .............. H01L 25/18 (2013.01); H01L 25/50 (2013.01); H10H 29/142 (2025.01); *H01L 24/05* (2013.01);
(Continued)

(58) Field of Classification Search
CPC ......... H01L 25/18; H01L 25/50; H01L 24/05; H01L 24/08; H01L 24/13; H01L 24/16;
(Continued)

(56) References Cited

U.S. PATENT DOCUMENTS 9,257,596 B2     2/2016   Straßburg et al.
11,004,894 B2     5/2021   Ahmed et al.
(Continued)

FOREIGN PATENT DOCUMENTS

KR     2014-0119704 A     10/2014
KR     2020-0031189 A     3/2020
(Continued)

*Primary Examiner* — Jacob Y Choi
*Assistant Examiner* — Neil R Prasad
(74) *Attorney, Agent, or Firm* — Womble Bond Dickinson (US) LLP

(57) ABSTRACT

A display device and method for fabrication thereof are provided. The display device includes a first substrate, pixel electrodes on the first substrate, light emitting elements respectively on the pixel electrodes, and including first semiconductor layers, second semiconductor layers, active layers respectively between the first semiconductor layers and the second semiconductor layers, a first light emitting element including a first active layer of the active layers, a second light emitting element including a second active layer of the active layers that is different from the first active layer, a third light emitting element including a third active layer of the active layers that is different from the first and second active layers, and a fourth light emitting element including a fourth active layer of the active layers that is different from the first to third active layers, and a common electrode layer on the light emitting elements.

20 Claims, 40 Drawing Sheets

(51) Int. Cl.
   *H10H 29/14*      (2025.01)
   *H01L 23/00*      (2006.01)

(52) U.S. Cl.
   CPC .............. *H01L 24/08* (2013.01); *H01L 24/13* (2013.01); *H01L 24/16* (2013.01); *H01L 24/29* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/05573* (2013.01); *H01L 2224/08225* (2013.01); *H01L 2224/16145* (2013.01); *H01L 2224/29186* (2013.01); *H01L 2224/32145* (2013.01); *H01L 2224/73104* (2013.01); *H01L 2224/73204* (2013.01); *H01L 2224/81005* (2013.01); *H01L 2224/83005* (2013.01); *H01L 2224/83104* (2013.01); *H01L 2224/9211* (2013.01); *H01L 2224/92125* (2013.01)

(58) Field of Classification Search
   CPC ......... H01L 24/29; H01L 24/32; H01L 24/73; H01L 24/81; H01L 24/83; H01L 24/92; H01L 2224/05573; H01L 2224/08225; H01L 2224/16145; H01L 2224/29186; H01L 2224/32145; H01L 2224/73104; H01L 2224/73204; H01L 2224/81005; H01L 2224/83005; H01L 2224/83104; H01L 2224/9211; H01L 2224/92125; H10H 29/142

See application file for complete search history.

(56)          References Cited

U.S. PATENT DOCUMENTS

| | | | |
|---|---|---|---|
| 12,119,368 B2 | 10/2024 | Lee et al. | |
| 2007/0064178 A1* | 3/2007 | Murai ................. | G02F 1/13394 349/108 |
| 2019/0123033 A1 | 4/2019 | Martin | |
| 2019/0140017 A1* | 5/2019 | Chen .................... | H10H 29/142 |
| 2019/0214529 A1 | 7/2019 | Ahmed | |
| 2019/0386173 A1* | 12/2019 | Chen .................... | H10H 20/812 |
| 2020/0212127 A1* | 7/2020 | Choi ...................... | H10K 50/11 |
| 2020/0274089 A1* | 8/2020 | Son ........................ | H10K 59/87 |
| 2022/0190026 A1* | 6/2022 | Levy ................... | H10H 20/018 |
| 2022/0209066 A1* | 6/2022 | Tan ...................... | H10H 20/817 |
| 2022/0352424 A1 | 11/2022 | Choi et al. | |
| 2023/0027490 A1 | 1/2023 | Kang et al. | |
| 2023/0037052 A1* | 2/2023 | Choi .................... | H10H 20/857 |

FOREIGN PATENT DOCUMENTS

| | | |
|---|---|---|
| KR | 2021-0079433 A | 6/2021 |
| KR | 2021-0082754 A | 7/2021 |

\* cited by examiner

FIG. 1
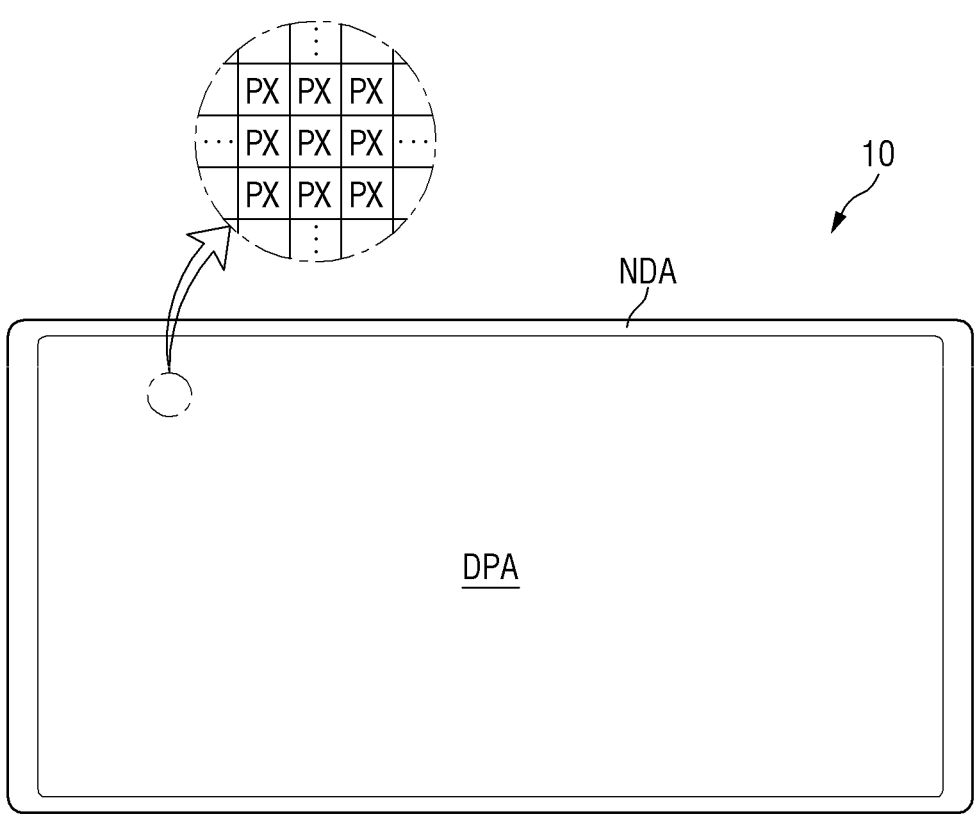
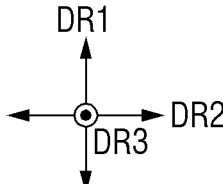

FIG. 2
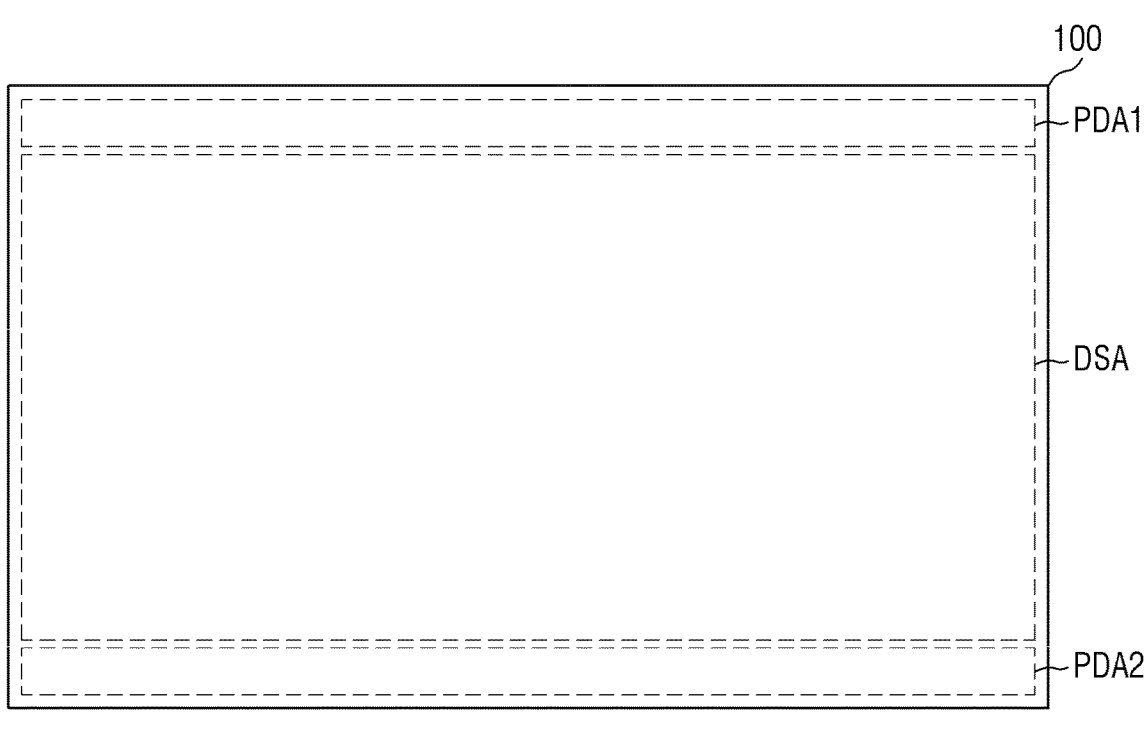
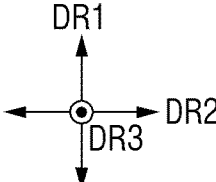

FIG. 3
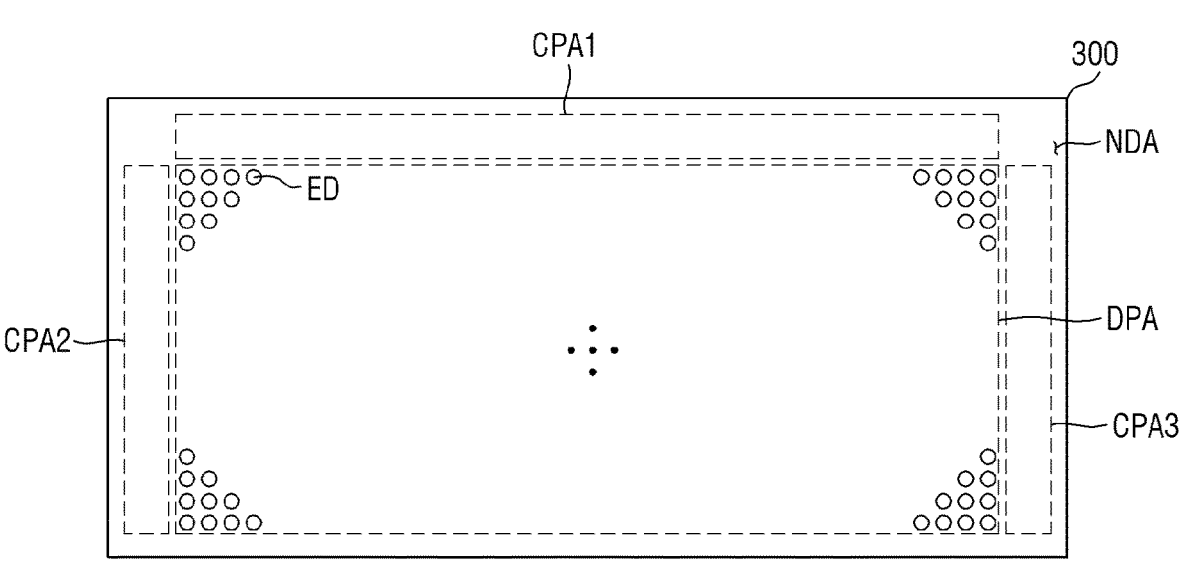
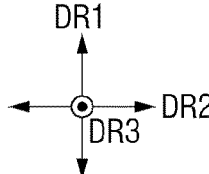

FIG. 6
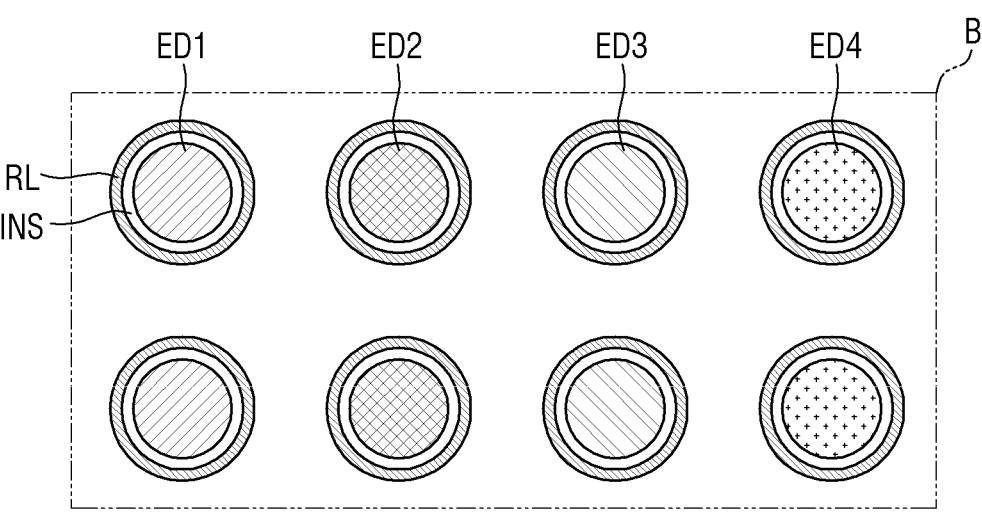
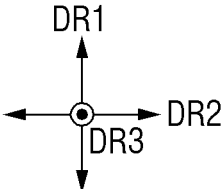

FIG. 8
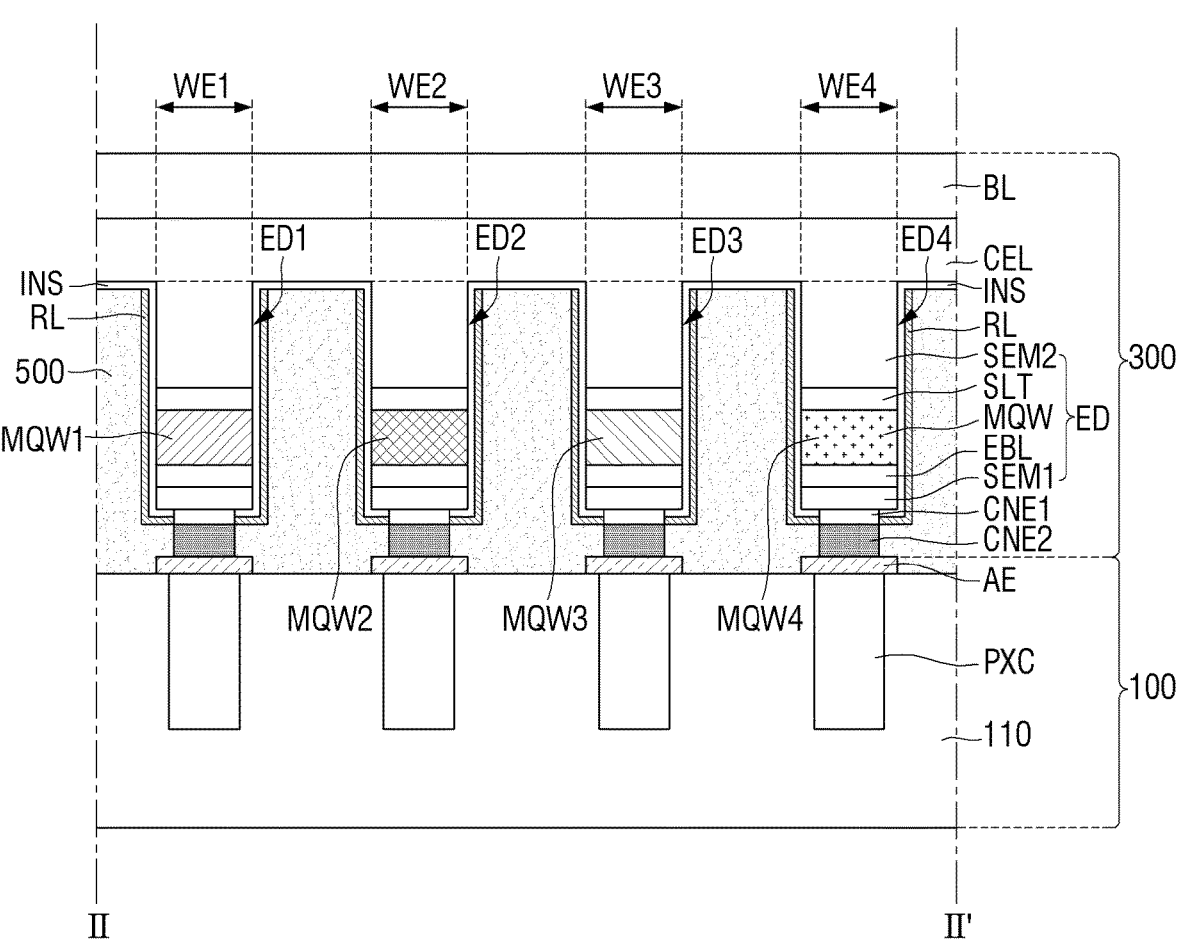
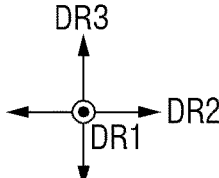

FIG. 9

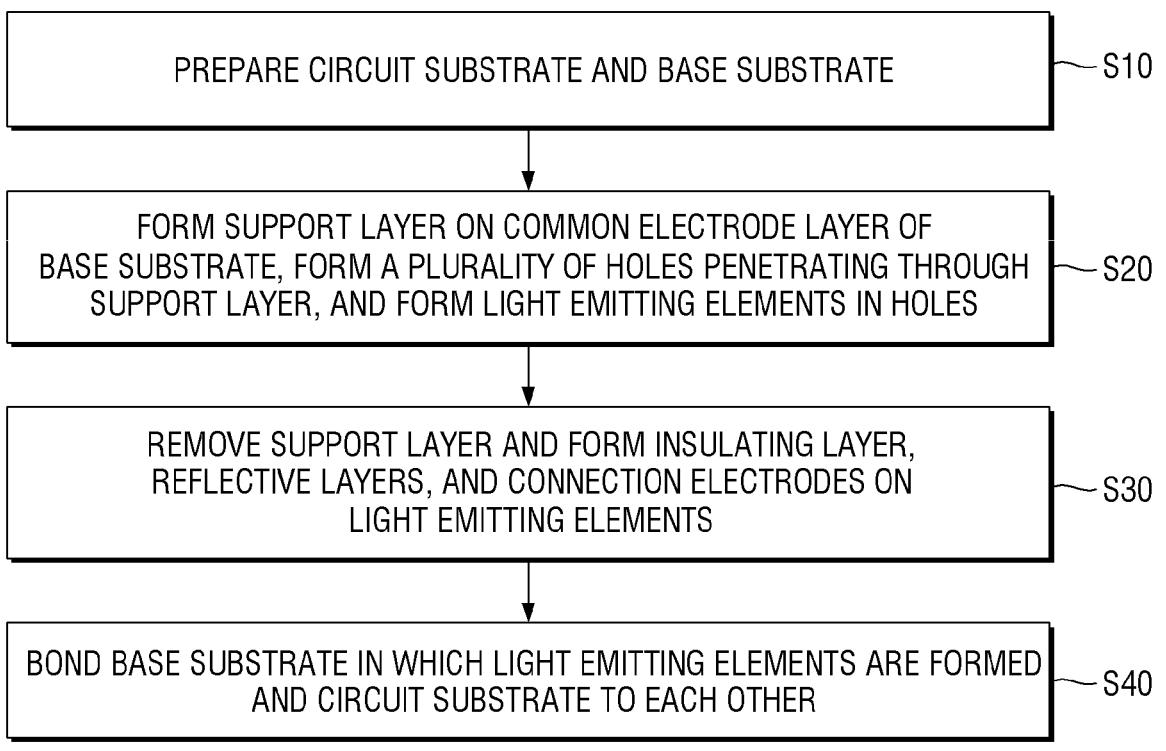

PREPARE CIRCUIT SUBSTRATE AND BASE SUBSTRATE    ~S10

FORM SUPPORT LAYER ON COMMON ELECTRODE LAYER OF
BASE SUBSTRATE, FORM A PLURALITY OF HOLES PENETRATING THROUGH
SUPPORT LAYER, AND FORM LIGHT EMITTING ELEMENTS IN HOLES    ~S20

REMOVE SUPPORT LAYER AND FORM INSULATING LAYER,
REFLECTIVE LAYERS, AND CONNECTION ELECTRODES ON
LIGHT EMITTING ELEMENTS    ~S30

BOND BASE SUBSTRATE IN WHICH LIGHT EMITTING ELEMENTS ARE FORMED
AND CIRCUIT SUBSTRATE TO EACH OTHER    ~S40

FIG. 23
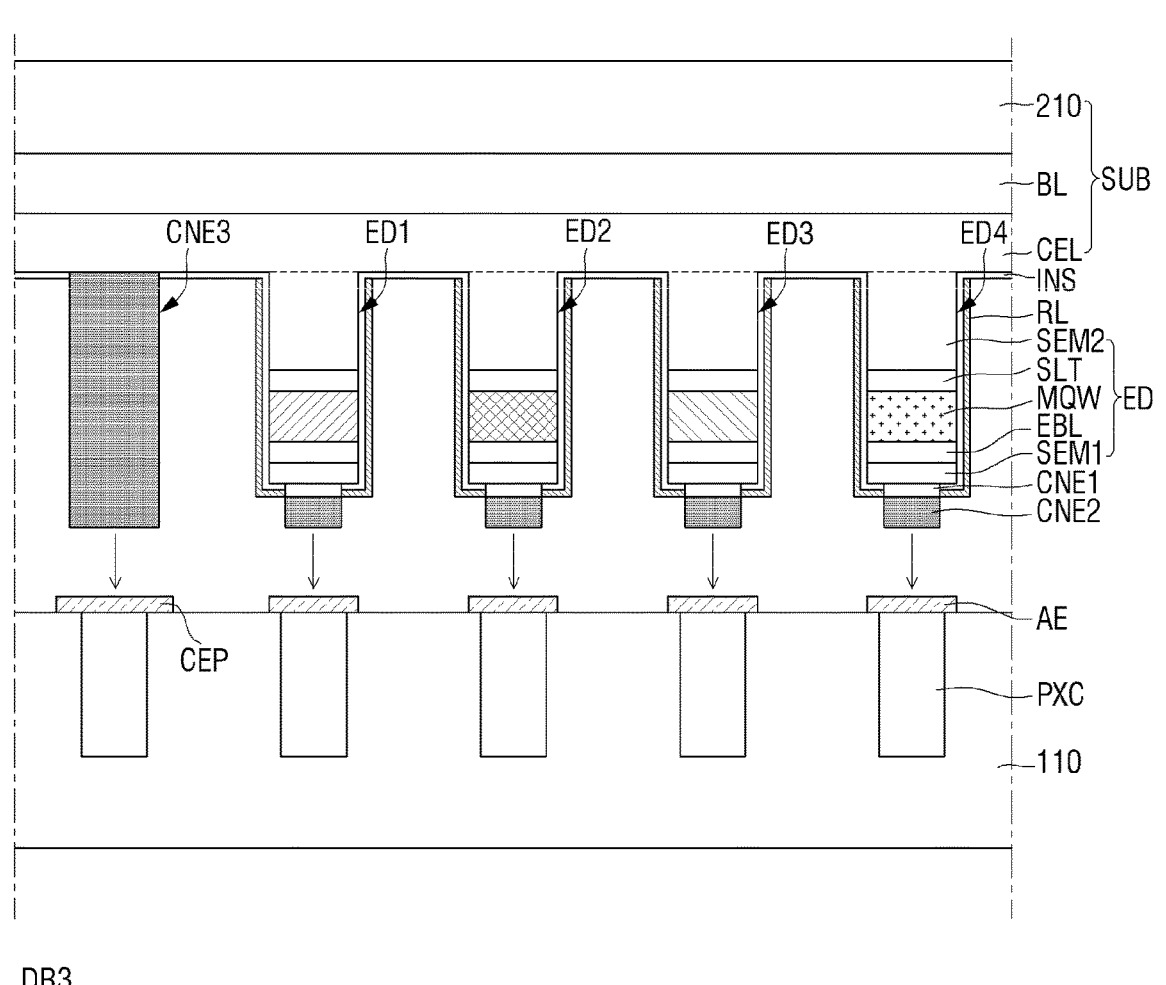
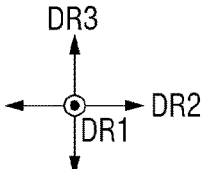

FIG. 29
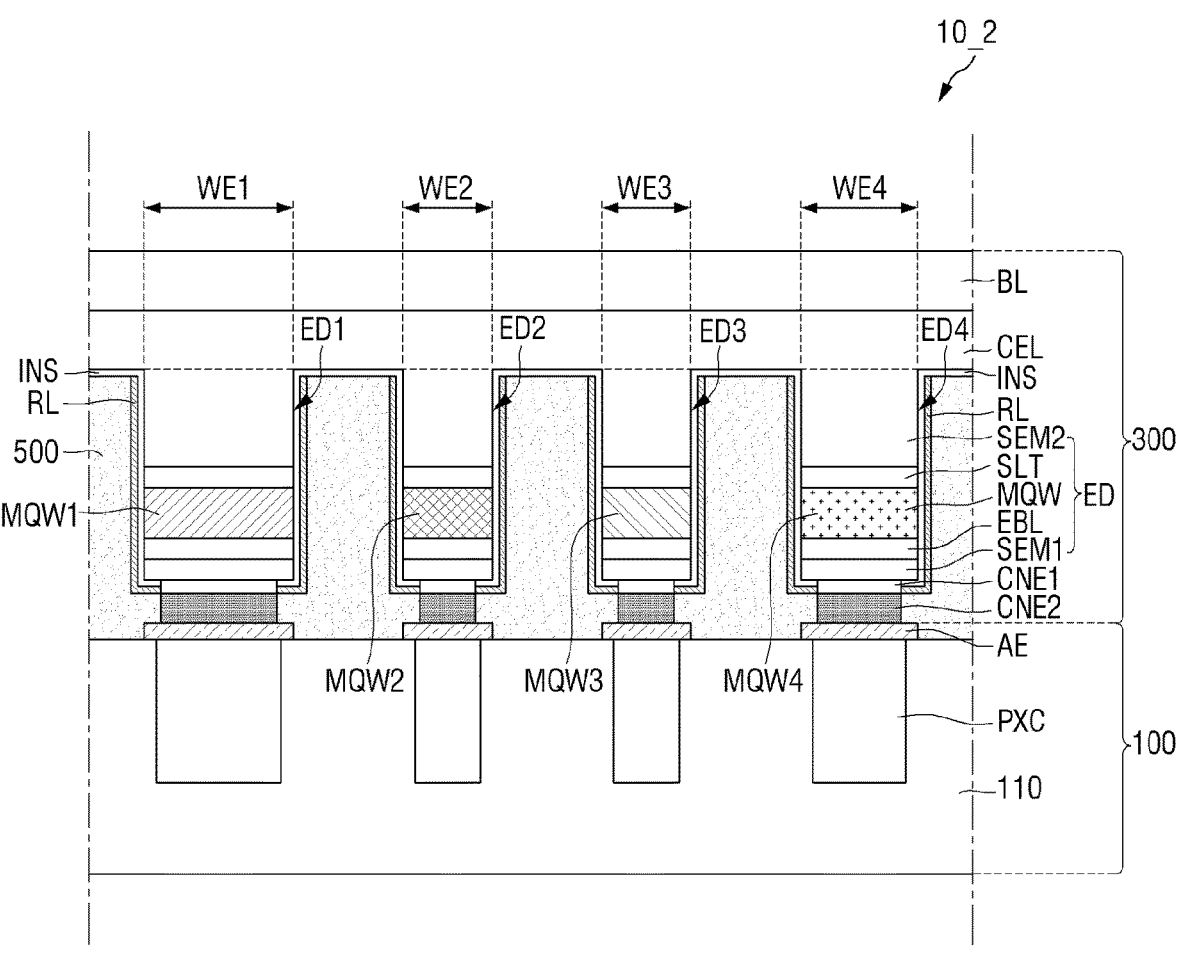
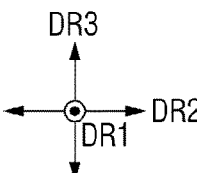

DISPLAY DEVICE AND METHOD FOR FABRICATION THEREOF

CROSS-REFERENCE TO RELATED APPLICATION

This application claims priority to, and the benefit of, Korean Patent Application No. 10-2021-0105309 filed on Aug. 10, 2021 in the Korean Intellectual Property Office, the content of which, in its entirety is, herein incorporated by reference.

BACKGROUND

1. Field

The disclosure relates to a display device and a method for fabrication thereof.

2. Description of the Related Art

As the information society develops, demands for display devices for displaying images are increasing in various forms. The display devices may be flat panel displays, such as liquid crystal displays, field emission displays, and light emitting displays. The light emitting displays may include an organic light emitting display including an organic light emitting diode element as a light emitting element and an inorganic light emitting display including an inorganic semiconductor element as a light emitting element.

Recently, a head-mounted display including a light emitting display has been developed. The head-mounted display is a virtual reality (VR) or augmented reality (AR) glasses-type monitor device that is worn by a user in the form of glasses or a helmet and forms a focus at a short distance in front of the eyes.

SUMMARY

Aspects of the disclosure provide an ultrahigh-resolution display device including inorganic light emitting elements and including a large number of emission areas per unit area.

Aspects of the disclosure also provide a display device in which an amount of light of a corresponding wavelength band is complemented by emitting light of various colors by light emitting elements located in a display area, and a method for fabrication thereof.

However, aspects of the disclosure are not restricted to those set forth herein. The above and other aspects of the disclosure will become more apparent to one of ordinary skill in the art to which the disclosure pertains by referencing the detailed description of the disclosure given below.

The display device according to some embodiments includes light emitting elements for emitting light of different colors to complement an amount of light of a corresponding color displayed in each pixel, such that a display quality may be improved.

The aspects of the disclosure are not limited to the aforementioned aspects, and various other aspects are included in the specification.

According to some embodiments of the disclosure, a display device includes a first substrate, pixel electrodes on the first substrate, light emitting elements respectively on the pixel electrodes, and including first semiconductor layers, second semiconductor layers, active layers respectively between the first semiconductor layers and the second semiconductor layers, a first light emitting element including a first active layer of the active layers, a second light emitting element including a second active layer of the active layers that is different from the first active layer, a third light emitting element including a third active layer of the active layers that is different from the first and second active layers, and a fourth light emitting element including a fourth active layer of the active layers that is different from the first to third active layers, and a common electrode layer on the light emitting elements.

The active layers may include indium, wherein a content of indium in the first active layer is higher than contents of indium in the second to fourth active layers, wherein a content of indium in the second active layer is higher than contents of indium in the third and fourth active layers, and wherein a content of indium in the third active layer is higher than a content of indium in the fourth active layer.

The first light emitting element may be configured to emit light of a first color having a central wavelength band in a range of about 600 nm to about 750 nm, wherein the second light emitting element is configured to emit light of a second color having a central wavelength band in a range of about 550 nm to about 600 nm, wherein the third light emitting element is configured to emit light of a third color having a central wavelength band in a range of about 480 nm to about 560 nm, and wherein the fourth light emitting element is configured to emit light of a fourth color having a central wavelength band in a range of about 370 nm to about 460 nm.

Diameters of the first to fourth light emitting elements may be the same.

A diameter of the first light emitting element may be greater than diameters of the second to fourth light emitting elements, wherein a diameter of the fourth light emitting element is greater than diameters of the second and third light emitting elements.

The diameters of the second light emitting element and the third light emitting element may be the same.

The common electrode layer may include a same material as the second semiconductor layers, wherein the second semiconductor layers are integrated with the common electrode layer.

The display device may further include first connection electrodes respectively on the first semiconductor layers, second connection electrodes respectively between the first connection electrodes and the pixel electrodes, and third connection electrodes on a surface of the common electrode layer on which the light emitting elements are located, wherein the second connection electrodes are in direct contact with the pixel electrodes, respectively, and the third connection electrodes are in direct contact with common electrode connection parts on the first substrate, respectively.

The display device may further include an insulating layer surrounding side surfaces of the light emitting elements, and having portions directly on the common electrode layer, and reflective layers surrounding the side surfaces of the light emitting elements on the insulating layer.

The display device may further include a base layer on the common electrode layer, and including an undoped semiconductor.

According to some embodiments of the disclosure, a display device includes a first substrate including a display area, and a non-display area surrounding the display area, pixel electrodes on the first substrate in the display area, light emitting elements respectively on the pixel electrodes, and including first semiconductor layers, second semiconductor layers, active layers respectively between the first semiconductor layers and the second semiconductor layers, a first light emitting element configured to emit light of a first color having a central wavelength band in a range of about 600 nm to about 750 nm, a second light emitting element configured to emit light of a second color having a central wavelength band in a range of about 550 nm to about 600 nm, a third light emitting element configured to emit light of a third color having a central wavelength band in a range of about 480 nm to about 560 nm, and a fourth light emitting element configured to emit light of a fourth color having a central wavelength band in a range of about 370 nm to about 460 nm, and a common electrode layer in the display area and the non-display area, and connected to on the light emitting elements.

The light emitting elements may be spaced apart in a first direction, and in a second direction crossing the first direction, wherein the first, second, third, and fourth light emitting elements are alternately in the second direction.

The second light emitting element and the third light emitting element may be spaced apart in a first direction, wherein the first light emitting element and the fourth light emitting element are spaced apart in a second direction crossing the first direction, wherein the first light emitting element and the second light emitting element are spaced apart in a first diagonal direction between one side in the first direction and one side in the second direction, and wherein the third light emitting element and the fourth light emitting element are spaced apart in a second diagonal direction between one side in the first direction and another side in the second direction.

A diameter of the first light emitting element may be greater than diameters of the second to fourth light emitting elements, wherein a diameter of the fourth light emitting element is greater than diameters of the second and third light emitting elements, and wherein the diameters of the second light emitting element and the third light emitting element are the same.

An interval between the second light emitting element and the third light emitting element may be greater than an interval between the first light emitting element and the fourth light emitting element, wherein an interval between the first light emitting element and the second light emitting element is less than an interval between the third light emitting element and the fourth light emitting element.

Diameters of the first light emitting element, the second light emitting element, the third light emitting element, and the fourth light emitting element may be the same.

The first light emitting element and the third light emitting element may be spaced apart in a first direction, wherein the second light emitting element and the fourth light emitting element are spaced apart in the first direction, wherein the first light emitting element and the fourth light emitting element are spaced apart in a first diagonal direction that is an oblique direction inclined from the first direction, and wherein the second light emitting element and the third light emitting element are spaced apart in a second diagonal direction crossing the first diagonal direction.

Central portions of the first and third light emitting elements may be positioned on a first reference line extending in the first direction, wherein central portions of the second and fourth light emitting elements are positioned on a second reference line extending in the first direction.

A central portion of the second light emitting element may be spaced apart from a third reference line in the first direction, the third reference line traversing a central portion of the first light emitting element in a second direction crossing the first direction, wherein a central portion of the fourth light emitting element is spaced apart from a fourth reference line in the first direction, the fourth reference line traversing a central portion of the third light emitting element in the second direction.

According to some embodiments of the disclosure, a method for fabrication of a display device includes forming a support layer on a common electrode layer including an n-type semiconductor, forming first, second, third, and fourth holes penetrating through the support layer, forming light emitting elements including a first semiconductor layer that is a p-type semiconductor, a second semiconductor layer that is an n-type semiconductor, and an active layer between the first semiconductor layer and the second semiconductor layer, and disposing the light emitting elements on a circuit substrate on which pixel electrodes are located, wherein the light emitting elements include a first light emitting element including a first active layer, a second light emitting element including a second active layer, a third light emitting element including a third active layer, and a fourth light emitting element including a fourth active layer, and wherein forming of the light emitting elements includes forming the fourth light emitting element on the common electrode layer exposed by the first hole, forming the third light emitting element on the common electrode layer exposed by the second hole, forming the second light emitting element on the common electrode layer exposed by the third hole, and forming the first light emitting element on the common electrode layer exposed by the fourth hole.

BRIEF DESCRIPTION OF THE DRAWINGS

The above and other aspects of the disclosure will become more apparent by describing in detail embodiments thereof with reference to the attached drawings, in which:

FIG. 1 is a plan view of a display device according to some embodiments;

FIG. 2 is a schematic plan view of a circuit substrate of the display device according to some embodiments;

FIG. 3 is a schematic plan view of a display substrate of the display device according to some embodiments;

FIG. 6 is an enlarged view of portion B of FIG. 5;

FIG. 8 is a cross-sectional view taken along the line II-II' of FIG. 5;

FIG. 9 is a flowchart illustrating a method for fabrication of the display device according to some embodiments;

FIGS. 10 to 24 are cross-sectional views sequentially illustrating processes for fabrication of the display device according to some embodiments;

FIG. 29 is a cross-sectional view illustrating a portion of the display device of FIG. 28;

FIG. 32 is a cross-sectional view illustrating a portion of a display device according to other embodiments;

DETAILED DESCRIPTION

Figure 4:
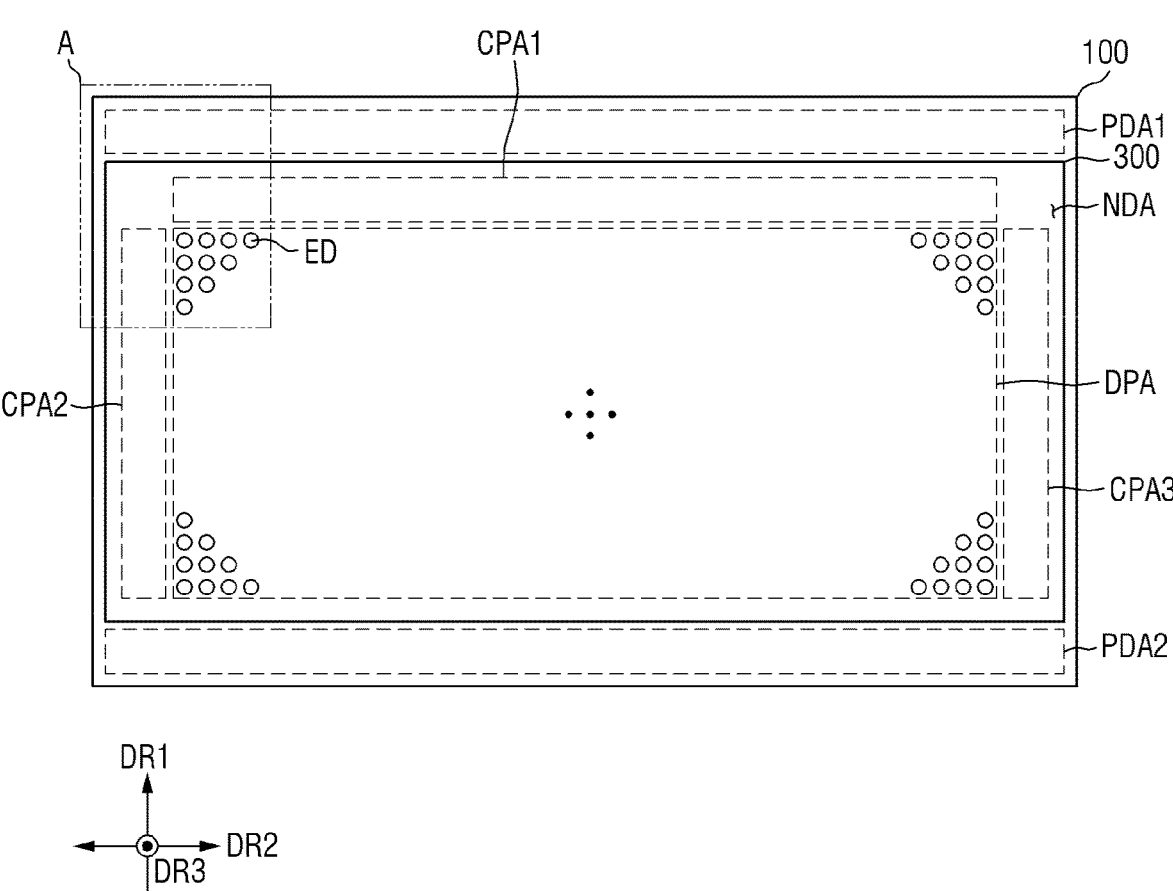
FIG. 4 is a plan view of the circuit substrate and the display substrate of FIGS. 2 and 3.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view of a display device according to some embodiments.

Referring to FIG. 1, a display device 10 displays a moving image or a still image. The display device 10 may refer to all electronic devices that provide display screens. For example, televisions, laptop computers, monitors, billboards, the Internet of Things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras, camcorders, and the like, which provide display screens, may be included in the display device 10.

The display device 10 includes a display panel providing a display screen. Examples of the display panel include an inorganic light emitting diode display panel, an organic light emitting display panel, a quantum dot light emitting display panel, a plasma display panel, a field emission display panel, and the like. Hereinafter, a display device in which inorganic light emitting diodes are located on a semiconductor circuit substrate will be described as an example of the display panel, but the disclosure is not limited thereto, and the same technical idea may also be applied to other display panels if applicable.

A shape of the display device 10 may be variously changed. For example, the display device 10 may have a shape such as a rectangular shape with a width greater than a length, a rectangular shape with a length greater than a width, a square shape, a rectangular shape with rounded corners (vertices), other polygonal shapes, or a circular shape. A shape of a display area DPA of the display device 10 may also be similar to an overall shape of the display device 10. In FIG. 1, the display device 10 having a rectangular shape with a greater length/width in a second direction DR2, as compared to the first direction DR1, is illustrated.

In the specification, a first direction DR1 refers to a length direction of the display device 10, a second direction DR2 refers to a width direction of the display device 10, and a third direction DR3 refers to a thickness direction of the display device 10. The terms "above", "top", and "upper surface" as used herein refer to one side in the third direction DR3. The terms "under", "bottom", and "lower surface" as used herein refer to the other side in the third direction DR3. "Left", "right", "upper", and "lower" refer to directions when the drawings are viewed in plan view. For example, "upper" and "lower" refer to the first direction DR1, and "left" and "right" refer to the second direction DR2.

The display device 10 may include a display area DPA and a non-display area NDA. The display area DPA is an area in which a screen may be displayed, and the non-display area NDA is an area in which a screen is not displayed. The display area DPA may also be referred to as an active area, and the non-display area NDA may also be referred to as a non-active area. The display area DPA may be generally located at the center of the display device 10.

The non-display area NDA may be located around the display area DPA. The non-display area NDA may entirely or partially surround the display area DPA. The display area DPA may have a rectangular shape, and the non-display area NDA may be located adjacent to four sides of the display area DPA. The non-display area NDA may constitute a bezel of the display device 10. Lines or circuit drivers included in the display device 10 may be located, or external devices may be mounted, in each of the non-display areas NDA.

FIG. 2 is a schematic plan view of a circuit substrate of the display device according to some embodiments. FIG. 3 is a schematic plan view of a display substrate of the display device according to some embodiments. FIG. 4 is a plan view of the circuit substrate and the display substrate of FIGS. 2 and 3.

Referring to FIGS. 2 to 4 in conjunction with FIG. 1, the display device 10 according to some embodiments may include a circuit substrate 100 and a display substrate 300.

The circuit substrate 100 may include pixel circuit parts PXC (see FIG. 7) electrically connected to light emitting elements ED included in the display substrate 300, and a plurality of pads PD (see FIG. 5) electrically connected to lines of the pixel circuit parts PXC. The circuit substrate 100 may include a display substrate area DSA positioned at a central portion, a non-display area NDA located around the display substrate area DSA, and pad areas PDA1 and PDA2 located on respective sides of the display substrate area DSA in the first direction DR1 and in the non-display area NDA.

The display substrate area DSA of the circuit substrate 100 is an area on which the display substrate 300 is located, and the pixel circuit parts PXC may be located in the display substrate area DSA. The pad areas PDA1 and PDA2 may include a first pad area PDA1 located on the upper side of the display substrate area DSA, which is one side of the display substrate area DSA in the first direction DR1, and a second pad area PDA2 located on the lower side of the display substrate area DSA, which is the other side of the display substrate area DSA in the first direction DR1. A plurality of pads PD electrically connected to the pixel circuit parts PXC may be located in each of the pad areas PDA1 and PDA2 of the circuit substrate 100.

The plurality of pads PD may be located to be spaced apart from each other in the second direction DR2. The plurality of pads PD (see FIG. 5) may be located on an upper surface of the circuit substrate 100 and may be electrically connected to circuit board pads PDC (see FIG. 7) of a circuit board 700 (see FIG. 7).

The display substrate 300 may be located on the circuit substrate 100. The display substrate 300 may include a display area DPA and a non-display area NDA, and may include common electrode areas CPA1, CPA2, and CPA3 adjacent to the display area DPA as portions of the non-display area NDA. The common electrode areas CPA1, CPA2, and CPA3 may include a first common electrode area CPA1 located on the upper side of the display area DPA, a second common electrode area CPA2 located on the left side of the display area DPA, which is one side of the display area DPA in the second direction DR2, and a third common electrode area CPA3 located on the right side of the display area DPA, which is the other side of the display area DPA in the second direction DR2.

The display substrate 300 may include a plurality of light emitting elements ED located in the display area DPA. The light emitting elements ED may be arranged to be spaced apart from each other in the first direction DR1 and the second direction DR2 in the display area DPA, and may be located to correspond to a plurality of pixel electrodes AE (see FIG. 7) connected to the pixel circuit parts PXC of the circuit substrate 100. The light emitting elements ED may emit light by receiving electrical signals applied from the pixel circuit parts PXC of the circuit substrate 100. Hereinafter, a structure of the display device 10 will be described in more detail with reference to other drawings.

Figure 5:
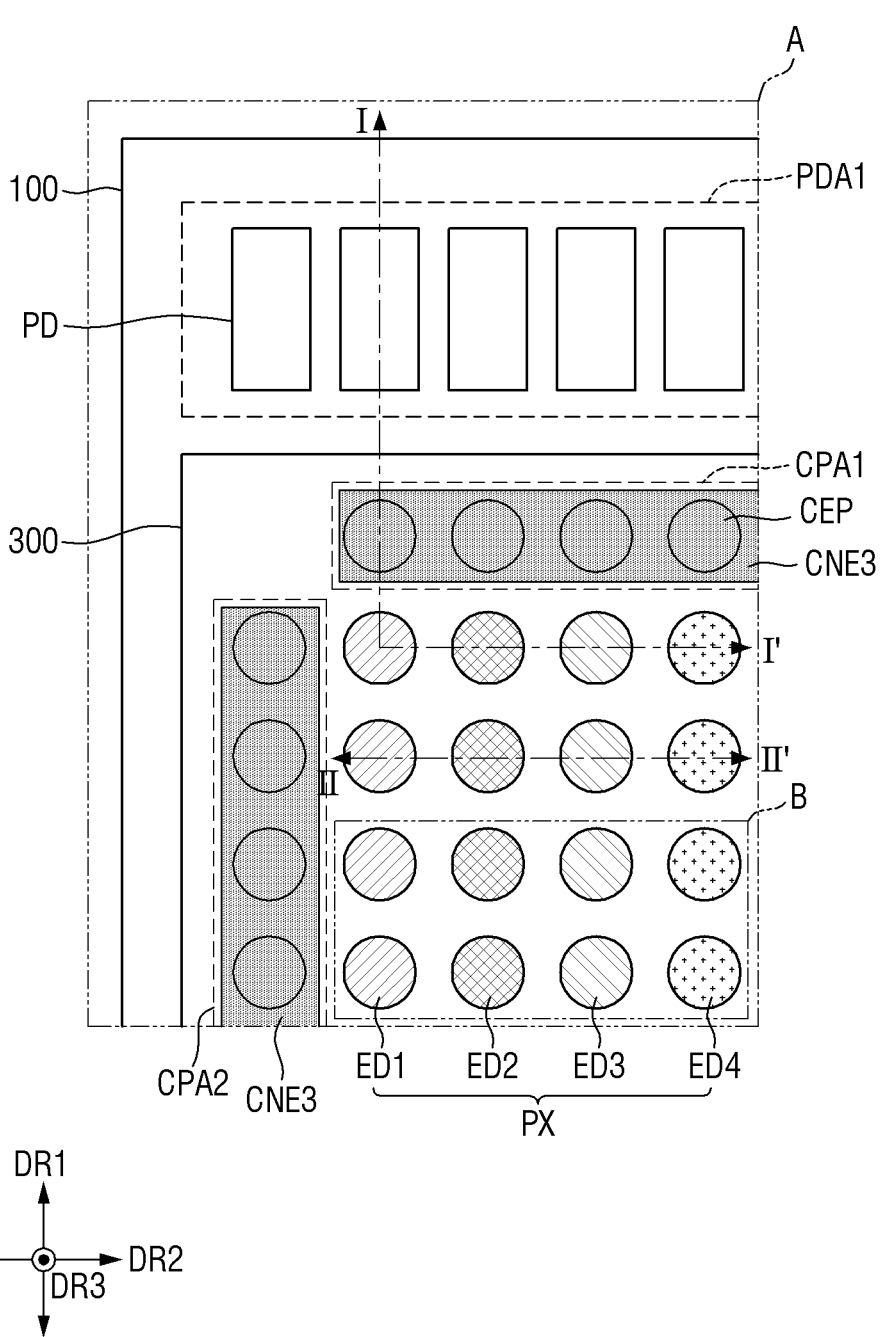
FIG. 5 is an enlarged view of portion A of FIG. 4.

FIG. 5 is an enlarged view of portion A of FIG. 4. FIG. 6 is an enlarged view of portion B of FIG. 5. FIG. 5 illustrates a portion of the circuit substrate 100 and the display substrate 300 at a corner portion of the display device 10 in an enlarged form, and FIG. 6 schematically illustrates a layout of light emitting elements ED located in the display substrate 300.

Referring to FIGS. 5 and 6, the display substrate 300 of the display device 10 may include a plurality of pixels PXs located in the display area DPA. The plurality of pixels PX may include a plurality of light emitting elements ED, and may be arranged in a matrix direction, similar to the light emitting elements ED. Each of the pixels PX may include one or more light emitting elements ED to display a corresponding color. In the display device 10, one pixel PX including a plurality of light emitting elements ED: ED1, ED2, ED3, and ED4 may have a minimum light emitting unit.

For example, one pixel PX may include a first light emitting element ED1, a second light emitting element ED2, a third light emitting element ED3, and a fourth light emitting element ED4. The first light emitting element ED1 may emit light of a first color, the second light emitting element ED2 may emit light of a second color, the third light emitting element ED3 may emit light of a third color, and the fourth light emitting element ED4 may emit light of a fourth color. As an example, the first color may be red, the second color may be yellow, the third color may be green, and the fourth color may be blue. However, the disclosure is not limited thereto, and the respective light emitting elements ED may emit light of the same color. In some embodiments, one pixel PX may include four light emitting elements ED1, ED2, ED3, and ED4, but is not limited thereto. For example, one pixel PX may include four or more light emitting elements. Each of the light emitting elements ED may have a circular shape in plan view. However, the disclosure is not limited thereto. For example, the light emitting element ED may have a polygonal shape such as a quadrangular shape, an elliptical shape, or an irregular shape other than the circular shape.

The plurality of light emitting elements ED1, ED2, ED3, and ED4 may be located to be spaced apart from each other in the first direction DR1 and the second direction DR2. A plurality of first light emitting elements ED1, second light emitting elements ED2, third light emitting elements ED3, and fourth light emitting elements ED4 may be repeatedly located to be spaced apart from each other in the first direction DR1, respectively, and the first light emitting elements ED1, the second light emitting elements ED2, the third light emitting elements ED3, and the fourth light emitting element ED4 (e.g., columns thereof) may be alternately arranged in the second direction DR2. The first light emitting elements ED1, the second light emitting elements ED2, the third light emitting elements ED3, and the fourth light emitting element ED4 may be sequentially located in the second direction DR2, and such an arrangement may be repeated. The light emitting elements ED may be respectively electrically connected to a pixel electrode AE (see FIG. 7) of the circuit substrate 100 through a first connection electrode CNE1 (see FIG. 7) and a second connection electrode CNE2 (see FIG. 7) to be described later. In addition, each of the light emitting elements ED may be electrically connected to a common electrode layer CEL (see FIG. 7) of the display substrate 300.

Common electrode connection parts CEP and third connection electrodes CNE3 may be located in the common electrode areas CPA1 and CPA2 of the non-display area NDA. The common electrode connection parts CEP may be located in the circuit substrate 100, and the third connection electrodes CNE3 may be located in the display substrate 300. A plurality of common electrode connection parts CEP may be spaced apart from each other in the first direction DR1 and the second direction DR2 in the common electrode areas CPA1, CPA2, and CPA3. According to some embodiments, an arrangement of the plurality of common electrode connection parts CEP may be similar to that of the light emitting elements ED. Because the light emitting elements ED are formed to correspond to the pixel electrodes AE of the circuit substrate 100, and because the pixel electrodes AE and the common electrode connection parts CEP have a similar arrangement, the arrangement of the common electrode connection parts CEP may be similar to that of the light emitting elements ED. However, the disclosure is not limited thereto.

The third connection electrodes CNE3 may be located in each of the common electrode areas CPA1, CPA2, and CPA3 to overlap the plurality of common electrode connection parts CEP. One third connection electrode CNE3 may be located to overlap the plurality of common electrode connection parts CEP, but is not limited thereto. In some embodiments, the third connection electrodes CNE3 may also be formed to correspond to each of the common electrode connection parts CEP. The third connection electrodes CNE3 may be electrically connected to the common electrode connection parts CEP and the common electrode layer CEL of the display substrate 300.

Outer surfaces of the light emitting elements ED may be surrounded by an insulating layer INS and reflective layers RL. The insulating layer INS may be located on a side surface of each of the light emitting elements ED, and may also be located on one surface of a common electrode layer CEL (see FIG. 7) to be described later. The insulating layer INS may partially surround the light emitting elements ED, and portions of the insulating layer INS surrounding the light emitting elements ED may be spaced apart from each other in the first direction DR1 and the second direction DR2 in plan view. The insulating layer INS may protect each of the plurality of light emitting elements ED, and may insulate the plurality of light emitting elements ED from other layers. The insulating layer INS may include an inorganic insulating material such as silicon oxide ($SiO_x$), silicon nitride ($SiN_x$), silicon oxynitride ($SiO_xN_y$), aluminum oxide ($AlO_x$), or aluminum nitride ($AlN_x$).

The reflective layers RL may be located to surround side surfaces of the light emitting elements ED. The reflective layers RL may be located to correspond to the respective light emitting elements ED in the display area DPA, and may be located directly on the insulating layer INS located on the side surfaces of the light emitting elements ED. Because the reflective layers RL are located to correspond to, and to surround, the light emitting elements ED spaced apart from each other, the reflective layers RL that are different from each other may be spaced apart from each other in the first direction DR1 and the second direction DR2 in plan view. The reflective layers RL may reflect light emitted from the light emitting elements ED. The reflective layer RL may include a metal material having high reflectivity, such as aluminum (Al). A thickness of the reflective layer RL may be about 0.1 μm, but is not limited thereto.

A plurality of pads PD may be located in the pad area PDA of the circuit substrate 100. The respective pads PD may be electrically connected to circuit board pads PDC (see FIG. 7) located on an external circuit board 700. The plurality of pads PD may be arranged to be spaced apart from each other in the second direction DR2 in the pad area PDA. A layout of the respective pads PD may be designed according to the number of light emitting elements ED located in the display area DPA and according to a layout of lines electrically connected to the light emitting elements ED. A layout of the pads PD may be variously modified according to a layout of the light emitting elements ED and according to the layout of the lines electrically connected to the light emitting elements ED.

Figure 7:
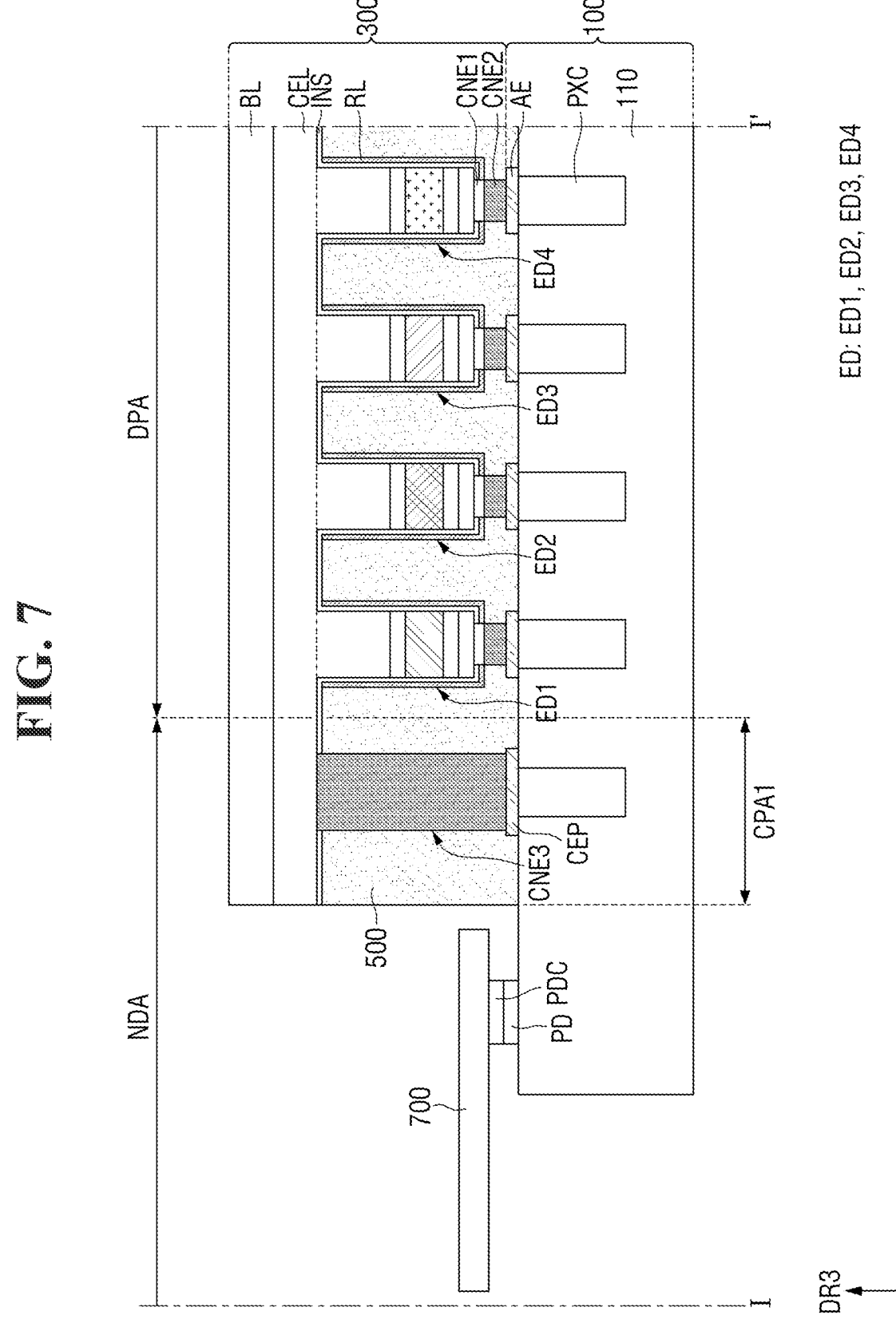
FIG. 7 is a cross-sectional view taken along the line I-I' of FIG. 5.

FIG. 7 is a cross-sectional view taken along the line I-I' of FIG. 5. FIG. 8 is a cross-sectional view taken along the line II-II' of FIG. 5. FIGS. 7 and 8 illustrate cross-sections crossing the plurality of light emitting elements ED and the common electrode connection parts CEP located in the non-display area NDA and the display area DPA of the display substrate 300.

Referring to FIGS. 7 and 8 in conjunction with FIGS. 5 and 6, in the display device 10 according to some embodiments, the circuit substrate 100 may include a first substrate 110, pixel circuit parts PXC, and a plurality of pads PD, and the display substrate 300 may include light emitting elements ED, connection electrodes CNE1, CNE2, and CNE3, and a common electrode layer CEL. The display device 10 may further include a filling layer 500 located between the circuit substrate 100 and the display substrate 300, and a circuit board 700 located on the non-display area NDA of the circuit substrate 100.

The first substrate 110 may be a semiconductor circuit substrate. The first substrate 110 may be a silicon wafer substrate formed using a semiconductor process, and may include a plurality of pixel circuit parts PXC. Each of the pixel circuit parts PXC may be formed through a process of forming a semiconductor circuit on a silicon wafer. Each of the plurality of pixel circuit parts PXC may include at least one transistor and at least one capacitor formed by the semiconductor process. For example, the plurality of pixel circuit parts PXC may include complementary metal oxide semiconductor (CMOS) circuits.

The plurality of pixel circuit parts PXC may be located in the display area DPA and the non-display area NDA. Pixel circuit parts PXC located in the display area DPA, among the plurality of pixel circuit parts PXC, may be electrically connected to the pixel electrodes AE, respectively. A plurality of pixel circuit parts PXC located in the display area DPA may be located to correspond to a plurality of pixel electrodes AE, and may respectively overlap, in the third direction DR3/thickness direction, the light emitting elements ED located in the display area DPA.

Pixel circuit parts PXC located in the non-display area NDA, among the plurality of pixel circuit parts PXC, may be respectively electrically connected to common electrode connection parts CEP. The plurality of pixel circuit parts PXC located in the non-display area NDA may be located to correspond to a plurality of common electrode connection parts CEP, and may respectively overlap common electrode connection parts CEP and third connection electrodes CNE3 located in the non-display area NDA, in the third direction DR3.

The plurality of pixel electrodes AE may be located in the display area DPA, and may be located on the pixel circuit parts PXC corresponding to the plurality of pixel electrodes AE, respectively. Each of the pixel electrodes AE may be an exposed electrode formed integrally with a corresponding pixel circuit part PXC and exposed from the pixel circuit part PXC. The plurality of common electrode connection parts CEP may be located in the common electrode areas CPA1, CPA2, and CPA3 of the non-display area NDA, and may be located on the pixel circuit parts PXC corresponding to the plurality of common electrode connection parts CEP, respectively. The common electrode connection part CEP may be an exposed electrode formed integrally with the pixel circuit part PXC and exposed from the pixel circuit part PXC. Each of the pixel electrodes AE and the common electrode connection parts CEP may include a metal material such as aluminum (Al).

The plurality of pads PD are located in the pad area PDA in the non-display area NDA. The plurality of pads PD are located to be spaced apart from the common electrode connection part CEP. The plurality of pads PD may be spaced apart from the common electrode connection part CEP to the outside of the non-display area NDA. The plurality of pads PD may be electrically connected to the circuit board pads PDC of the circuit board 700, respectively. The plurality of pads PD may be in direct contact with and electrically connected to the circuit board pads PDC. However, the disclosure is not limited thereto, and the plurality of pads PD may also be electrically connected to the circuit board pads PDC through conducting wires such as wires WR.

The circuit board 700 may be a flexible film such as a flexible printed circuit board (FPCB), a printed circuit board (PCB), a flexible printed circuit (FPC), or a chip on film (COF).

The display substrate 300 may include the plurality of light emitting elements ED, and may be located on the display substrate area DSA of the circuit substrate 100. The light emitting elements ED may be located in the display area DPA of the display substrate 300 so as to correspond to the plurality of pixel electrodes AE of the circuit substrate 100.

Each of the light emitting elements ED may be an inorganic light emitting diode element. Each of the light emitting elements ED may include a plurality of semiconductor layers SEM1, SEM2, EBL, and SLT, and an active layer MQW. The light emitting elements ED may be electrically connected to the pixel circuit parts PXC of the circuit substrate 100 to emit light at the active layers MQW.

Each of the light emitting elements ED may have a shape extending in the third direction DR3. A length of the light emitting element ED in the third direction DR3 may be greater than a length/width of the light emitting element ED in a horizontal direction. As an example, the length of the light emitting element ED in the third direction D3 may be about 1 μm to about 5 μm. The light emitting element ED may have a cylindrical shape, a disk shape, or a rod shape with a width that is greater than a height. However, the disclosure is not limited thereto, and the light emitting element ED may have a shape such as a rod shape, a wire shape, or a tube shape, or a polygonal prism shape such as a cube shape, a rectangular parallelepiped shape, or a hexagonal prism shape, or may have various shapes such as a shape extending in one direction and having outer surfaces partially inclined.

According to some embodiments, each of the light emitting elements ED may include a first semiconductor layer SEM1, an electron blocking layer EBL, an active layer MQW, a superlattice layer SLT, and a second semiconductor layer SEM2. The first semiconductor layer SEM1, the electron blocking layer EBL, the active layer MQW, the superlattice layer SLT, and the second semiconductor layer SEM2 may be sequentially stacked in the third direction DR3.

The first semiconductor layer SEM1 may be a p-type semiconductor, and may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with a p-type dopant. The first semiconductor layer SEM1 may be doped with a p-type dopant, which may be Mg, Zn, Ca, Ba, or the like. For example, the first semiconductor layer SEM1 may be made of p-GaN doped with p-type Mg. The first semiconductor layer SEM1 may have a thickness in a range of about 30 nm to about 200 nm.

The electron blocking layer EBL may be located on the first semiconductor layer SEM1. The electron blocking layer EBL may reduce or prevent the likelihood of a phenomenon in which electrons introduced into the active layer MQW are not recombined with holes in the active layer MQW and are then injected to other layers. For example, the electron blocking layer EBL may be made of p-AlGaN doped with p-type Mg. A thickness of the electron blocking layer EBL may be in the range of about 10 nm to about 50 nm, but is not limited thereto. In some embodiments, the electron blocking layer EBL may be omitted.

The active layer MQW may be located on the electron blocking layer EBL. The active layer MQW may emit light by a recombination of electrons and holes according to light emitting signals applied through the first semiconductor layer SEM1 and the second semiconductor layer SEM2. The active layer MQW may include a material having a single or multiple quantum well structure. When the active layer MQW includes the material having the multiple quantum well structure, the active layer MQW may have a structure in which a plurality of well layers and barrier layers are alternately stacked. In this case, the well layer may be made of InGaN, and the barrier layer may be made of GaN or AlGaN, but the disclosure is not limited thereto. For example, the active layer MQW may have a structure in which semiconductor materials having large band gap energy and semiconductor materials having small band gap energy are alternately stacked, and may include other Group III to Group V semiconductor materials depending on a wavelength band of emitted light.

The superlattice layer SLT is located on the active layer MQW. The superlattice layer SLT may alleviate stress due to a difference in lattice constant between the second semiconductor layer SEM2 and the active layer MQW. For example, the superlattice layer SLT may be made of InGaN or GaN. A thickness of the superlattice layer SLT may be about 50 nm to about 200 nm. However, the superlattice layer SLT may be omitted.

The second semiconductor layer SEM2 may be located on the superlattice layer SLT. The second semiconductor layer SEM2 may be an n-type semiconductor. The second semiconductor layer SEM2 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The second semiconductor layer SEM2 may be doped with an n-type dopant, which may be Si, Ge, Sn, or the like. For example, the second semiconductor layer SEM2 may be made of n-GaN doped with n-type Si. A thickness of the second semiconductor layer SEM2 may be in the range of about 500 nm to about 1 μm, but is not limited thereto.

According to some embodiments, some of the light emitting elements ED of the display device 10 may include different active layers MQW to emit light of different colors. For example, the first light emitting element ED1 may include a first active layer MQW1, the second light emitting element ED2 may include a second active layer MQW2, the third light emitting element ED3 may include a third active layer MQW3, and the fourth light emitting element ED4 may include the fourth active layer MQW4. The first light emitting element ED1 may emit red light, which is light of a first color, the second light emitting element ED2 may emit yellow light, which is light of a second color, the third light emitting element ED3 may emit green light, which is light of a third color, and the fourth light emitting element ED4 may emit blue light, which is light of a fourth color. In each of the first light emitting element ED1, the second light emitting element ED2, the third light emitting element ED3, and the fourth light emitting element ED4, respective concentrations of doped dopants in the first semiconductor layers SEM1, the electron blocking layers EBL, the active layers MQW, the superlattice layers SLT, and the second semiconductor layers SEM2, or respective values of 'x' and 'y' in the chemical formula of $Al_xGa_yIn_{1-x-y}N$ ($0 \leq x \leq 1$, $0 \leq y \leq 1$, and $0 \leq x+y \leq 1$), may be different from each other. The first to fourth light emitting elements ED1, ED2, ED3, and ED4 may have substantially the same structure and material, but may emit light of different colors due to different component ratios of the semiconductor layers.

For example, the first active layer MQW1 may emit light by a combination of electron-hole pairs according to electrical signals applied through the first semiconductor layer SEM1 and the second semiconductor layer SEM2. The first active layer MQW1 may emit first light having a central wavelength band in the range of about 600 nm to about 750 nm, that is, light of a red wavelength band.

The second active layer MQW2 may emit light by a combination of electron-hole pairs according to electrical signals applied through the first semiconductor layer SEM1 and the second semiconductor layer SEM2. The second active layer MQW2 may emit second light having a central wavelength band in the range of about 550 nm to about 600 nm, that is, light of a yellow wavelength band.

The third active layer MQW3 may emit light by a combination of electron-hole pairs according to electrical signals applied through the first semiconductor layer SEM1 and the second semiconductor layer SEM2. The third active layer MQW3 may emit third light having a central wavelength band in the range of about 480 nm to about 560 nm, that is, light of a green wavelength band.

The fourth active layer MQW4 may emit light by a combination of electron-hole pairs according to electrical signals applied through the first semiconductor layer SEM1 and the second semiconductor layer SEM2. The fourth active layer MQW4 may emit fourth light having a central wavelength band in the range of about 370 nm to about 460 nm, that is, light of a blue wavelength band.

In some embodiments in which each of the first active layer MQW1, the second active layer MQW2, the third active layer MQW3, and the fourth active layer MQW4 includes InGaN, a color of light emitted by each of the first active layer MQW1, the second active layer MQW2, the third active layer MQW3, and the fourth active layer MQW4 may be changed depending on a content of indium (In). For example, as the content of indium (In) increases, a wavelength band of the light emitted by the first to fourth active layers MQW1, MQW2, MQW3, and MQW4 may move to a red wavelength band, and as the content of indium (In) decreases, a wavelength band of the light emitted by the first to fourth active layers MQW1, MQW2, MQW3, and MQW4 may move to a blue wavelength band. The content of indium (In) in the first active layer MQW1 may be higher than that of indium (In) in the second active layer MQW2, the content of indium (In) in the second active layer MQW2 may be higher than that of indium (In) in the third active layer MQW3, and the content of indium (In) in the third active layer MQW3 may be higher than that of indium (In) in the fourth active layer MQW4. For example, the content of indium (In) in the fourth active layer MQW4 may be about 15%, the content of indium (In) in the third active layer MQW3 may be about 25%, the content of indium (In) in the second active layer MQW2 may be about 30% or higher, and the content of indium (In) in the first active layer MQW1 may be about 35% or higher.

Similarly, in some embodiments in which each of the first semiconductor layers SEM1, the second semiconductor layers SEM2, the superlattice layers SLT, and the electron blocking layers EBL of the first to fourth light emitting elements ED1, ED2, ED3, and ED4 includes a semiconductor based on GaN, contents of indium (In) or aluminum (Al), concentrations of doped dopants, or the like, in the first semiconductor layers SEM1, the second semiconductor layers SEM2, the superlattice layers SLT, and the electron blocking layers EBL may be different from each other. As in a case of the first to fourth active layers MQW1, MQW2, MQW3, and MQW4, contents of indium (In) in the first semiconductor layer SEM1, the second semiconductor layer SEM2, the superlattice layer SLT, and the electron blocking layer EBL of each of the first to fourth light emitting elements ED1, ED2, ED3, and ED4 may be higher or lower than those in the other light emitting elements ED1, ED2, ED3, and ED4.

According to some embodiments, the light emitting elements ED of the display device 10 may have the same diameter. For example, a first diameter WE1 of the first light emitting element ED1, a second diameter WE2 of the second light emitting element ED2, a third diameter WE3 of the third light emitting element ED3, and a fourth diameter WE4 of the fourth light emitting element ED4 may be the same as each other. However, the disclosure is not limited thereto. In some embodiments, diameters of the light emitting elements ED1, ED2, ED3, and ED4 may also be different from each other.

The display substrate 300 may include the common electrode layer CEL connected to the second semiconductor layers SEM2 of the light emitting elements ED as one common layer. The common electrode layer CEL may be located over the entire surface of the display substrate 300, and may form a base part of the display substrate 300 together with a base layer BL. The common electrode layer CEL may include sides extending in the first direction DR1 and the second direction DR2, and may be located to correspond to the display substrate area DSA of the circuit substrate 100.

The common electrode layer CEL may be an n-type semiconductor including the same material as the second semiconductor layer SEM2. The common electrode layer CEL may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of AlGaInN, GaN, AlGaN, InGaN, AlN, and InN doped with an n-type dopant. The common electrode layer CEL may be doped with an n-type dopant, which may be Si, Ge, Sn, or the like. For example, the common electrode layer CEL may be made of n-GaN doped with n-type Si.

It has been illustrated in the drawings that the common electrode layer CEL includes the same material as the second semiconductor layers SEM2 to be integrated with the second semiconductor layers SEM2, but the disclosure is not limited thereto. In some embodiments, the common electrode layer CEL may include a material different from that of the second semiconductor layers SEM2 to be located as a separate layer from the second semiconductor layers SEM2. The common electrode layer CEL may also be electrically connected to the second semiconductor layers SEM2 without being integrated with the second semiconductor layers SEM2.

The base layer BL is located on the common electrode layer CEL. The base layer BL may be an undoped semiconductor. The base layer BL may include a material that is the same as that of the second semiconductor SEM2, but is not doped with an n-type or p-type dopant. In some embodiments, the base layer BL may be made of at least one of undoped InAlGaN, GaN, AlGaN, InGaN, AlN, and InN, but is not limited thereto. The common electrode layer CEL and the base layer BL may include the display area DPA and the non-display area NDA of the display substrate 300.

A plurality of connection electrodes CNE1, CNE2, and CNE3 may be located between the display substrate 300 and the circuit substrate 100. The connection electrodes CNE1, CNE2, and CNE3 may include the first connection electrodes CNE1 and the second connection electrodes CNE2 respectively located between the light emitting elements ED and the pixel electrodes AE, and the third connection electrodes CNE3 located between the common electrode layer CEL and the common electrode connection parts CEP.

The first connection electrodes CNE1 and the second connection electrodes CNE2 may be located to correspond to the light emitting elements ED and the pixel electrodes AE in the display area DPA. The first connection electrodes CNE1 may be located on one surface of the first semiconductor layers SEM1 of the light emitting elements ED, and the second connection electrodes CNE2 may be located between the first connection electrodes CNE1 and the pixel electrodes AE.

The first connection electrode CNE1 may be electrically connected to the second connection electrode CNE2 and the pixel electrode AE to transfer a light emitting signal applied to the pixel electrode AE to the light emitting element ED. The first connection electrode CNE1 may be an ohmic connection electrode. However, the disclosure is not limited thereto, and the connection electrode CTE may also be a Schottky connection electrode. A width of the first connection electrode CNE1 may be less than that of the light emitting element ED. The first connection electrode CNE1 may be located on only a portion of one surface of the first semiconductor layer SEM1, and the insulating layer INS may be located on one or more other portions on the one surface of the first semiconductor layer SEM1.

The first connection electrode CNE1 may decrease resistance due to a contact between the light emitting element ED and the second connection electrode CNE2 when the light emitting element ED is electrically connected to the second connection electrode CNE2. The first connection electrode CNE1 may include a conductive metal. For example, the first connection electrode CNE1 may include at least one of gold (Au), copper (Cu), tin (Sn), titanium (Ti), aluminum (Al), and silver (Ag). Alternatively, the first connection electrode CNE1 may include a transparent conductive material such as indium tin oxide (ITO) or indium zinc oxide (IZO). As an example, the first connection electrode CNE1 may include an alloy of gold and tin between which a ratio is about 9:1, about 8:2, or about 7:3, or may include an alloy (SAC305) of copper, silver, and tin. It has been illustrated in the drawings that the first connection electrode CNE1 has a single-layer structure, but the disclosure is not limited thereto. The first connection electrode CNE1 may have a multilayer structure in which two or more layers including the above-described material are stacked.

The second connection electrode CNE2 may be located directly on, and may be in contact with, the pixel electrode AE. The second connection electrodes CNE2 may serve as a bonding metal for bonding the pixel electrodes AE and the light emitting element ED to each other in a fabrication process. The second connection electrodes CNE2 may include a material that may be electrically connected to the pixel electrodes AE and the light emitting elements ED. For example, the second connection electrode CNE2 may include at least one of gold (Au), copper (Cu), aluminum (Al), and tin (Sn) or include transparent conductive oxide such as indium tin oxide (ITO) or indium zinc oxide (IZO). Alternatively, the second connection electrode CNE2 may include a first layer including any one of gold (Au), copper (Cu), aluminum (Al), and tin (Sn) and a second layer including another of gold (Au), copper (Cu), aluminum (Al), and tin (Sn).

The third connection electrodes CNE3 may be located in the common electrode areas CPA1, CPA2, and CPA3 of the display substrate 300. Each of a plurality of third connection electrodes CNE3 may have a shape extending in one direction, and may be located in each of the common electrode areas CPA1, CPA2, and CPA3. The display substrate 300 may include the common electrode layer CEL to which the second semiconductor layers SEM2 of the plurality of light emitting elements ED are connected, and the light emitting elements ED and the insulating layer INS might not be located in the common electrode areas CPA1, CPA2, and CPA3 and the non-display area NDA of the common electrode layer CEL. The third connection electrodes CNE3 may be in direct contact with the common electrode layer CEL in the common electrode areas CPA1, CPA2, and CPA3.

In some embodiments, a thickness of the third connection electrode CNE3 may be the same as the sum of thicknesses of the light emitting element ED, the first connection electrode CNE1, and the second connection electrode CNE2. The third connection electrode CNE3 may have a thickness corresponding to a thickness of the first connection electrode CNE1 and the second connection electrode CNE2 located on the light emitting element ED, such that a surface of the third connection electrode CNE3 and surfaces of the light emitting elements are aligned with a surface of the common electrode layer CEL. In the display substrate 300, the display area DPA and the common electrode areas CPA1, CPA2, and CPA3 may have substantially the same height from one surface of the common electrode layer CEL. On the other hand, other members are not located in the non-display area NDA, and thus, the non-display area NDA may have a height that is lower than that of the display area DPA and the common electrode areas CPA1, CPA2, and CPA3.

The third connection electrode CNE3 may be located directly on, and in contact with, the common electrode connection part CEP. The third connection electrode CNE3 may be electrically connected to the common electrode connection part CEP, and may be electrically connected to any one of the pads PD through the pixel circuit part PXC located in the non-display area NDA.

The third connection electrode CNE3 may include a material that may be electrically connected to the common electrode connection part CEP. For example, the third connection electrode CNE3 may include at least one of gold (Au), copper (Cu), aluminum (Al), and tin (Sn). Alternatively, the third connection electrode CNE3 may include a first layer including any one of gold (Au), copper (Cu), aluminum (Al), and tin (Sn) and a second layer including another of gold (Au), copper (Cu), aluminum (Al), and tin (Sn).

The filling layer 500 may be located between the circuit substrate 100 and the display substrate 300. The filling layer 500 may fill a space formed between the first substrate 110 and the common electrode layer CEL and by steps between the pixel electrodes AE and the common electrode connection parts CEP of the circuit substrate 100 and the light emitting elements ED of the display substrate 300. The filling layer 500 may include an insulating material such as silicon oxide ($SiO_x$), silicon nitride ($SiN_x$), or silicon oxynitride ($SiO_xN_y$), but is not limited thereto. It has been illustrated in the drawings that the filling layer 500 is formed as one layer to completely fill a space between the common electrode layer CEL and the first substrate 110. The filling layer 500 may be made of a material having fluidity when the display substrate 300 and the circuit substrate 100 are bonded to each other, may be located between the display substrate 300 and the circuit substrate 100, and may fill a space between the display substrate 300 and the circuit substrate 100. However, the disclosure is not limited thereto. In some embodiments, the filling layer 500 may be located so that surfaces of the circuit substrate 100 and the display substrate 300 bonded to each other are planarized. For example, a first filling layer may be located on the first substrate 110 of the circuit substrate 100, and a second filling layer may be located on the common electrode layer CEL of the display substrate 300, to thereby planarize upper surfaces of the first substrate 110 and the common electrode layer CEL. In this case, in the display device 10, a physical boundary may remain between the first filling layer and the second filling layer at a portion where the circuit substrate 100 and the display substrate 300 are bonded to each other.

According to some embodiments, in the display device 10, the second semiconductor layers SEM2 of the light emitting elements ED may be electrically connected to each other. For example, the common electrode layer CEL may include the same material as the second semiconductor layers SEM2, and each of the second semiconductor layers SEM2 of the light emitting elements ED may be integrated with the common electrode layer CEL. In the display substrate 300, a plurality of second semiconductor layers SEM2 may partially protrude from the common electrode layer CEL to form patterns spaced apart from each other.

The common electrode layer CEL may be electrically connected to the third connection electrodes CNE3 located in the common electrode areas CPA1, CPA2, and CPA3, and may be electrically connected to the common electrode connection parts CEP of the circuit substrate 100. The insulating layer INS might not be located at the common electrode areas CPA1, CPA2, and CPA3 at corresponding portions of a surface of the common electrode layer CEL, and the third connection electrodes CNE3 may be located directly on the corresponding portions. The common electrode layer CEL may be electrically connected to the second semiconductor layers SEM2 of the light emitting elements ED in the display area DPA.

The light emitting elements ED may be electrically connected to the common electrode layer CEL in common, but the first semiconductor layers SEM1 of different light emitting elements ED1, ED2, ED3, and ED4 may be electrically connected to different pixel circuit parts PXC of the circuit substrate 100. For example, one ends of the plurality of light emitting elements ED may be respectively electrically connected to different pixel electrodes AE of the circuit substrate 100 through the first connection electrodes CNE1 and the second connection electrodes CNE2. The other ends of the light emitting elements ED may be electrically connected to the common electrode connection parts CEP of the circuit substrate 100 through the common electrode layer CEL and the third connection electrodes CNE3. Each of the different light emitting elements ED1, ED2, ED3, and ED4 may have one end electrically connected to each of the pixel circuit parts PXC of the circuit substrate 100, and the other end electrically connected to the common electrode connection parts CEP of the circuit substrate 100 through the common electrode layer CEL. The third connection electrodes CNE3 and the common electrode layer CEL may serve as common electrodes of the light emitting elements ED.

The light emitting elements ED1, ED2, ED3, and ED4 may receive electrical signals transferred from the circuit substrate 100 to emit light from the active layers MQW. The first light emitting element ED1 may include the first active layer MQW1 to emit the red light, which is the light of the first color, the second light emitting element ED2 may include the second active layer MQW2 to emit the yellow light, which is the light of the second color, the third light emitting element ED3 may include the third active layer MQW3 to emit the green light, which is the light of the third color, and the fourth light emitting element ED4 may include the fourth active layer MQW4 to emit the blue light, which is the light of the fourth color.

As described above, the light emitted from the active layer MQW including GaN containing indium (In) may have different central wavelength bands depending on the content of indium (In). The first to fourth light emitting elements ED1, ED2, ED3, and ED4 may emit light of different colors depending on materials of the active layers MQW, and the first light emitting element ED1 including the first active layer MQW1 in which the content of indium (In) is high may have light efficiency that is lower than that of the third and fourth light emitting elements ED3 and ED4 including, respectively, the third active layer MQW3 and the fourth active layer MQW4 in which the contents of indium (In) are low. The light emitting element ED including the active layer MQW emitting the red light may have internal quantum efficiency that is relatively lower than that of other light emitting elements ED, and when the light emitting elements ED have the same size, an amount of the red light may be lower than an amount of light of other colors. In addition, when the display device 10 guides the emitted light in a specific direction to display a screen, the red light having a long wavelength may have light guiding efficiency that is lower than that of the green light or the blue light having a short wavelength. According to some embodiments, the display device 10 may include the second light emitting element ED2 for emitting the yellow light to complement low light efficiency of the red light having the long wavelength in one pixel PX. In the display device 10, one pixel PX may include the light emitting elements ED emitting the light of the first to fourth colors to reduce or prevent a corresponding color from strongly appearing on a screen displayed by the display device 10 due to low efficiency by the corresponding color and improve a display quality.

Hereinafter, processes for fabrication of the display device 10 will be described with further reference to other drawings.

FIG. 9 is a flowchart illustrating a method for fabrication of the display device according to some embodiments.

Referring to FIG. 9, a method for fabrication of the display device 10 according to some embodiments may include preparing a circuit substrate 100 and a base substrate SUB (S10); forming a support layer SPL on a common electrode layer CEL of the base substrate SUB, forming a plurality of holes H1 and H2 penetrating through the support layer SPL, and forming a plurality of light emitting elements ED1, ED2, ED3, and ED4 in the plurality of holes H1 and H2, respectively (S20); removing the support layer SPL, and forming an insulating layer INS, reflective layers RL, and connection electrodes CNE1, CNE2, and CNE3 on the plurality of light emitting elements ED1, ED2, ED3, and ED4 (S30); and bonding the base substrate SUB, in which the light emitting elements ED are formed, and the circuit substrate 100 to each other (S40).

The method for fabrication of the display device 10 may include a process of preparing each of the circuit substrate 100 and the display substrate 300, and then bonding the circuit substrate 100 and the display substrate 300 to each other. In a process for fabrication of the display substrate 300, a process of preparing the base substrate SUB including a base layer BL and the common electrode layer CEL, and forming the plurality of light emitting elements ED on the base substrate SUB, may be performed. The light emitting elements ED may include active layers MQW1, MQW2, MQW3, and MQW4 having different materials, and may be formed by layers made of different materials according to positions in the display area DPA. Hereinafter, a method for fabrication of the display device 10 will be described in detail with further reference to other drawings.

FIGS. 10 to 24 are cross-sectional views sequentially illustrating processes for fabrication of the display device according to some embodiments. FIGS. 10 to 24 sequentially illustrate processes for fabrication of the display device 10 on the basis of one cross section of the display device 10 illustrated in FIG. 8.

Figure 10:
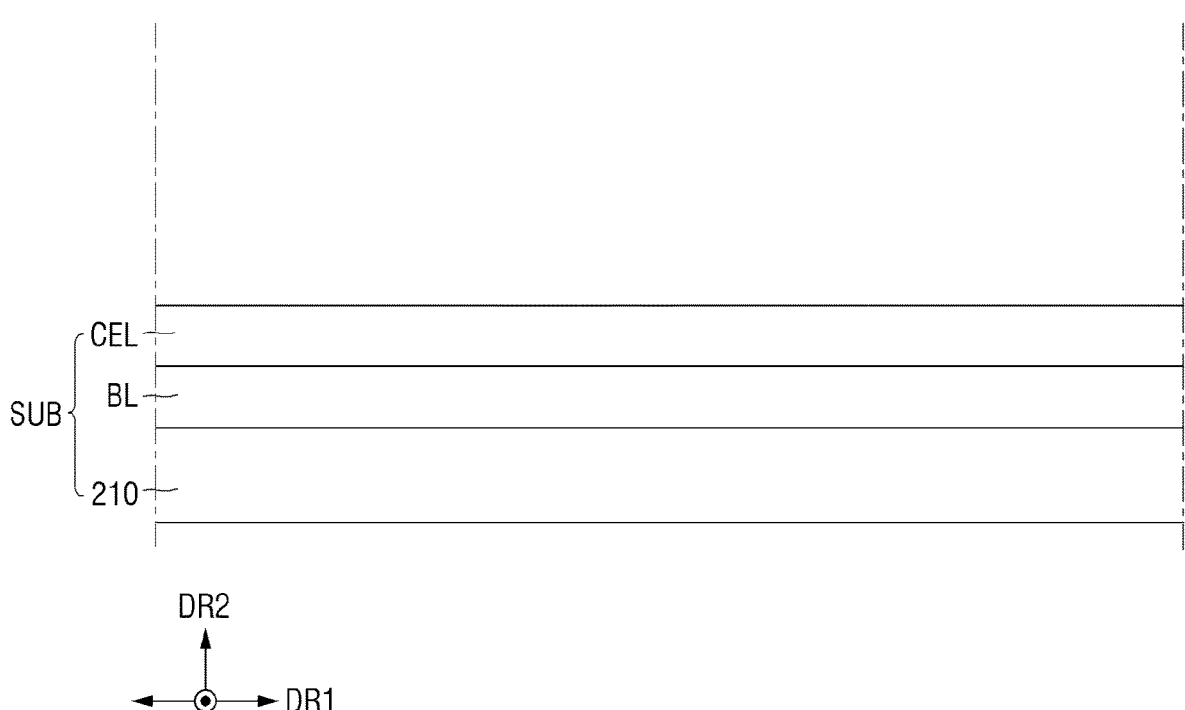
Figure 11:
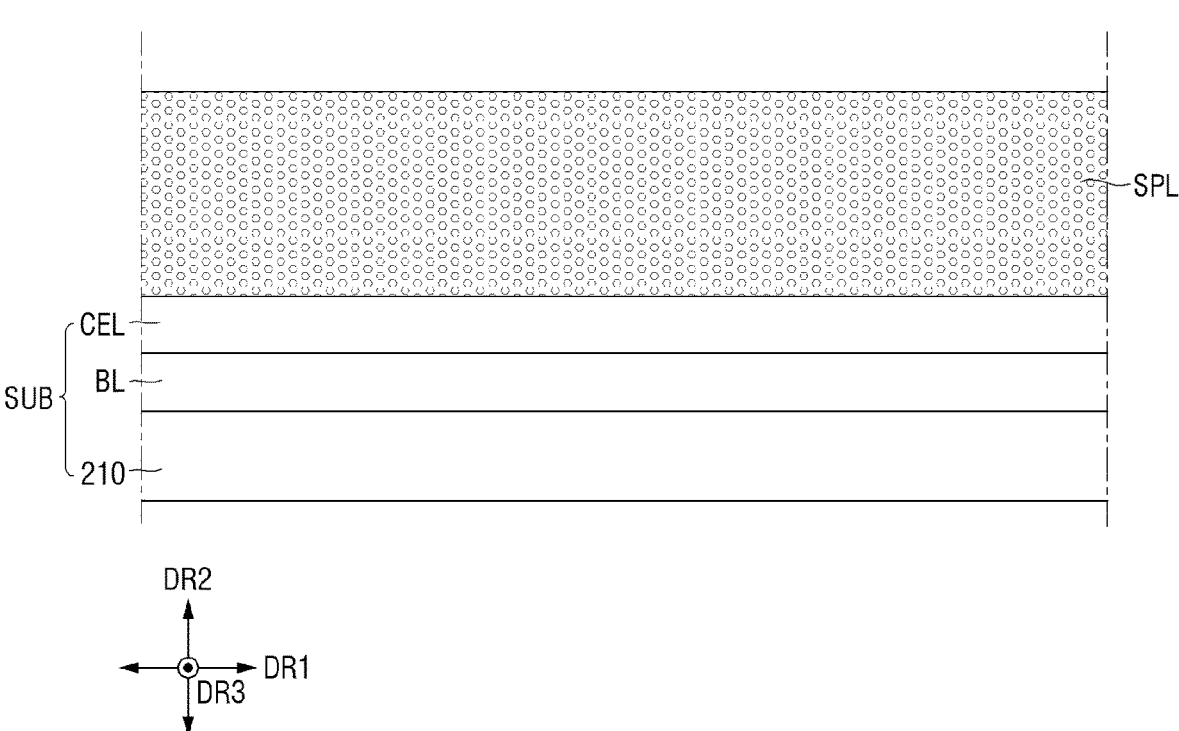

First, referring to FIG. 10, the circuit substrate 100 and the base substrate SUB for forming the display substrate 300 are prepared (S10). The circuit substrate 100 includes a first substrate 110 including pixel circuit parts PXC, and pixel electrodes AE and common electrode connection parts CEP formed on one surface of the first substrate 110. A description for a structure of the circuit substrate 100 may be the same as described above.

The base substrate SUB includes a second substrate 210, a base layer BL located on the second substrate 210, and a common electrode layer CEL located on the base layer BL. The second substrate 210 may be a sapphire substrate (Al$_2$O$_3$) or a silicon wafer including silicon. However, the disclosure is not limited thereto, and the second substrate 210 may also be a semiconductor substrate such as a GaAs substrate. Hereinafter, a case where the second substrate 210 is the sapphire substrate will be described by way of example.

The base layer BL and the common electrode layer CEL located on the second substrate 210 are the same as described above. The common electrode layer CEL may be an n-type semiconductor, and the base layer BL may include an undoped semiconductor, and may be made of a material that is not doped with an n-type or p-type dopant. In some embodiments, for example, the common electrode layer CEL may be made of one or more of AlGaInN, GaN, AlGaN, InGaN, AlN, and InN doped with an n-type dopant. The base layer BL may be made of at least one of undoped InAlGaN, GaN, AlGaN, InGaN, AlN, and InN, but is not limited thereto. It has been illustrated in FIG. 10 that one base layer BL is stacked, but the disclosure is not limited thereto, and a plurality of base layers BL may also be formed. The base layer BL may be located to decrease a difference in lattice constant between the common electrode layer CEL and the second substrate 210.

The base layer BL and the common electrode layer CEL may be formed together with semiconductor layers to be described later through an epitaxial growth method. The epitaxial growth method may be electron beam deposition, physical vapor deposition (PVD), chemical vapor deposition (CVD), plasma laser deposition (PLD), dual-type thermal evaporation, sputtering, metal organic chemical vapor deposition (MOCVD), or the like. As an example, the base layer BL and the common electrode layer CEL may be formed by the metal organic chemical vapor deposition (MOCVD), but are not limited thereto.

A precursor material for forming a plurality of semiconductor material layers is not particularly limited within a range that may be generally selected for forming a target material. As an example, the precursor material may be a metal precursor including an alkyl group such as a methyl group or an ethyl group. For example, the precursor material may be a compound such as trimethyl gallium (Ga(CH$_3$)$_3$), trimethyl aluminum (Al(CH$_3$)$_3$), or triethyl phosphate ((C$_2$H$_5$)$_3$PO$_4$), but is not limited thereto.

Next, referring to FIGS. 11 to 18, the support layer SPL is formed on the common electrode layer CEL of the base substrate SUB, the plurality of holes H1 and H2 penetrating through the support layer SPL are formed, and the plurality of light emitting elements ED1, ED2, ED3, and ED4 are formed in the holes H1 and H2 (S20). The light emitting elements ED1, ED2, ED3, and ED4 that are formed in the holes H1 and H2 may be formed on the common electrode layer CEL exposed by the holes H1 and H2, respectively.

The support layer SPL may be entirely located on the common electrode layer CEL. The support layer SPL may include an insulating material such as silicon oxide (SiO$_x$), silicon nitride (SiN$_x$), or silicon oxynitride (SiO$_x$N$_y$), and may function as a mask in a process for forming the light emitting elements ED.

When the support layer SPL is located, the plurality of holes H1 and H2 penetrating through the support layer SPL are formed, and the light emitting elements ED1, ED2, ED3, and ED4 are formed in the holes H1 and H2. As described above, the light emitting elements ED include active layers MQW1, MQW2, MQW3, and MQW4 partially made of different materials, respectively. A process of forming the light emitting elements ED1, ED2, ED3, and ED4 may be performed as a process of concurrently or substantially simultaneously forming elements including active layers MQW1, MQW2, MQW3, and MQW4 made of the same material, or forming elements including active layers MQW1, MQW2, MQW3, and MQW4 made of different materials by another process.

Figure 12:
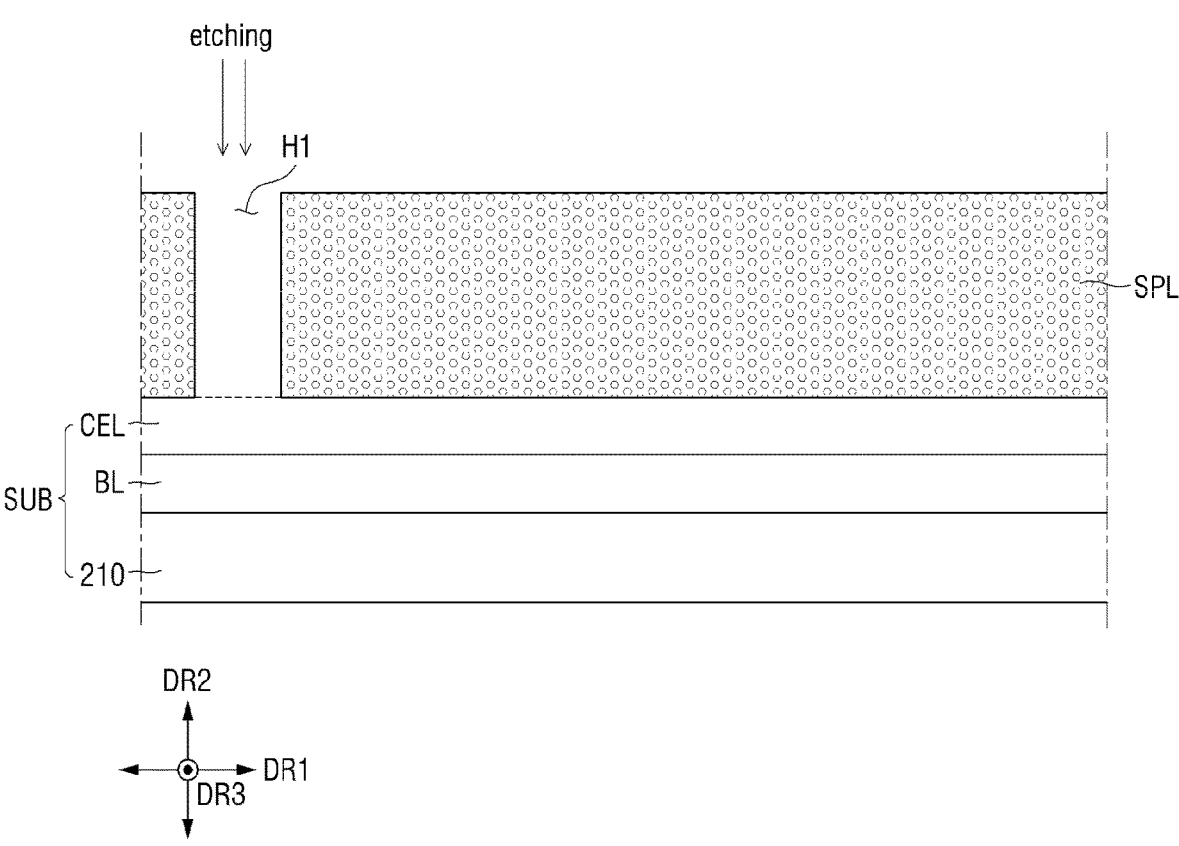
Figure 13:
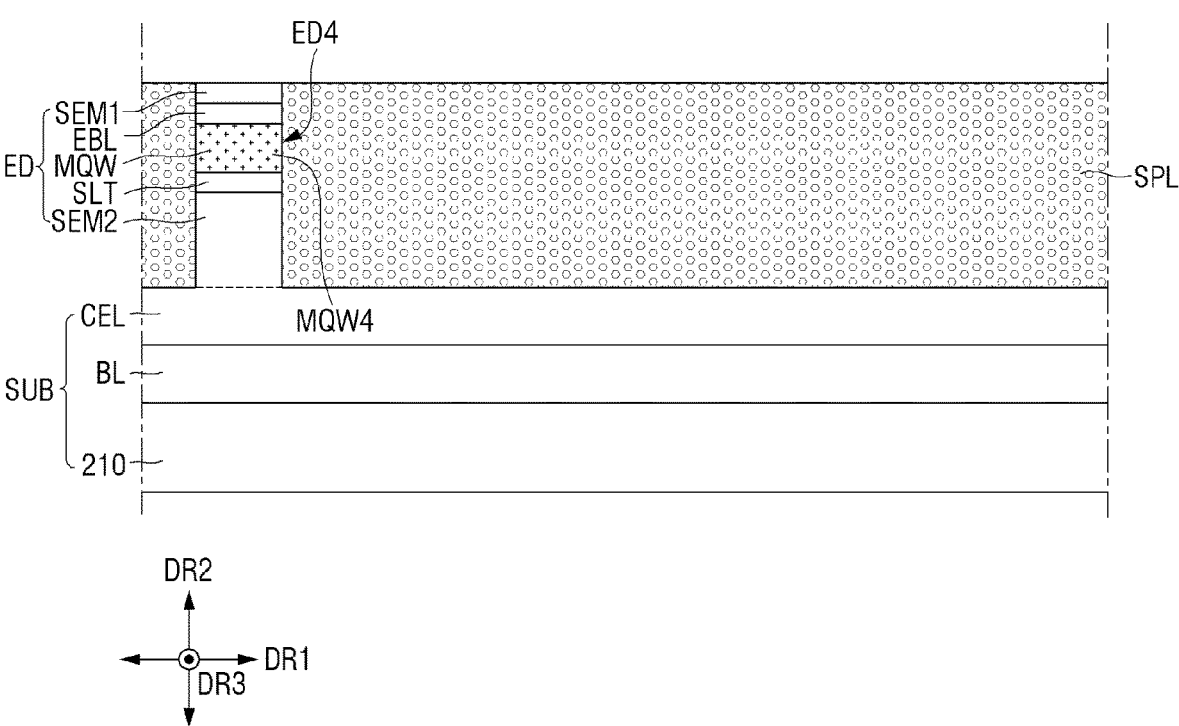

First, fourth light emitting elements ED4 including fourth active layers MQW4 emitting blue light, which is light of a fourth color, are formed. As illustrated in FIGS. 12 and 13, a plurality of first holes H1 penetrating through the support layer SPL are formed by etching portions of the support layer SPL, and a plurality of fourth light emitting elements ED4 are formed in the first holes H1, respectively. The plurality of first holes H1 are formed to be spaced apart from each other. An interval between the first holes H1 spaced apart from each other, a width of the first holes H1, and the like, may be set according to a layout and a size of the fourth light emitting elements ED4 in the display substrate 300. That is, the width of the first holes H1 and the interval between the first holes H1 may be the same as a width of the fourth light emitting elements ED4 and an interval between the fourth light emitting elements ED4.

The process of forming the light emitting elements ED may be performed through an epitaxial growth method as in the process of forming the base layer BL and the common electrode layer CEL. When an upper surface of the common electrode layer CEL is exposed by the first holes H1, a precursor material is injected onto the common electrode layer CEL to grow semiconductor crystals. Second semiconductor layers SEM2 located on the common electrode layer CEL may include substantially the same material as the common electrode layer CEL, and may be formed by growing the semiconductor crystals of the common electrode layer CEL. Accordingly, the second semiconductor layers SEM2 may be formed integrally with the common electrode layer CEL.

Then, superlattice layers SLT, fourth active layers MQW4, electron blocking layers EBL, and first semiconductor layers SEM1 are sequentially grown to form the fourth light emitting elements ED4. In the process, only the fourth light emitting elements ED4 having the fourth active layers MQW4 are formed, and in subsequent repeated processes, light emitting elements ED1, ED2, and ED3 including third active layers MQW3, second active layers MQW2, or first active layers MQW1 may be formed.

Figure 14:
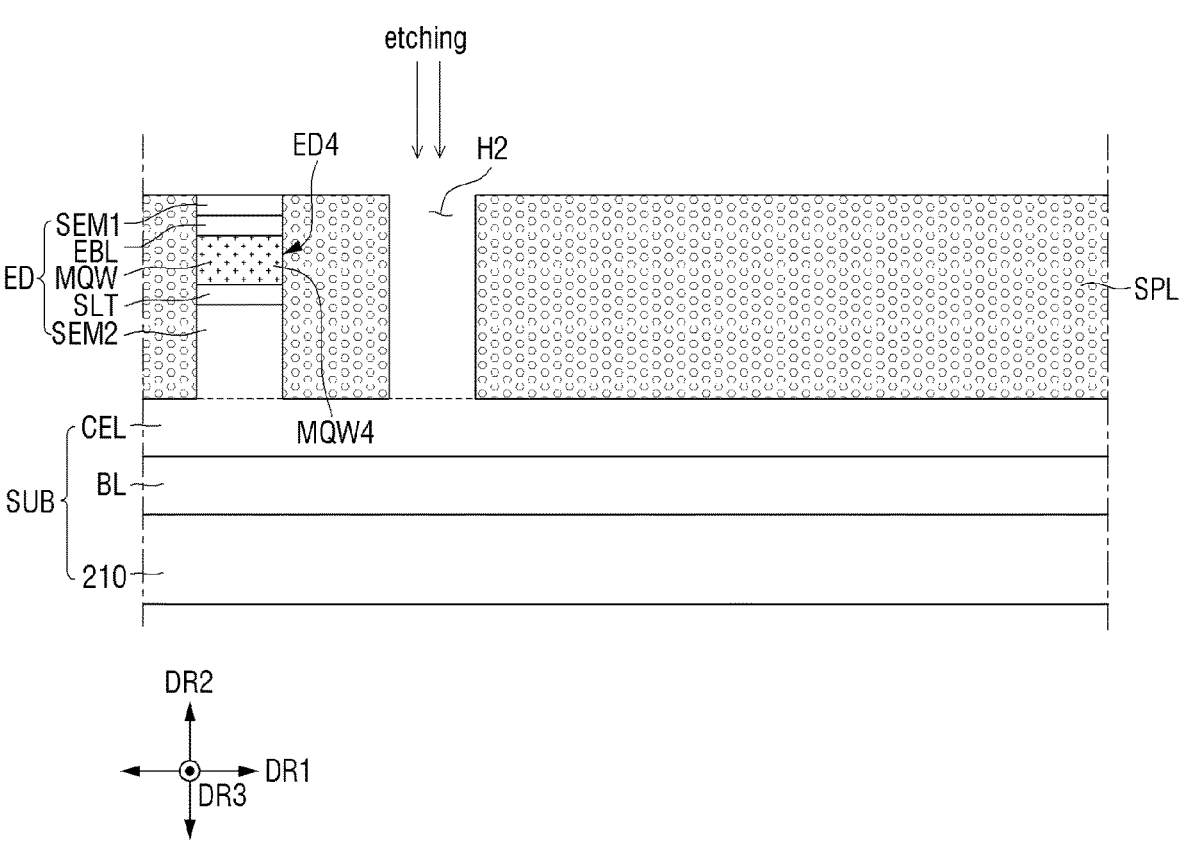
Figure 15:
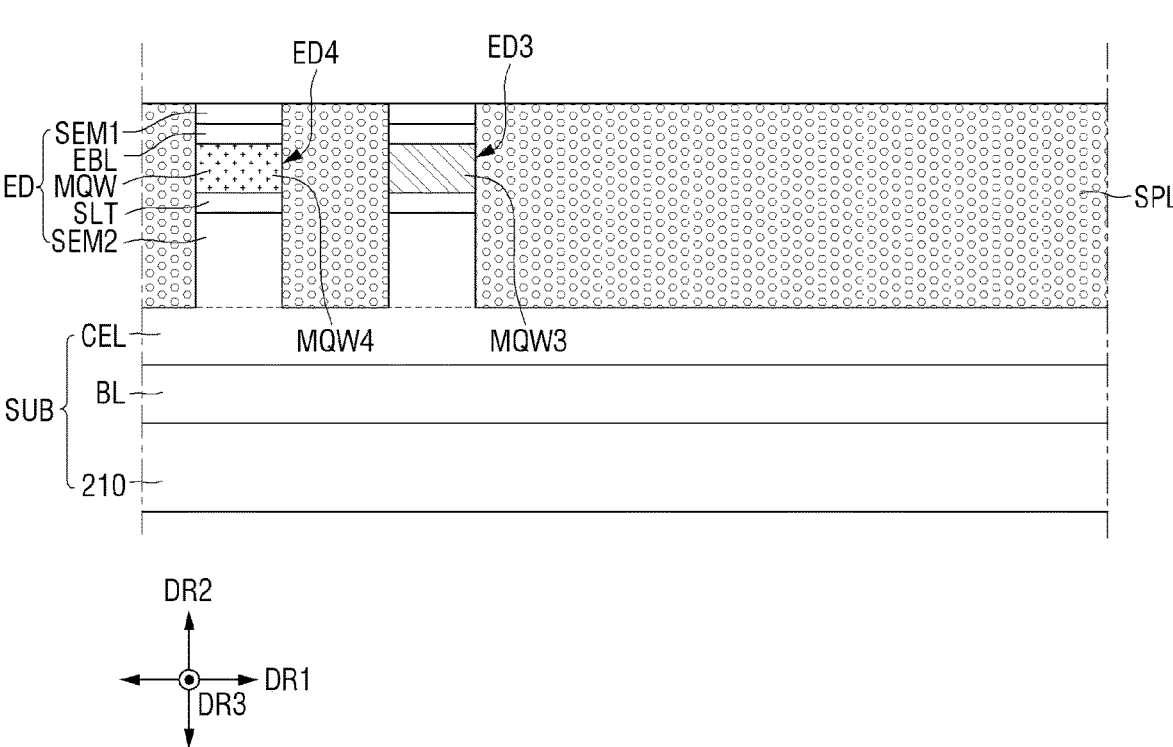

As illustrated in FIGS. 14 and 15, a plurality of second holes H2 penetrating through the support layer SPL are formed by etching portions of the support layer SPL, and third light emitting elements ED3 including third active layers MQW3 for emitting green light, which is light of a third color, are formed in the second holes H2, respectively. The plurality of second holes H2 are formed to be spaced apart from each other. A width of the second holes H2 and an interval between the second holes H2 spaced apart from each other may be the same as a width of the third light emitting elements ED3 and an interval between the third light emitting elements ED3. Second semiconductor layers SEM2, superlattice layers SLT, third active layers MQW3, electron blocking layers EBL, and first semiconductor layers SEM1 are sequentially grown on the common electrode layer CEL exposed by the second holes H2 to form the third light emitting element ED3.

A process of forming the third light emitting element ED3 may be performed using a precursor material that is different from that in the process of forming the fourth light emitting elements ED4, and under a process condition that is different from that in the process of forming the fourth light emitting elements ED4. The third light emitting element ED3 and the fourth light emitting elements ED4 may include the third active layers MQW3 and the fourth active layers MQW4, respectively, and may have different concentrations of dopant, contents of indium (In), and the like, as described above. In the processes for fabrication of the display device 10, the same processes of forming the light emitting elements ED may be repeated, but process conditions in each process may be partially different from each other.

Figure 16:
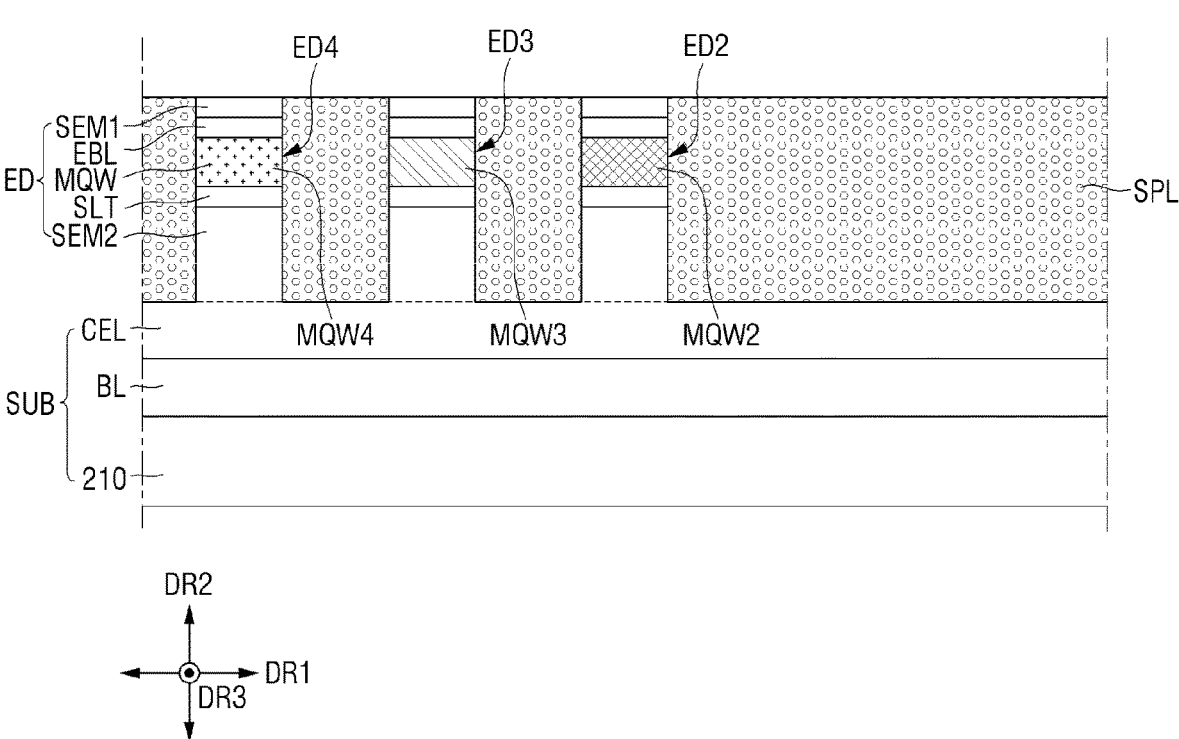
Figure 17:
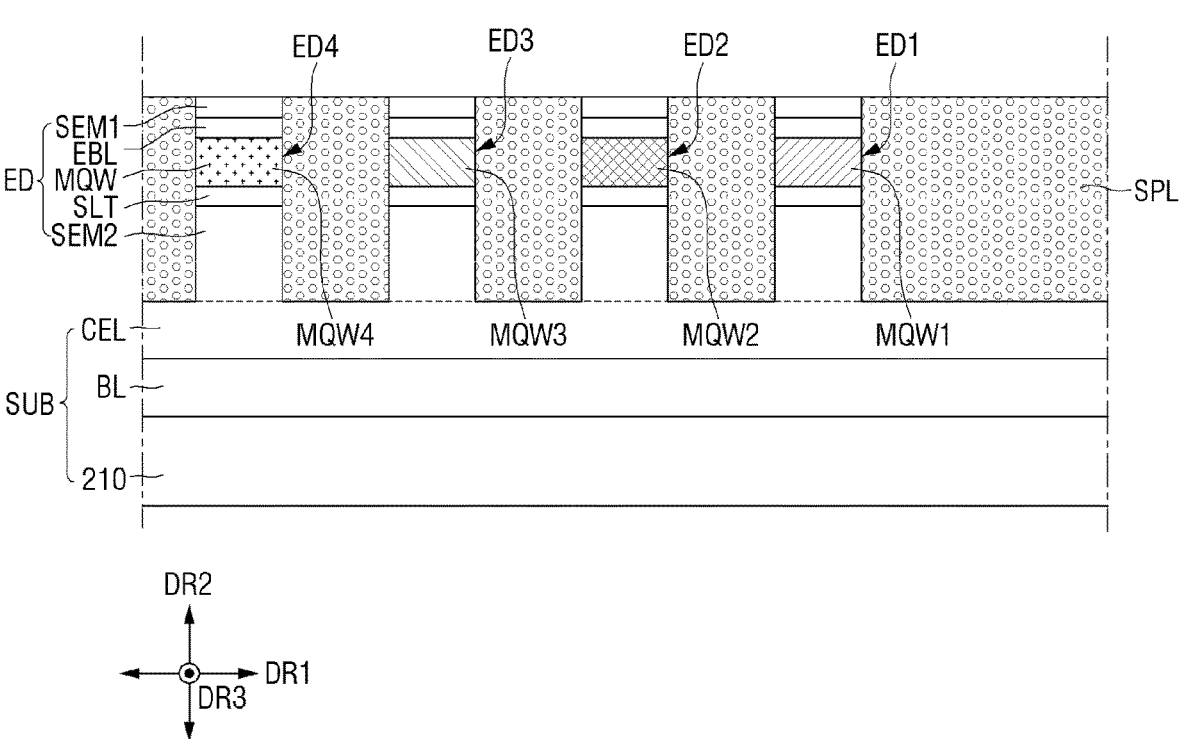

Next, as illustrated in FIGS. 16 and 17, the second light emitting elements ED2 including the second active layers MQW2 and the first light emitting elements ED1 including the first active layers MQW1 are formed on the common electrode layer CEL in the same manner, but under different process conditions and using different materials. Third holes are formed in the support layer SPL, and the light emitting elements ED2 are formed in the third holes. Then, fourth holes are formed, and the first light emitting elements ED1 are formed in the fourth holes. A detailed description therefor is the same as described above.

Figure 18:
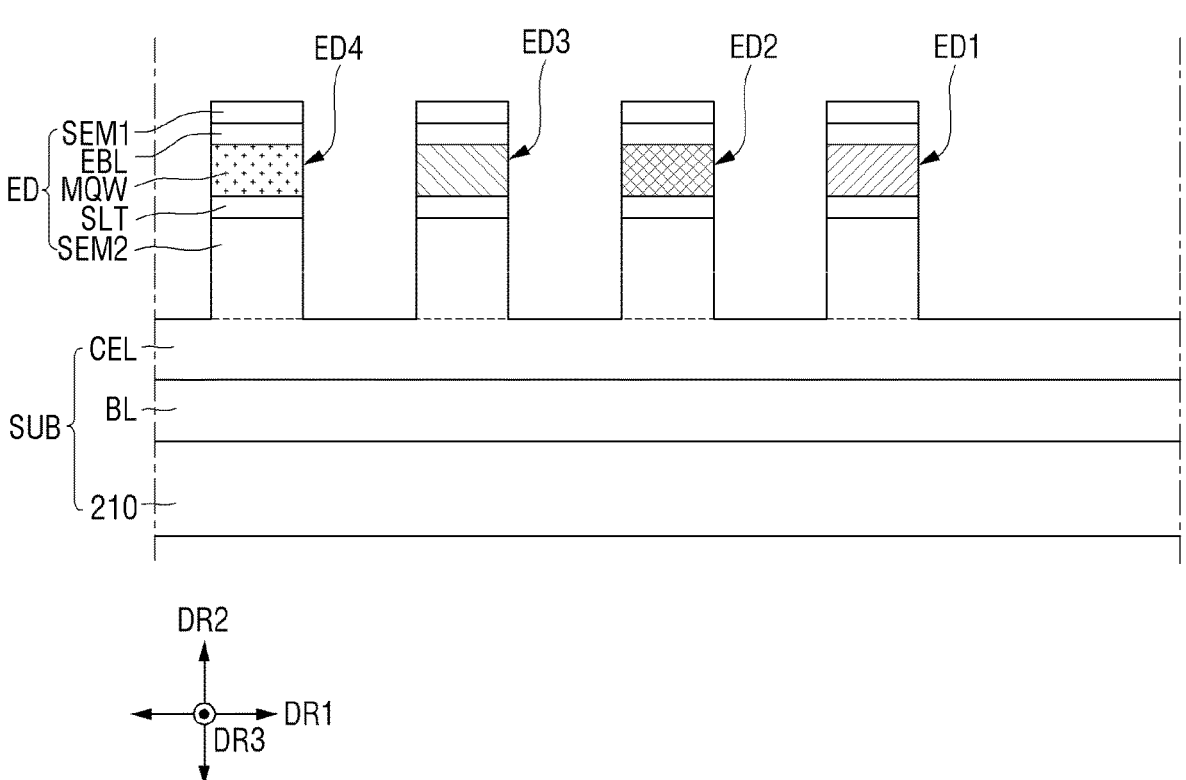

Then, as illustrated in FIG. 18, the support layer SPL may be removed to form the plurality of first to fourth light emitting elements ED1, ED2, ED3, and ED4 on the common electrode layer CEL.

Next, referring to FIGS. 19 to 22, the insulating layer INS, the reflective layers RL, and the connection electrodes CNE1, CNE2, and CNE3 are formed on the first to fourth light emitting elements ED1, ED2, ED3, and ED4 (S30). First connection electrodes CNE1 and second connection electrodes CNE2 may be located on the first semiconductor layers SEM1 of the light emitting elements ED, and third connection electrodes CNE3 may be located on portions of the non-display area NDA of the common electrode layer CEL.

Figure 19:
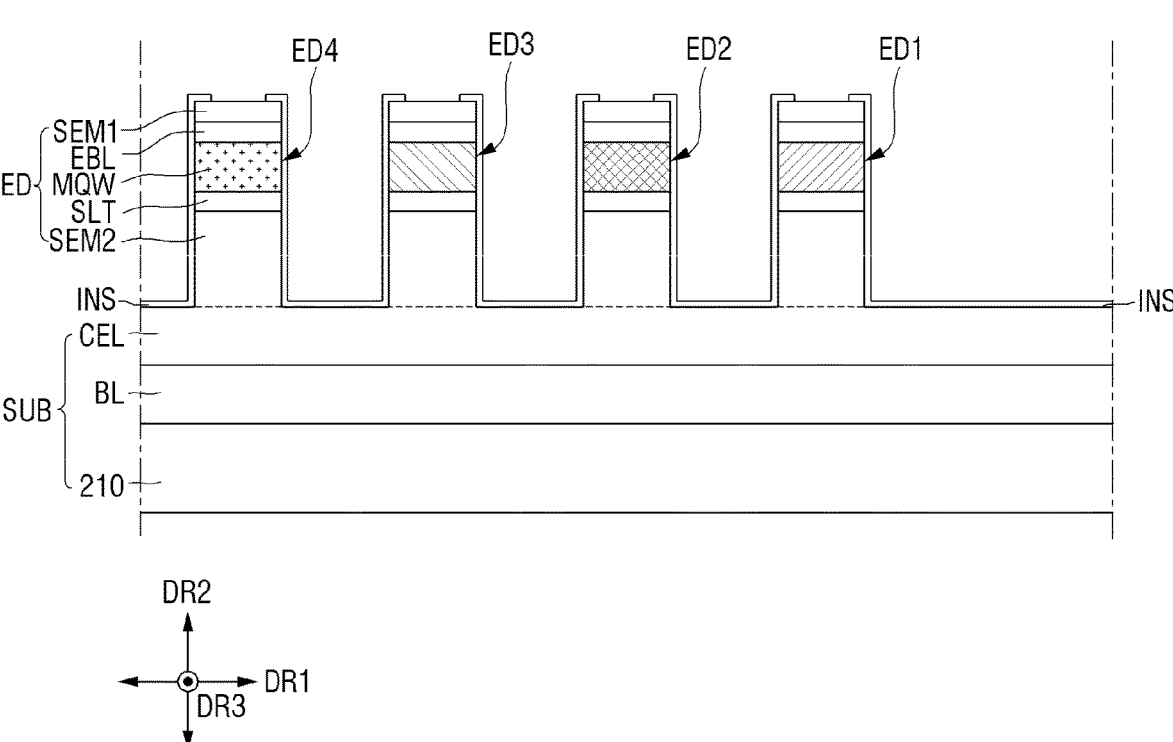
Figure 20:
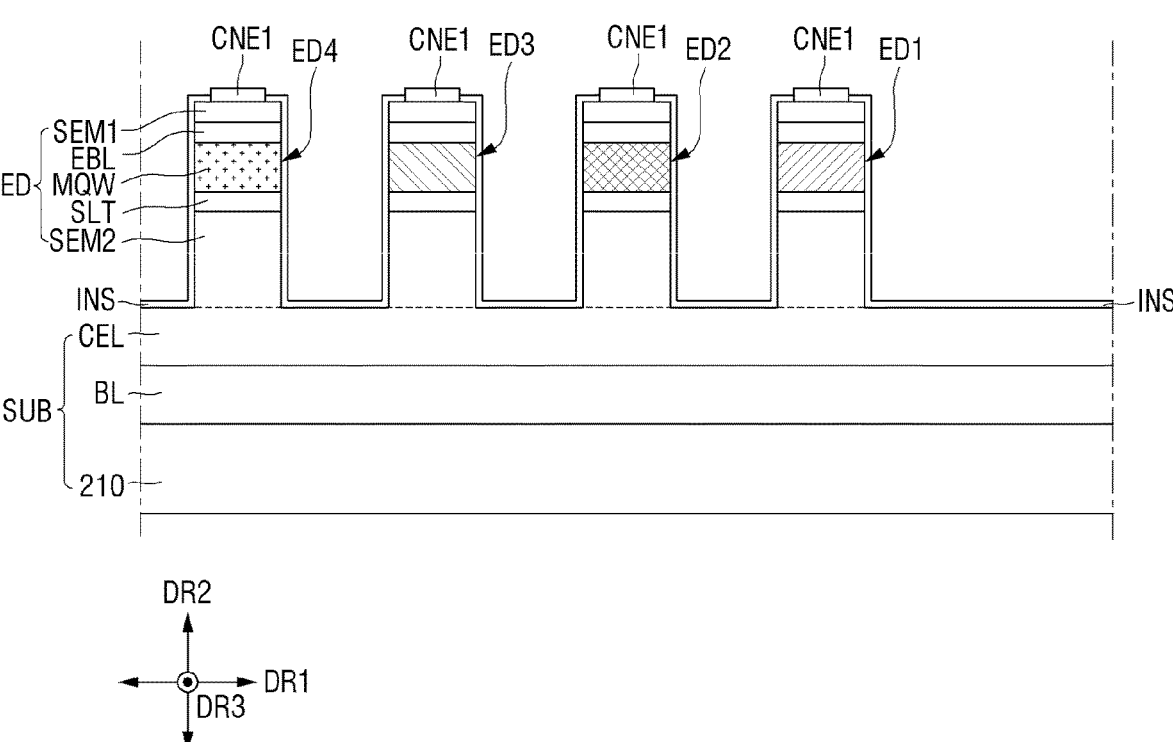
Figure 21:
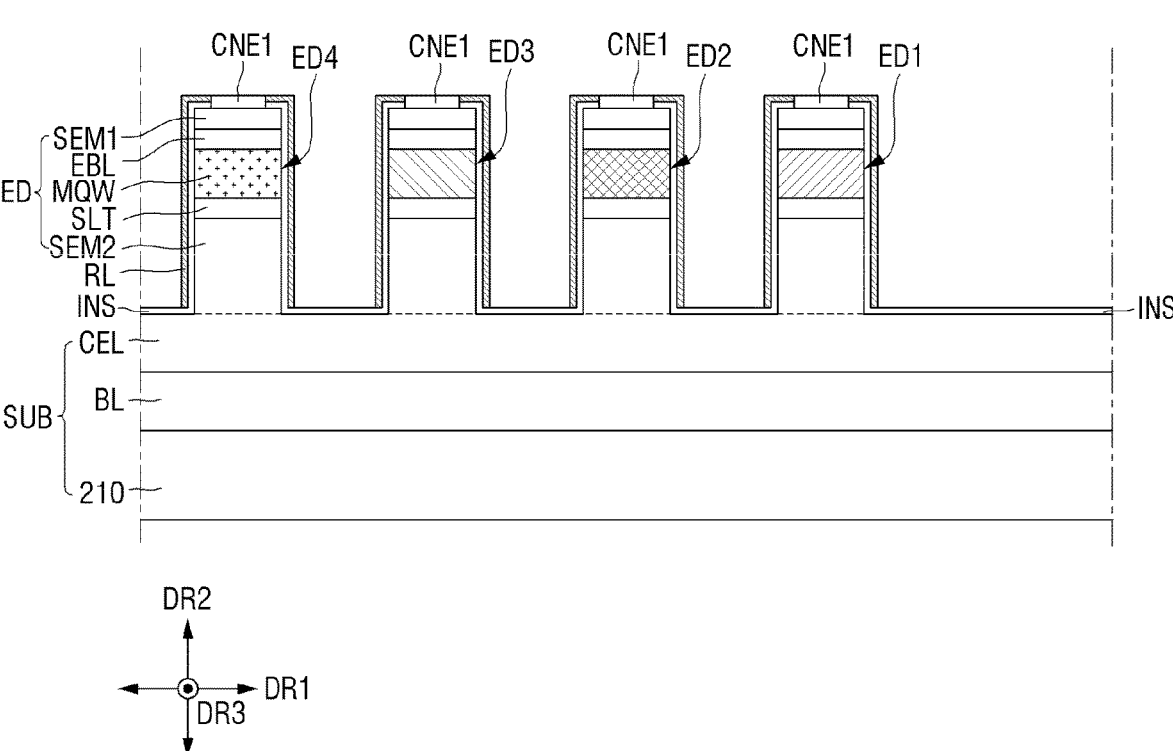

First, as illustrated in FIGS. 19 to 21, the insulating layer INS, the first connection electrodes CNE1, and the reflective layers RL are formed on the light emitting elements ED. The insulating layer INS is entirely located on the common electrode layer CEL (e.g. is located above an entirety of the common electrode layer CEL), and is formed to cover the plurality of light emitting elements ED. The insulating layer INS may be formed through a deposition process, a sputtering process, an atomic layer deposition process, or the like, rather than the epitaxial growth method, unlike the semiconductor layers.

Then, as shown in FIG. 19, portions of the insulating layer INS are removed so that portions of upper surfaces of the light emitting elements ED located in the display area DPA are exposed. A process of removing portions of the insulating layer INS may be performed through an etching process using a mask. The etching process is a general etching process for material layers, and may be, for example, dry etching, wet etching, reactive ion etching (RIE), deep reactive ion etching (DRIE), inductively coupled plasma reactive ion etching (ICP-RIE), or the like. In a case of the dry etching, anisotropic etching is possible, and the dry etching may thus be suitable for vertical etching. When the above-described etching method is used, an etchant may be $Cl_2$, $O_2$, or the like. However, the disclosure is not limited thereto. As illustrated in the drawings, portions of upper surfaces of the first semiconductor layers SEM1 of each of the light emitting elements ED may be exposed.

Then, as shown in FIG. 20, the first connection electrodes CNE1 are formed respectively on upper surfaces of the light emitting elements ED of which the upper surfaces of the first semiconductor layers SEM1 are exposed. The first connection electrodes CNE1 may be formed on the light emitting elements ED through a photo process. The first connection electrodes CNE1 may be formed on the exposed first semiconductor layers SEM1 of the light emitting elements ED located in the display area DPA.

Then, as shown in FIG. 21, the reflective layers RL surrounding portions of outer surfaces of the light emitting elements ED are formed. The reflective layers RL may be located on side surfaces and portions of upper surfaces of the light emitting elements ED on the insulating layer INS. The reflective layers RL may be located on side surfaces of the light emitting elements ED located in the display area DPA, and on the insulating layer INS on portions of upper surfaces of the light emitting elements ED on which the first connection electrodes CNE1 are not located.

Figure 22:
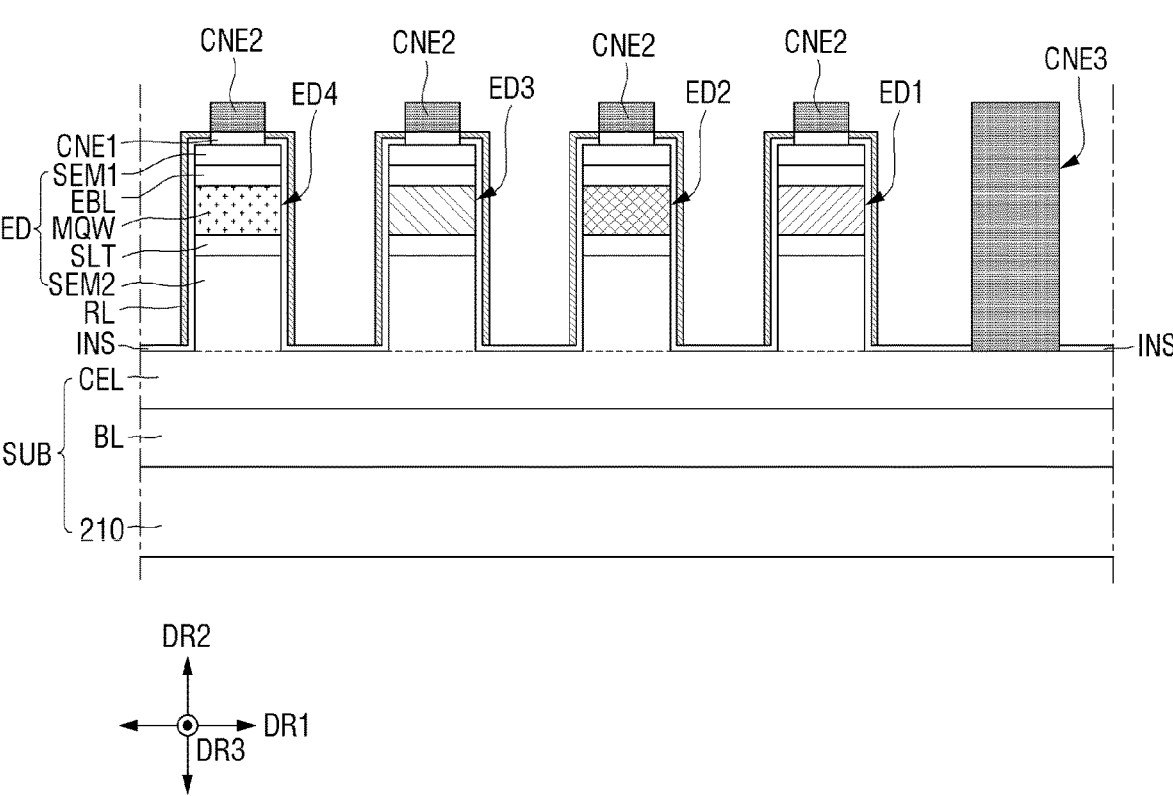

Next, referring to FIG. 22, portions of the insulating layer INS located in the common electrode areas CPA1, CPA2, and CPA3 are removed to expose the common electrode layer CEL, and the second connection electrodes CNE2 located on the first connection electrodes CNE1, and the third connection electrodes CNE3 located directly on the common electrode layer CEL, are formed. A process of removing portions of the insulating layer INS may be performed through an etching process using a mask.

When portions of the upper surface of the common electrode layer CEL are exposed by removing the insulating layer INS, the second connection electrodes CNE2 and the third connection electrodes CNE3 are formed, respectively, on the light emitting elements ED1, ED2, and ED3 and on the common electrode layer CEL of which the upper surface is exposed by the etching process. The second connection electrodes CNE2 are located directly on the first connection electrodes CNE1 on the light emitting elements ED. The third connection electrodes CNE3 may be located directly on the common electrode layer CEL of which the upper surface is exposed in the common electrode areas CPA1, CPA2, and CPA3. The third connection electrodes CNE3 may serve as common electrodes of the light emitting elements ED together with the common electrode layer CEL.

The display substrate 300 located on the second substrate 210 may be fabricated through the processes described above. Then, the display device 10 may be fabricated by bonding the prepared circuit substrate 100 and display substrate 300 to each other.

Referring to FIG. 23, the circuit substrate 100 and the display substrate 300 in which the light emitting elements ED are formed are bonded to each other (S40). The display substrate 300 formed on the second substrate 210 may be located on the display substrate area DSA of the circuit substrate 100. In the process, the second substrate 210 and the display substrate 300 may be aligned with each other on the circuit substrate 100 so that the light emitting elements ED correspond to the pixel electrodes AE of the circuit substrate 100. The second connection electrodes CNE2 located in the display area DPA may be aligned to overlap the pixel electrodes AE in the thickness direction, and the third connection electrodes CNE3 located in the common electrode areas CPA1, CPA2, and CPA3 may be aligned to overlap the common electrode connection parts CEP in the thickness direction.

When the second substrate 210 and the display substrate 300 are aligned with the circuit substrate 100, a filling layer 500 is located between the display substrate 300 and the circuit substrate 100 to bond the display substrate 300 and the circuit substrate 100 to each other. As an example, a material of the filling layer 500 may be injected so that the filling layer 500 fills a space between the display substrate 300 and the circuit substrate 100 when the display substrate 300 and the circuit substrate 100 are aligned with each other, such that the connection electrodes CNE1, CNE2, and CNE3 are in contact with the pixel electrodes AE and the common electrode connection parts CEP. Thereafter, when the injected material of the filling layer 500 is cured, the display substrate 300 and the circuit substrate 100 may be bonded to each other. However, the disclosure is not limited thereto, and as described above, a process of bonding the circuit substrate 100 and the display substrate 300 to each other may also be performed in a manner of disposing materials of the filling layer 500 on the first substrate 110 and the common electrode layer CEL, respectively, to planarize upper surfaces of the first substrate 110 and the common electrode layer CEL and then attaching the first substrate 110 and the common electrode layer CEL to each other.

The second connection electrodes CNE2 located on the light emitting elements ED of the display substrate 300 may be in direct contact with the pixel electrodes AE, and the third connection electrodes CNE3 located in the common electrode areas CPA1, CPA2, and CPA3 may be in direct contact with the common electrode connection parts CEP. When the circuit substrate 100 and the display substrate 300 are bonded to each other, both ends of the light emitting elements ED may be electrically connected to the pixel circuit parts PXC of the circuit substrate 100.

Figure 24:
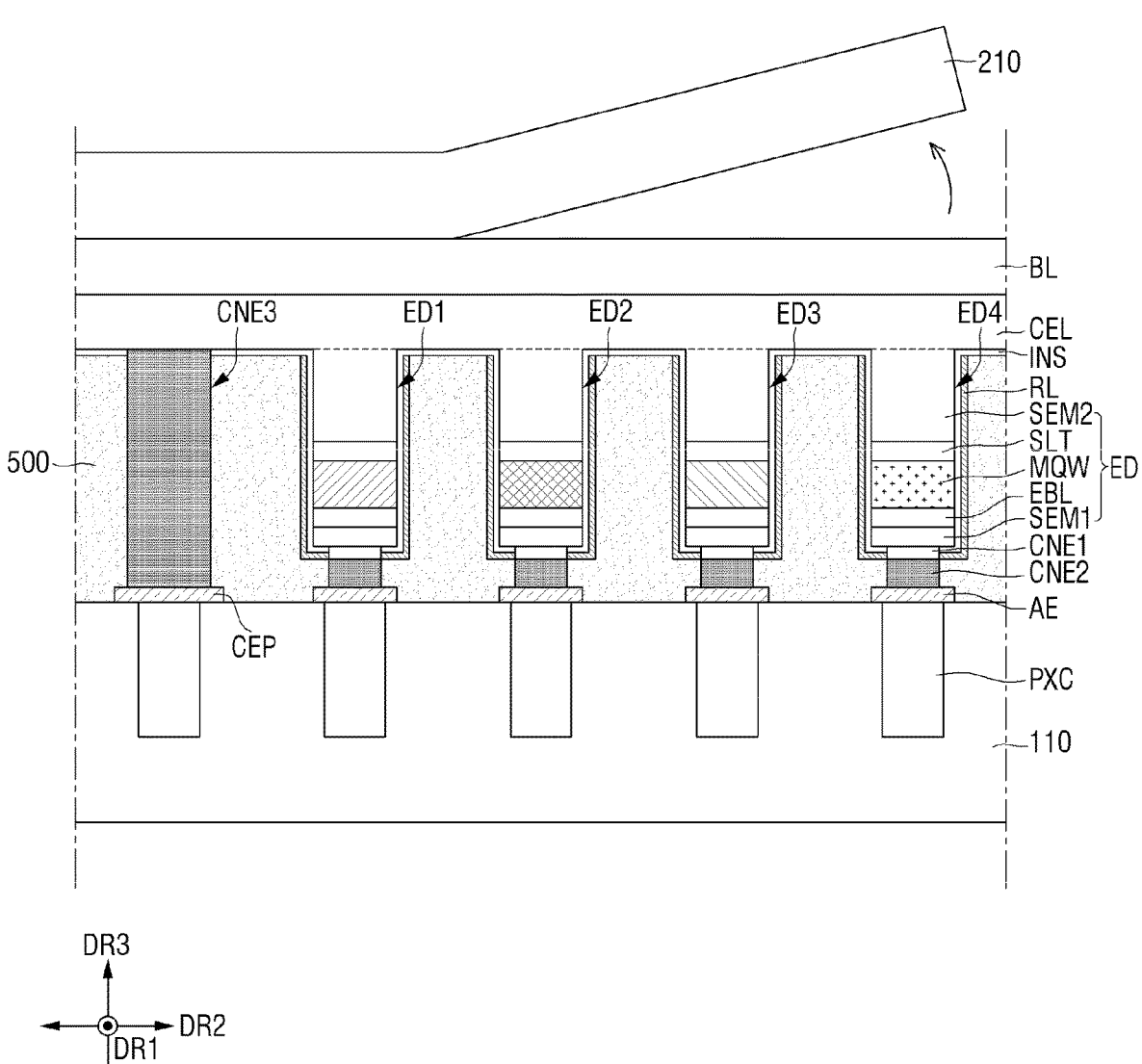

Next, referring to FIG. 24, the display device 10 may be fabricated by removing the second substrate 210 located on the base layer BL of the display substrate 300.

Hereinafter, various embodiments of the display device 10 will be described with further reference to other drawings.

Figure 25:
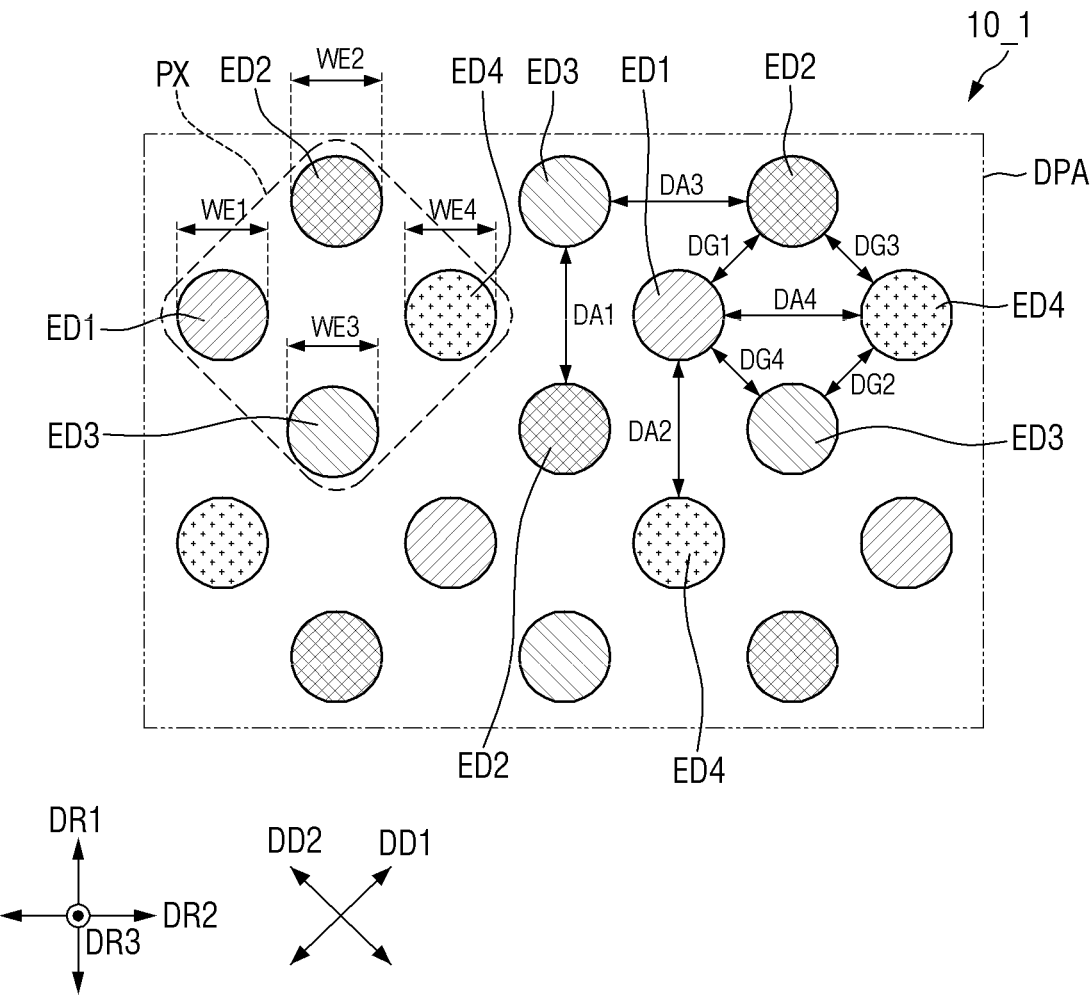
FIGS. 25 and 26 are plan views illustrating a relative layout of light emitting elements located in a display area of the display device according to some embodiments.
Figure 26:
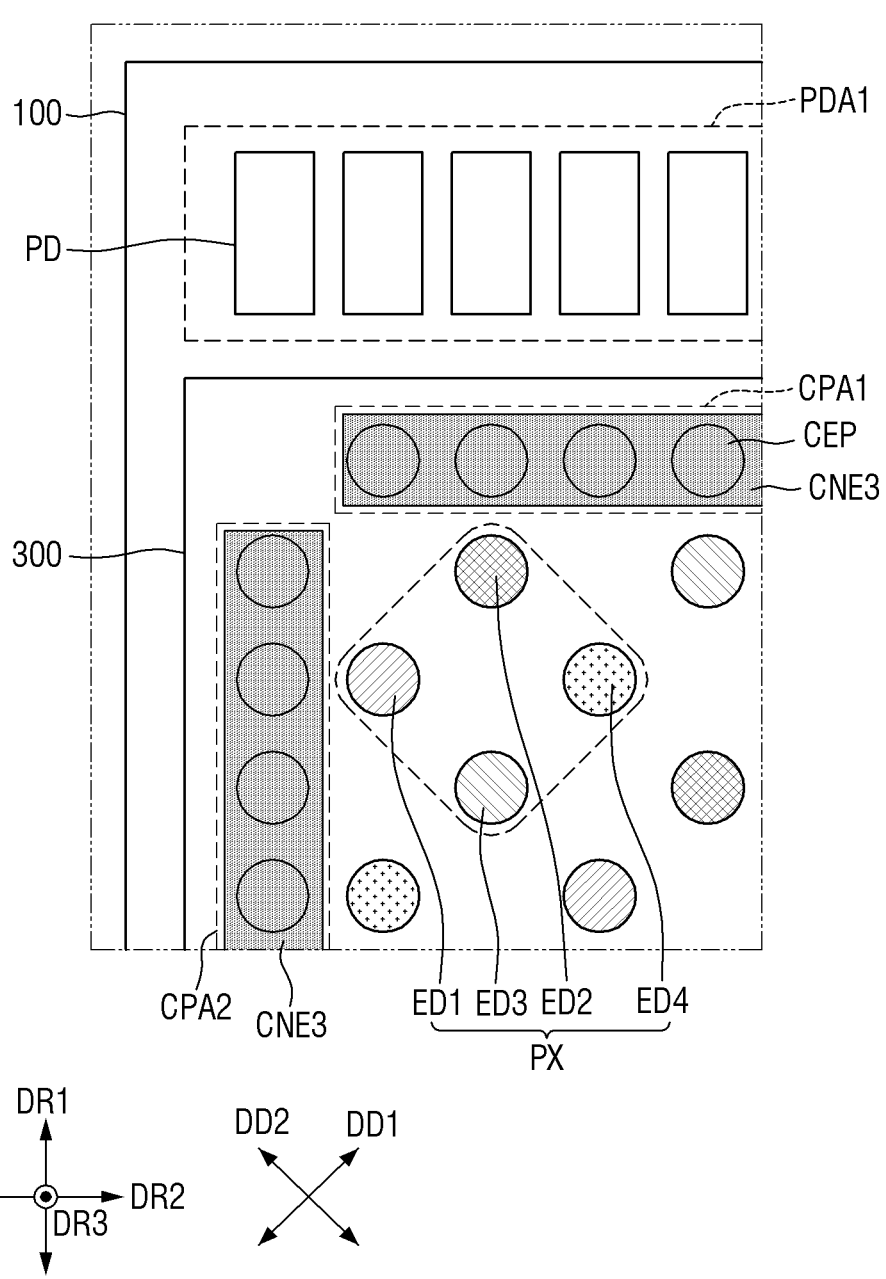

FIGS. 25 and 26 are plan views illustrating a relative layout of light emitting elements located in a display area of the display device according to some embodiments.

Referring to FIGS. 25 and 26, in a display device 10_1 according to some embodiments, each of a plurality of pixels PX may include four light emitting elements ED1, ED2, ED3, and ED4, and the light emitting elements ED may be arranged to be spaced apart from each other in the first direction DR1 and the second direction DR2. The light emitting elements ED may be spaced apart from each other such that they are most adjacent to each other in diagonal directions DD1 and DD2 between the first direction DR1 and the second direction DR2. Some embodiments are different from the embodiments corresponding to FIG. 5 in an arrangement of light emitting elements ED constituting one pixel PX. Hereinafter, a description for overlapping contents will be omitted, and contents different from those described above will be mainly described.

Each of the pixels PX may include a first light emitting element ED1 for emitting light of a first color, a second light emitting element ED2 for emitting light of a second color, a third light emitting element ED3 for emitting light of a third color, and a fourth light emitting element ED4 for emitting light of a fourth color. In the display area DPA, the first light emitting elements ED1 and the fourth light emitting elements ED4 may be alternately located in the first direction DR1 and the second direction DR2. The second light emitting elements ED2 and the third light emitting elements ED3 may also be alternately located in the first direction DR1 and the second direction DR2. The first, second, third, and fourth light emitting elements ED1, ED2, ED3, and ED4 may be alternately located in the diagonal directions DD1 and DD2 between the first direction DR1 and the second direction DR2. The diagonal directions DD1 and DD2 may be oblique directions inclined from the first direction DR1 and the second direction DR2.

For example, in each of the plurality of pixels PX, the first light emitting elements ED1 and the second light emitting elements ED2 may be alternately located in a first diagonal direction DD1 between one side in the first direction DR1 and one side in the second direction DR2 (e.g., along first lines), and the third light emitting elements ED3 and the fourth light emitting elements ED4 may be alternately located in the first diagonal direction DD1 (e.g., along second lines). In each of the plurality of pixels PX, the first light emitting elements ED1 and the third light emitting elements ED3 may be alternately located in a second diagonal direction DD2 between one side in the first direction DR1 and the other side in the second direction DR2 (e.g., along third lines), and the second light emitting elements ED2 and the fourth light emitting elements ED4 may be alternately located in the second diagonal direction DD2 (e.g., along fourth lines). The first diagonal direction DD1 and the second diagonal direction DD2 may cross each other.

In some embodiments, the first light emitting element ED1, the second light emitting element ED2, the third light emitting element ED3, and the fourth light emitting element ED4 may have the same diameter. For example, a first diameter WE1 of the first light emitting element ED1, a second diameter WE2 of the second light emitting element ED2, a third diameter WE3 of the third light emitting element ED3, and a fourth diameter WE4 of the fourth light emitting element ED4 may be the same as each other. However, the disclosure is not limited thereto. In some embodiments, diameters of the light emitting elements ED1, ED2, ED3, and ED4 may also be different from each other.

Intervals DA1 and DA3 between respective second and third light emitting elements ED2 and ED3 adjacent to each other may be the same as intervals DA2 and DA4 between respective first and fourth light emitting elements ED1 and ED4 adjacent to each other. For example, a first interval DA1 between the second light emitting element ED2 and the third light emitting element ED3 adjacent to each other in the first direction DR1 may be the same as a second interval DA2 between the first light emitting element ED1 and the fourth light emitting element ED4 adjacent to each other in the first direction DR1. A third interval DA3 between the second light emitting element ED2 and the third light emitting element ED3 adjacent to each other in the second direction DR2 may be the same as a fourth interval DA4 between the first light emitting element ED1 and the fourth light emitting element ED4 adjacent to each other in the second direction DR2. In addition, a first diagonal interval DG1 between the first light emitting element ED1 and the second light emitting element ED2 adjacent to each other in the first diagonal direction DD1 may be the same as a second diagonal interval DG2 between the third light emitting element ED3 and the fourth light emitting element ED4 adjacent to each other in the first diagonal direction DD1. A third diagonal interval DG3 between the second light emitting element ED2 and the fourth light emitting element ED4 adjacent to each other in the second diagonal direction DD2 may be the same as a fourth diagonal interval DG4 between the first light emitting element ED1 and the third light emitting element ED3 adjacent to each other in the second diagonal direction DD2. However, the disclosure is not limited thereto. The intervals between the light emitting elements ED adjacent to each other may be changed depending on a layout, diameters, and the like, of the light emitting elements ED.

It has been illustrated in FIGS. 25 and 26 that the first light emitting element ED1 emits red light, which is the light of the first color, the second light emitting element ED2 emits yellow light, which is the light of the second color, the third light emitting element ED3 emits green light, which is the light of the third color, and the fourth light emitting element ED4 emits blue light, which is the light of the fourth color, but the disclosure is not limited thereto. A relative layout of the light emitting elements ED1, ED2, ED3, and ED4 in each pixel PX, and colors of light emitted from the light emitting elements ED located at corresponding positions, may be variously modified.

It has been illustrated in FIGS. 25 and 26 that each of the first to fourth light emitting elements ED1, ED2, ED3, and ED4 has a circular shape in plan view, but the disclosure is not limited thereto. As described above, each of the light emitting elements ED may have a polygonal shape such as a triangular shape, a quadrangular shape, a pentagonal shape, a hexagonal shape, and an octagonal shape, an elliptical shape, or an irregular shape.

In FIGS. 25 and 26, the intervals DA1 to DA4 and DG1 to DG4 between the first to fourth light emitting elements ED1, ED2, ED3, and ED4 have been illustrated as the shortest intervals based on outer side portions of the respective light emitting elements ED1, ED2, ED3, and ED4. However, the disclosure is not limited thereto. The intervals DA1 to DA4 and DG1 to DG4 between the light emitting elements ED1, ED2, ED3, and ED4 may also be illustrated on the basis of the centers of the light emitting elements ED1, ED2, ED3, and ED4.

Figure 27:
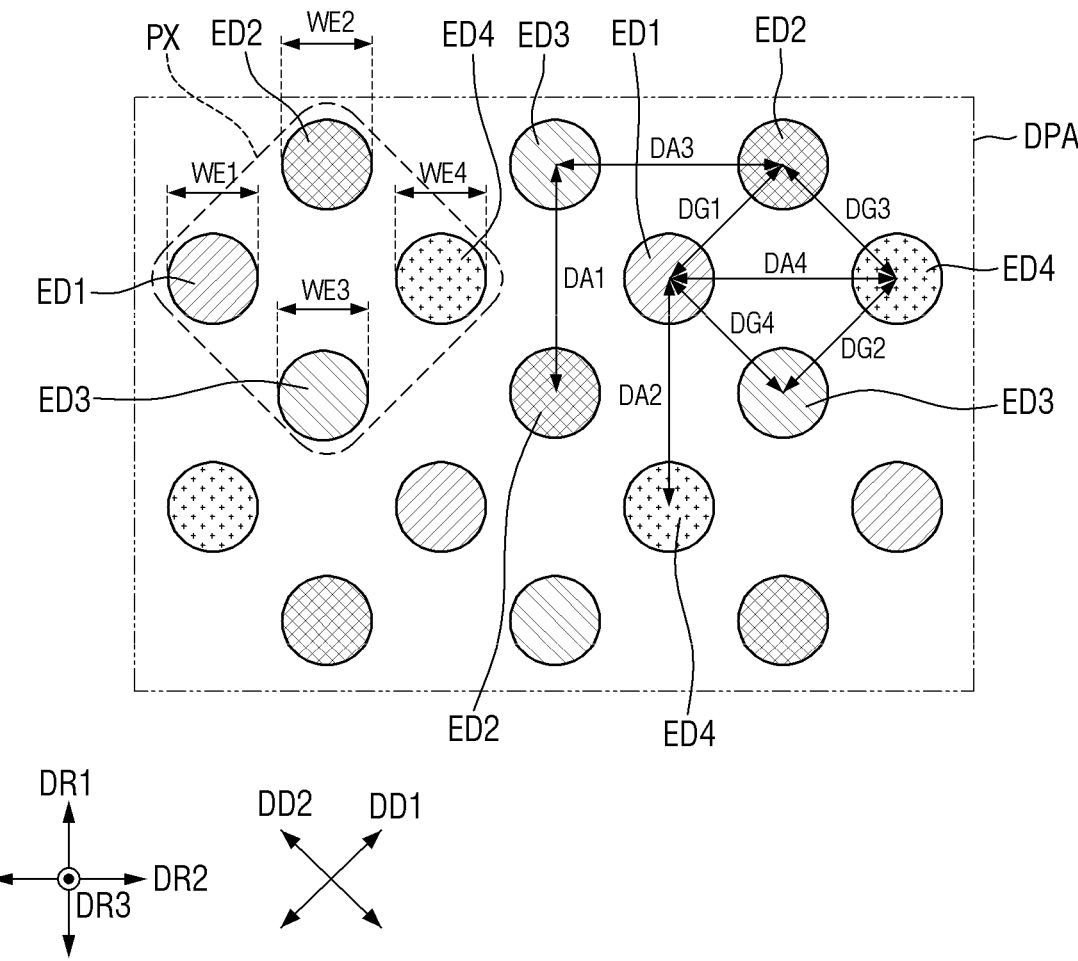
FIG. 27 is a plan view illustrating a relative layout of light emitting elements located in a display area of a display device according to other embodiments.

FIG. 27 is a plan view illustrating a relative layout of light emitting elements located in a display area of the display device according to some embodiments.

Referring to FIG. 27 in addition to FIGS. 25 and 26, intervals DA1 and DA3 between centers of respective second and third light emitting elements ED2 and ED3 that are adjacent to each other may be the same as intervals DA2 and DA4 between centers of respective first and fourth light emitting elements ED1 and ED4 that are adjacent to each other. For example, a first interval DA1 between centers of the second light emitting element ED2 and the third light emitting element ED3 adjacent to each other in the first direction DR1 may be the same as a second interval DA2 between centers of the first light emitting element ED1 and the fourth light emitting element ED4 adjacent to each other in the first direction DR1. A third interval DA3 between centers of the second light emitting element ED2 and the third light emitting element ED3 adjacent to each other in the second direction DR2 may be the same as a fourth interval DA4 between centers of the first light emitting element ED1 and the fourth light emitting element ED4 adjacent to each other in the second direction DR2. In addition, a first diagonal interval DG1 between centers of the first light emitting element ED1 and the second light emitting element ED2 adjacent to each other in the first diagonal direction DD1 may be the same as a second diagonal interval DG2 between centers of the third light emitting element ED3 and the fourth light emitting element ED4 adjacent to each other in the first diagonal direction DD1. A third diagonal interval DG3 between centers of the second light emitting element ED2 and the fourth light emitting element ED4 adjacent to each other in the second diagonal direction DD2 may be the same as a fourth diagonal interval DG4 between centers of the first light emitting element ED1 and the third light emitting element ED3 adjacent to each other in the second diagonal direction DD2. However, the disclosure is not limited thereto. The intervals between the light emitting elements ED adjacent to each other may be changed depending on a layout, diameters, and the like, of the light emitting elements ED.

A case where the intervals DA1 to DA4 and DG1 to DG4 between the centers of the light emitting elements ED1, ED2, ED3, and ED4 are respectively the same as each other has been illustrated in some embodiments, but the disclosure is not limited thereto. The intervals between the centers of the light emitting elements ED1, ED2, ED3, and ED4 may also be modified similarly to those described above with reference to the embodiments corresponding to FIGS. 25 and 26.

Figure 28:
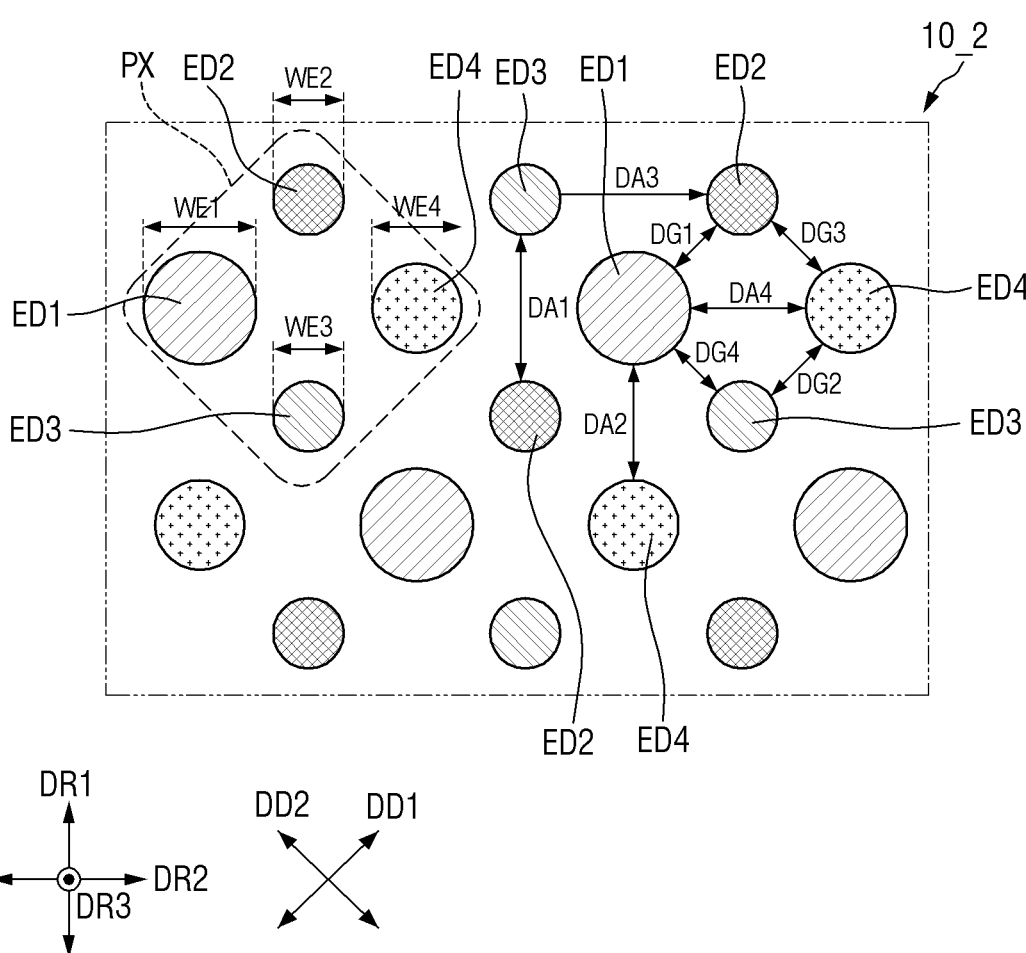
FIG. 28 is a plan view illustrating a relative layout of light emitting elements located in a display area of a display device according to other embodiments.
Figure 30:
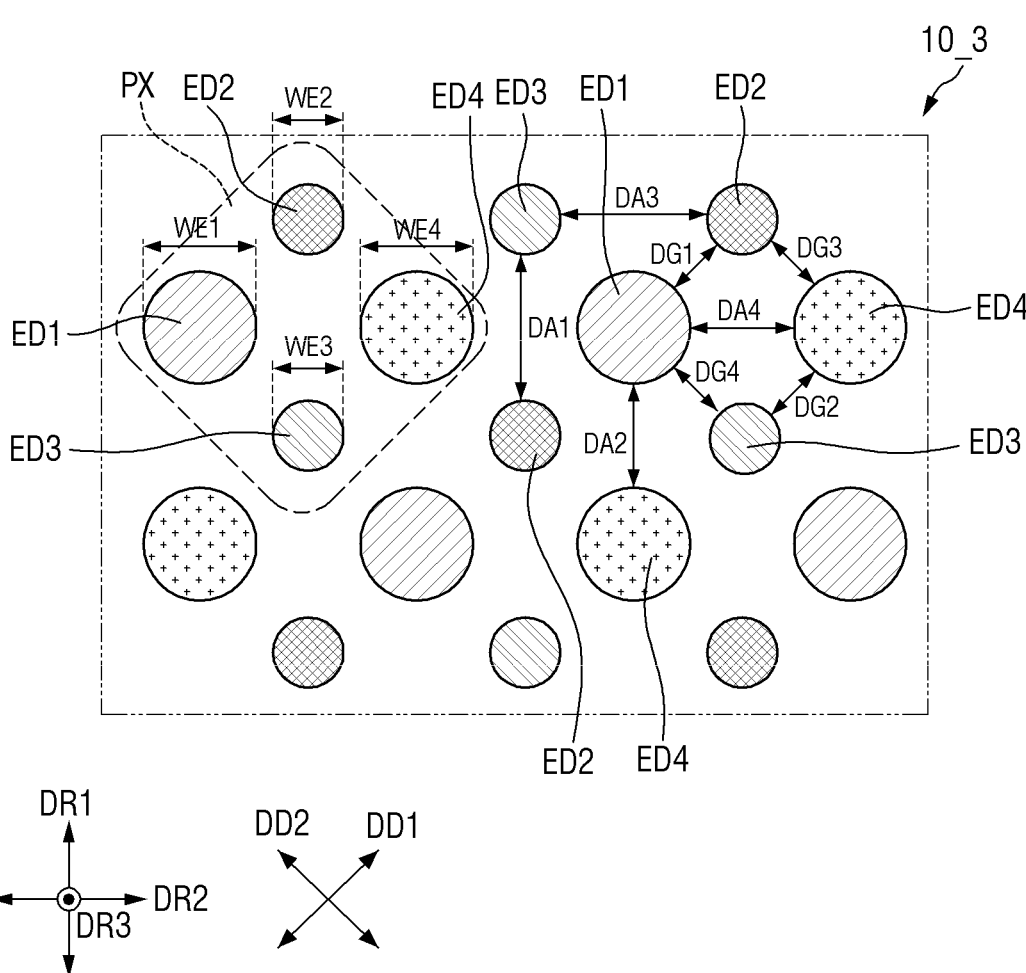
FIG. 30 is a plan view illustrating a relative layout of light emitting elements located in a display area of a display device according to other embodiments.

FIG. 28 is a plan view illustrating a relative layout of light emitting elements located in a display area of a display device according to other embodiments. FIG. 29 is a cross-sectional view illustrating a portion of the display device of FIG. 28. FIG. 30 is a plan view illustrating a relative layout of light emitting elements located in a display area of a display device according to other embodiments.

Referring to FIGS. 28 to 30, in display devices 10_2 and 10_3 according to other embodiments, sizes of light emitting elements ED1, ED2, ED3, and ED4 may be different from each other. In the display device 10_2 of FIGS. 28 and 29, a first diameter WE1 of a first light emitting element ED1 may be greater than each of diameters WE2, WE3, and WE4 of a second light emitting element ED2, a third light emitting element ED3, and a fourth light emitting element ED4. Also, a fourth diameter WE4 of the fourth light emitting element ED4 may be greater than the diameters WE2 and WE3 of the second light emitting element ED2 and the third light emitting element ED3. A second diameter WE2 of the second light emitting element ED2 may be the same as a third diameter WE3 of the third light emitting element ED3. The embodiments corresponding to FIG. 30 are different from the embodiments corresponding to FIGS. 28 and 29 in that the first diameter WE1 of the first light emitting element ED1 is the same as the fourth diameter WE4 of the fourth light emitting element ED4.

In processes for fabrication of the display devices 10_2 and 10_3, the respective light emitting elements ED may have diameters corresponding to sizes of the holes H1 and H2 formed in the support layer SPL. In the processes for fabrication of the display devices 10_2 and 10_3, diameters of the respective light emitting elements ED located in the display substrate 300 may be adjusted by adjusting the diameters of the holes H1 and H2 formed in the support layer SPL so as to be different from each other.

Accordingly, intervals between the light emitting elements ED adjacent to each other may be partially different from each other.

For example, a first interval DA1 between the second light emitting element ED2 and the third light emitting element ED3 adjacent to each other in the first direction DR1 may be greater than a second interval DA2 between the first light emitting element ED1 and the fourth light emitting element ED4 adjacent to each other in the first direction DR1. A third interval DA3 between the second light emitting element ED2 and the third light emitting element ED3 adjacent to each other in the second direction DR2 may be greater than a fourth interval DA4 between the first light emitting element ED1 and the fourth light emitting element ED4 adjacent to each other in the second direction DR2. In addition, a first diagonal interval DG1 between the first light emitting element ED1 and the second light emitting element ED2 adjacent to each other in the first diagonal direction DD1 may be different from a second diagonal interval DG2 between the third light emitting element ED3 and the fourth light emitting element ED4 adjacent to each other in the first diagonal direction DD1. A third diagonal interval DG3 between the second light emitting element ED2 and the fourth light emitting element ED4 adjacent to each other in the second diagonal direction DD2 may be different from a fourth diagonal interval DG4 between the first light emitting element ED1 and the third light emitting element ED3 adjacent to each other in the second diagonal direction DD2.

In some embodiments in which the first diameter WE1 of the first light emitting element ED1 is greater than the fourth diameter WE4 of the fourth light emitting element ED4, the first diagonal interval DG1 may be smaller than the second diagonal interval DG2, and the third diagonal interval DG3 may be greater than the fourth diagonal interval DG4. However, the disclosure is not limited thereto. The intervals between the light emitting elements ED adjacent to each other may be changed depending on a layout, diameters, and the like, of the light emitting elements ED. For example, in some embodiments in which the first diameter WE1 of the first light emitting element ED1 is the same as the fourth diameter WE4 of the fourth light emitting element ED4, the first diagonal interval DG1 may be the same as the second diagonal interval DG2, and the third diagonal interval DG3 may be the same as the fourth diagonal interval DG4.

In the above-described embodiments, red light emitting elements, which are the first light emitting elements ED1, have a relatively large diameter, and thus, internal quantum efficiency of the first light emitting elements ED1 lower than that of the light emitting elements ED emitting light having a short wavelength may be complemented. Accordingly, the display devices 10_2 and 10_3 may improve a phenomenon in which red is insufficient among colors of light displayed by the pixels PX.

In FIGS. 28 to 30, intervals based on outer side portions of the light emitting elements ED1, ED2, ED3, and ED4 have been illustrated and described as the intervals DA1 to DA4 and DG1 to DG4 between the first to fourth light emitting elements ED1, ED2, ED3, and ED4, but the disclosure is not limited thereto. Similar to the embodiments corresponding to FIG. 27, the intervals between the light emitting elements ED1, ED2, ED3, and ED4 described in FIGS. 28 to 30 may be similarly applied even though the intervals between the light emitting elements ED1, ED2, ED3, and ED4 are compared with each other on the basis of centers of the light emitting elements ED1, ED2, ED3, and ED4. However, in some embodiments in which the diameters of the respective light emitting elements ED1, ED2, ED3, and ED4 are different from each other, size relationships between the intervals between the light emitting elements ED1, ED2, ED3, and ED4 based on the outer side portions of the light emitting elements ED1, ED2, ED3, and ED4 and the intervals between the light emitting elements ED1, ED2, ED3, and ED4 based on the centers of the light emitting elements ED1, ED2, ED3, and ED4 may be different from each other.

Figure 31:
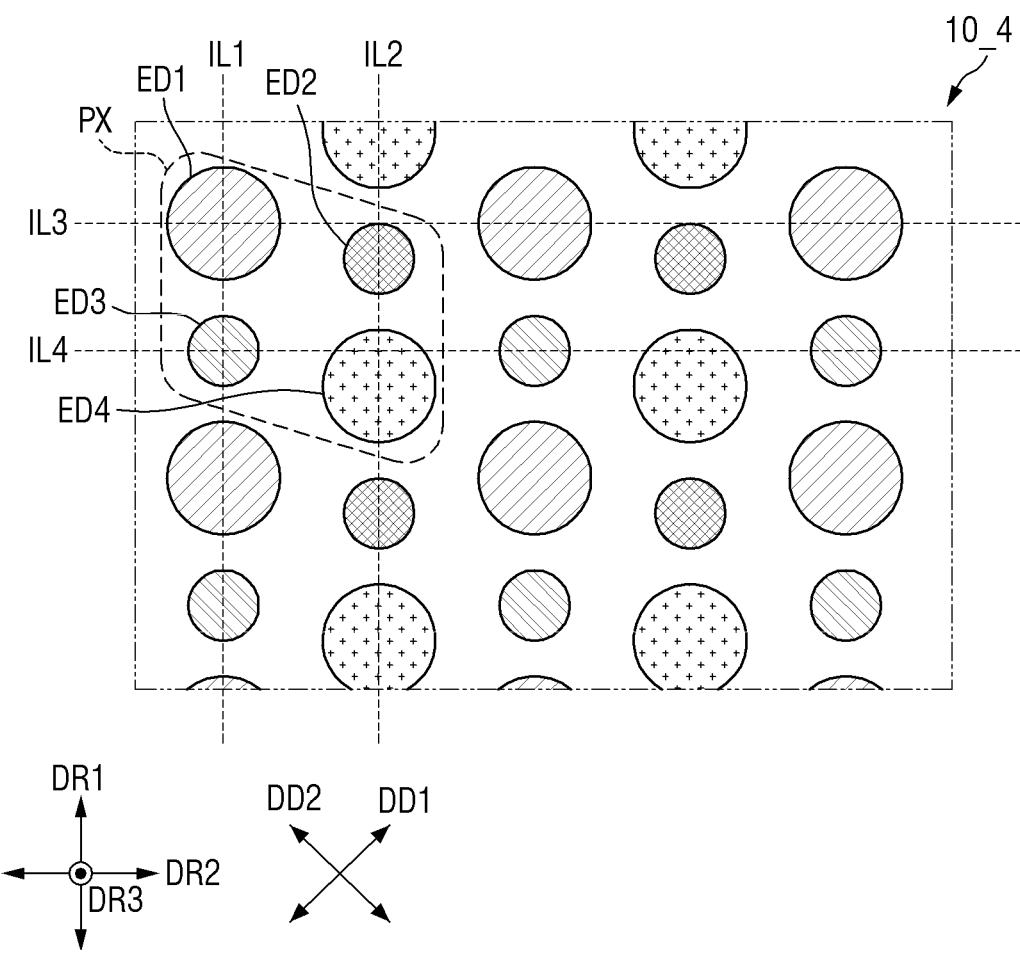
FIG. 31 is a plan view illustrating a relative layout of light emitting elements located in a display area of a display device according to other embodiments.

FIG. 31 is a plan view illustrating a relative layout of light emitting elements located in a display area of a display device according to other embodiments.

Referring to FIG. 31, in a display device 10_4 according to some embodiments, light emitting elements ED1, ED2, ED3, and ED4 of each pixel PX may have another arrangement. The light emitting elements ED1, ED2, ED3, and ED4 of each of the pixels PX are arranged in the first direction DR1, the second direction DR2, the first diagonal direction DD1, and the second diagonal direction DD2, but the light emitting elements ED arranged in the same direction may be different from those of the above-described embodiments.

For example, the first light emitting elements ED1 and the third light emitting elements ED3 may be alternately located in the first direction DR1, and the second light emitting elements ED2 and the fourth light emitting elements ED4 may be alternately located in the first direction DR1. The first light emitting elements ED1 and the third light emitting elements ED3 may be alternately arranged to be spaced apart from each other in the first direction DR1, and central portions of each of the first light emitting elements ED1 and the third light emitting elements ED3 may be positioned on a first virtual line IL1 extending in the first direction DR1. Similarly, the second light emitting elements ED2 and the fourth light emitting elements ED4 may be alternately arranged to be spaced apart from each other in the first direction DR1, and central portions of each of the second light emitting elements ED2 and the fourth light emitting elements ED4 may be positioned on a second virtual line IL2 extending in the first direction DR1.

In each pixel PX, the first light emitting element ED1 and the fourth light emitting element ED4 may be spaced apart from each other in the second diagonal direction DD2, and the second light emitting element ED2 and the third light emitting element ED3 may be spaced apart from each other in the first diagonal direction DD1. However, the first light emitting element ED1 and the second light emitting element ED2 may be spaced apart from each other in an inclined direction between the second direction DR2 and the second diagonal direction DD2, and the third light emitting element ED3 and the fourth light emitting element ED4 may also be spaced apart from each other in the inclined direction between the second direction DR2 and the second diagonal direction DD2.

The first light emitting elements ED1 and the second light emitting elements ED2 may be alternately located in the second direction DR2, and the third light emitting elements ED3 and the fourth light emitting elements ED4 may be alternately located in the second direction DR2. The first light emitting elements ED1 and the second light emitting elements ED2 may be alternately arranged to be spaced apart from each other in the second direction DR2, and central portions of the second light emitting elements ED2 may not be positioned on a third virtual line IL3 extending in the second direction DR2 while traversing central portions of the first light emitting elements ED1. As an example, the second light emitting elements ED2 may be located so that the central portions thereof are spaced apart from the third virtual line IL3 in the first direction DR1. The second light emitting element ED2 may partially overlap or may not overlap the third virtual line IL3 according to a diameter of the second light emitting element ED2. It has been illustrated in FIG. 31 that the second light emitting elements ED2 are located so that outer surfaces thereof are in contact with the third virtual line IL3, but the disclosure is not limited thereto.

Similarly, the third light emitting elements ED3 and the fourth light emitting elements ED4 may be alternately arranged to be spaced apart from each other in the second direction DR2, and central portions of the fourth light emitting elements ED4 may not be positioned on a fourth virtual line IL4 extending in the second direction DR2 while traversing central portions of the third light emitting elements ED3. As an example, the fourth light emitting elements ED4 may be located so that the central portions thereof are spaced apart from the fourth virtual line IL4 in the first direction DR1. The fourth light emitting element ED4 may partially overlap or may not overlap the fourth virtual line IL4 according to a diameter thereof. It has been illustrated in FIG. 31 that the fourth light emitting elements ED4 are located to partially overlap the fourth vertical line IL4, but the disclosure is not limited thereto.

It has been illustrated in FIG. 31 that the respective light emitting elements ED have different diameters as in the embodiments corresponding to FIG. 28. A first diameter WE1 of a first light emitting element ED1 may be greater than each of diameters WE2, WE3, and WE4 of a second light emitting element ED2, a third light emitting element ED3, and a fourth light emitting element ED4, and a fourth diameter WE4 of the fourth light emitting element ED4 may be greater than the diameters WE2 and WE3 of the second light emitting element ED2 and the third light emitting element ED3. A second diameter WE2 of the second light emitting element ED2 may be the same as a third diameter WE3 of the third light emitting element ED3. However, the disclosure is not limited thereto, and in the display device 10_4 including the pixels PX and the light emitting elements ED having arrangements according to some embodiments, the light emitting elements ED may also have the same diameter.

Figure 32:
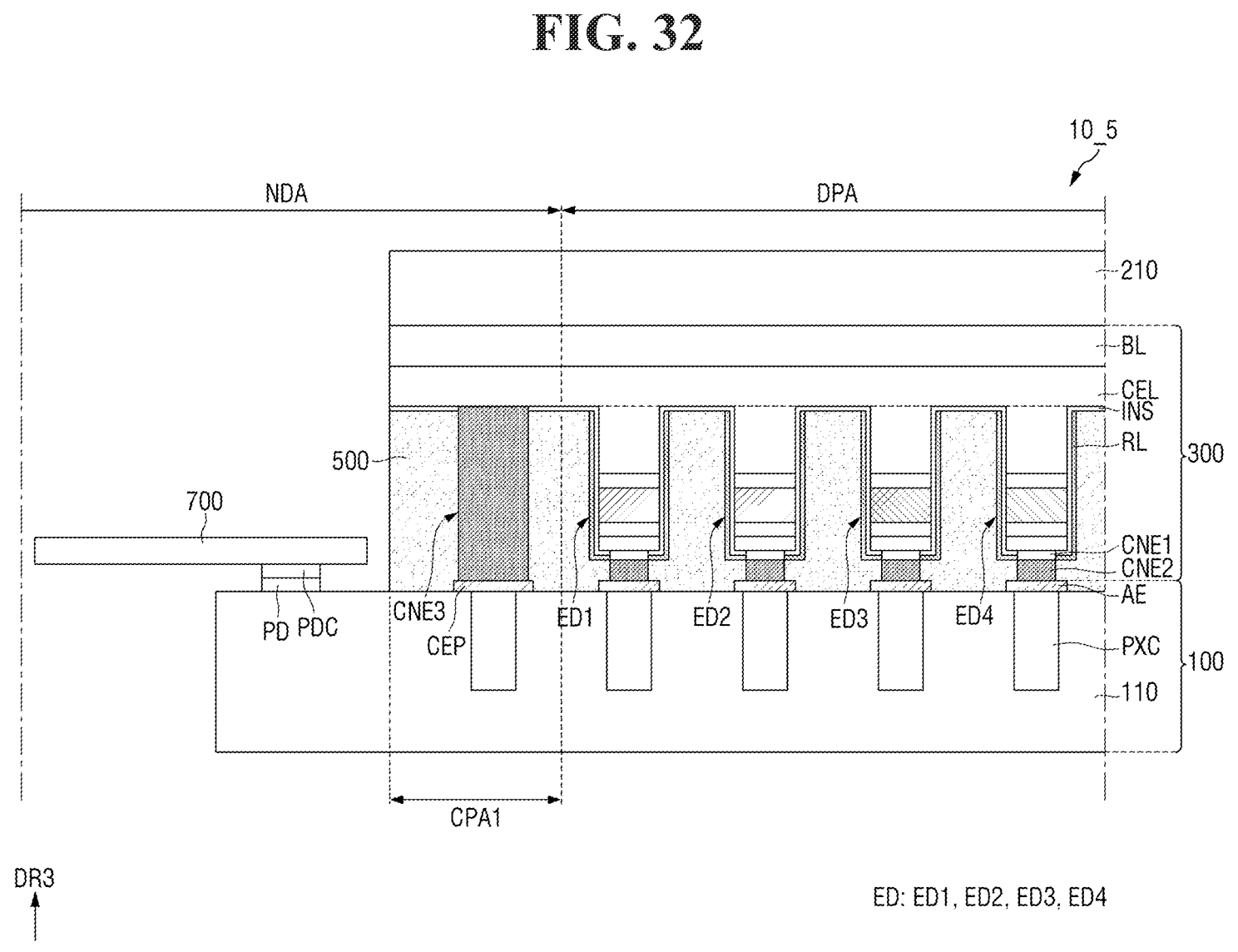

FIG. 32 is a cross-sectional view illustrating a portion of a display device according to other embodiments.

Referring to FIG. 32, a display device 10_5 according to other embodiments may further include a second substrate 210. Some embodiments are different from the above-described embodiments in that the second substrate 210 on which the display substrate 300 is formed is not removed in processes for fabrication of the display device 10_5. The second substrate 210 is a substrate made of a transparent material, and may be a sapphire substrate or a glass substrate. Accordingly, even though the second substrate 210 is located, light emitted from the light emitting elements ED may be emitted through an upper surface of the second substrate 210. Unlike the above-described embodiments, the second substrate 210 is located on the base layer BL of the display substrate 300, and thus, durability against external impact may be improved.

Figure 33:
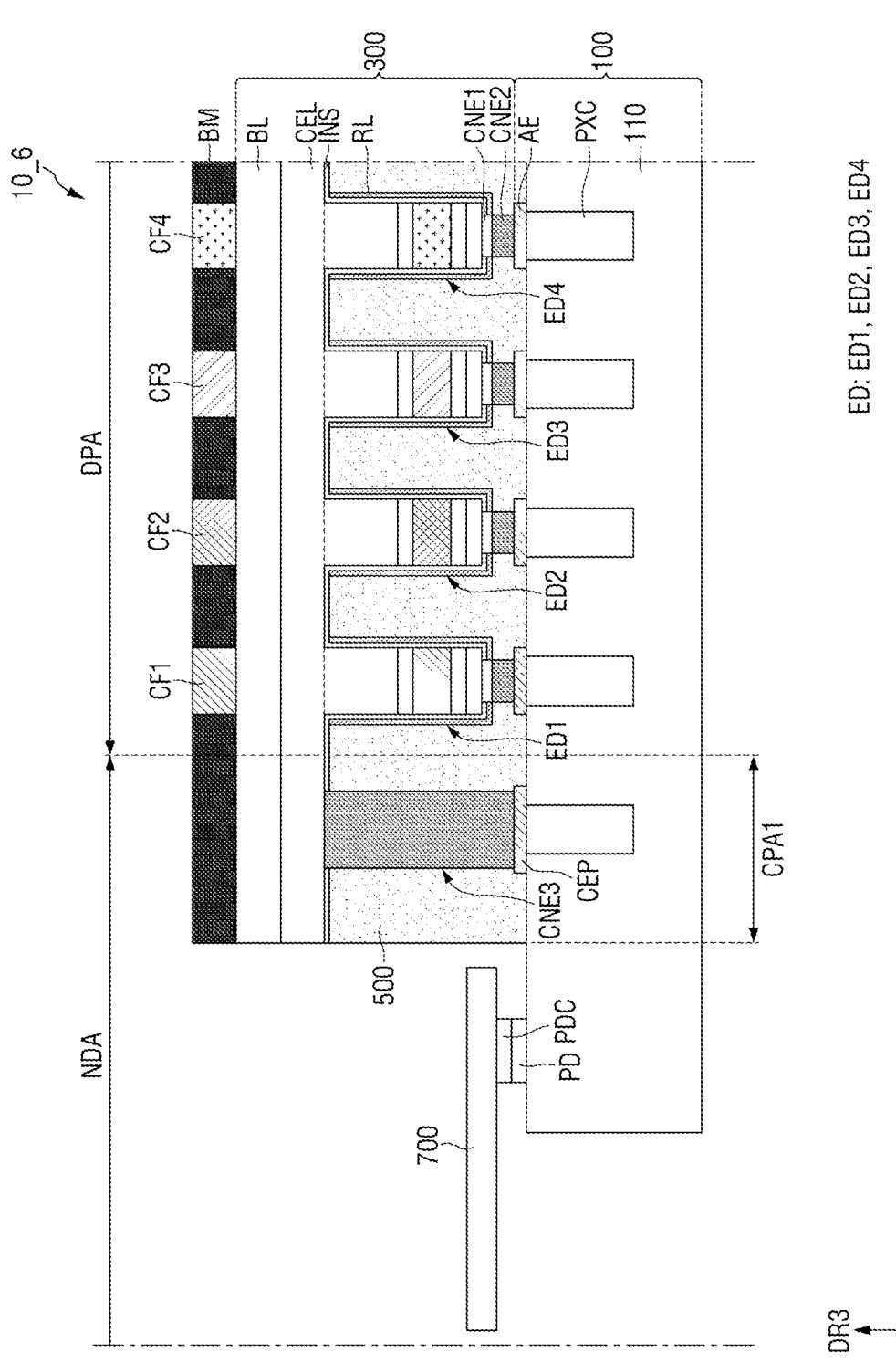
FIG. 33 is a cross-sectional view illustrating a portion of a display device according to other embodiments.

FIG. 33 is a cross-sectional view illustrating a portion of a display device according to other embodiments.

Referring to FIG. 33, in a display device 10_6 according to other embodiments, the display substrate 300 may further include color filters CF1, CF2, CF3, and CF4 and light blocking members BM located on the base layer BL. The color filters CF1, CF2, CF3, and CF4 and the light blocking members BM may be located directly on the base layer BL. Other embodiments of FIG. 33 are different from the above-described embodiments in that the display device further includes the color filters CF1, CF2, CF3, and CF4 and the light blocking members BM located on the display substrate 300. Hereinafter, a description for overlapping contents will be omitted, and the color filters CF1, CF2, CF3, and CF4 and the light blocking members BM will be mainly described.

The light blocking members BM may be located on the base layer BL. The light blocking members BM may be located directly on the base layer BL. In some embodiments in which the display device further includes the second substrate 210, the light blocking members BM may be located directly on the second substrate 210. The light blocking members BM may be located in an area other than the display area DPA and an area in which the light emitting elements ED are not located in the display area DPA and block transmission of light. The light blocking members BM may not overlap the light emitting elements ED in the display area DPA, and may be located in a lattice shape.

In some embodiments, the light blocking member BM may include an organic light blocking material, and may be formed by a coating process, an exposing process, and the like, of the organic light blocking material. The light blocking member BM may include a dye or a pigment having light blocking properties, and may be a black matrix.

A plurality of color filters CF1, CF2, CF3, and CF4 may be located on the base layer BL. The color filters CF1, CF2, CF3, and CF4 may be located directly on the base layer BL or may be located directly on the second substrate 210 in some embodiments in which the display device further includes the second substrate 210. The color filters CF1, CF2, CF3, and CF4 may be located to correspond to areas opened by the light blocking members BM, respectively. Different color filters CF1, CF2, CF3, and CF4 may be located to be spaced apart from each other, but are not limited thereto. In some embodiments, the color filters CF1, CF2, CF3, and CF4 may also be located to overlap each other.

The plurality of color filters CF1, CF2, CF3, and CF4 may include a first color filter CF1, a second color filter CF2, a third color filter CF3, and a fourth color filter CF4. The first color filter CF1 may be located to overlap the first light emitting element ED1. The second color filter CF2 may be located to overlap the second light emitting element ED2, the third color filter CF3 may be located to overlap the third light emitting element ED3, and the fourth color filter CF4 may be located to overlap the fourth light emitting element ED4.

The plurality of color filters CF1, CF2, CF3, and CF4 may be located to fill the areas opened by the light blocking members BM, and portions of the plurality of color filters CF1, CF2, CF3, and CF4 may be located on the light blocking members BM. However, the disclosure is not limited thereto, and the color filters CF1, CF2, CF3, and CF4 may also be located in respective areas opened by the light blocking members BM. The respective color filters CF1, CF2, CF3, and CF4 may be located in an island-shaped pattern, but are not limited thereto. For example, the respective color filters CF1, CF2, CF3, and CF4 may form linear patterns extending in one direction in the display area DPA. In some embodiments, the first color filter CF1 may be a red color filter, the second color filter CF2 may be a yellow color filter, the third color filter CF3 may be a green color filter, and the fourth color filter CF4 may be a blue color filter. The respective color filters CF1, CF2, CF3, and CF4 may respectively transmit only some of light emitted from the light emitting elements ED, and may block transmission of other light. In the display device 10_6 according to other embodiments, the light emitted from the light emitting elements ED is transmitted through the color filters CF1, CF2, CF3, and CF4 and then emitted, and thus, color purity may be further improved.

In some embodiments, the different color filters CF1, CF2, CF3, and CF4 may also be located to overlap each other. The color filters CF1, CF2, CF3, and CF4 may partially overlap each other in areas between different light emitting elements ED1, ED2, ED3, and ED4 spaced apart from each other. For example, the first color filter CF1 and the second color filter CF2 may be located to overlap the first light emitting element ED1 and the second light emitting element ED2, respectively, and may be located to overlap each other in an area between the first light emitting element ED1 and the second light emitting element ED2. A portion where the first color filter CF1 and the second color filter CF2 are located to overlap each other may block transmission of both the red light emitted from the first light emitting element ED1 and the yellow light emitted from the second light emitting element ED2. In some embodiments in which the different color filters CF1, CF2, CF3, and CF4 are located to overlap each other, the light blocking members BM may be omitted. In the display device 10_6, the color filters CF1, CF2, CF3, and CF4 are located to respectively overlap each other, and thus, a process of forming separate light blocking members BM may be omitted.

Figure 34:
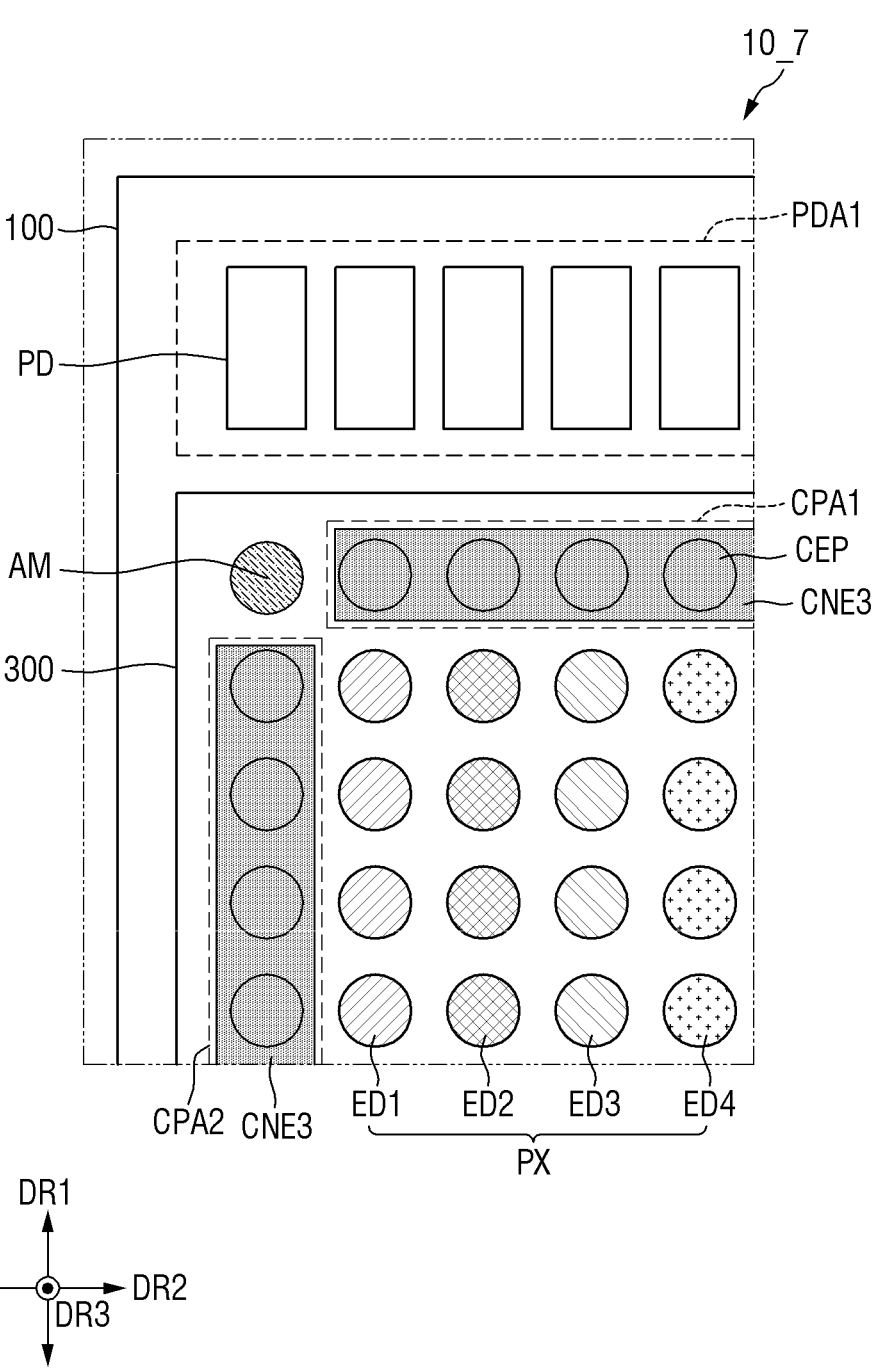
FIG. 34 is a plan view illustrating a portion of a display substrate and a circuit substrate of a display device according to other embodiments.

FIG. 34 is a plan view illustrating a portion of a display substrate and a circuit substrate of a display device according to other embodiments.

Referring to FIG. 34, a display device 10_7 according to other embodiments may further include alignment patterns AM. The display device 10_7 may include the alignment pattern AM located in the non-display area NDA in the display substrate area DSA of the circuit substrate 100, and may include the alignment pattern AM located in the non-display area NDA of the display substrate 300.

In processes for fabrication of the display device 10_7, the display substrate 300 and the second substrate 210 may be bonded to each other in a state in which they are aligned with the circuit substrate 100. Here, the light emitting elements ED of the display substrate 300 may be aligned to correspond to the pixel electrodes AE of the circuit substrate 100, respectively, and the light emitting elements ED and the pixel electrodes AE may be aligned with each other through the alignment patterns AM. The circuit substrate 100 may include an alignment pattern AM located on the first substrate 110 of the non-display area NDA, and the display substrate 300 may include another alignment pattern AM located in the non-display area NDA other than the common electrode areas CPA1, CPA2, and CPA3.

In the processes for fabrication of the display device 10_7, the circuit substrate 100 and the display substrate 300 may be aligned with each other so that the alignment patterns AM overlap each other. When the circuit substrate 100 and the display substrate 300 are bonded to each other in this state, the alignment patterns AM located on different substrates in the display device 10_7 may overlap each other in the thickness direction. It has been illustrated in FIG. 34 that one alignment pattern AM is located, but the disclosure is not limited thereto.

Positions of and an alignment between the alignment patterns AM may correspond to an alignment between the plurality of light emitting elements ED and the pixel electrodes AE, and an alignment between the third connection electrodes CNE3 and the electrode connection parts CEP. The alignment patterns AM of the circuit substrate 100 and the display substrate 300 may be located at positions where the plurality of light emitting elements ED and the pixel electrodes AE may be aligned with each other when the alignment patterns AM are aligned with each other. The display device 10_7 may further include the alignment patterns AM to precisely align the circuit substrate 100 and the display substrate 300 with each other, and to prevent or reduce the likelihood of an alignment defect, a contact defect, and the like, between the second connection electrodes CNE2 and the pixel electrodes AE.

Figure 35:
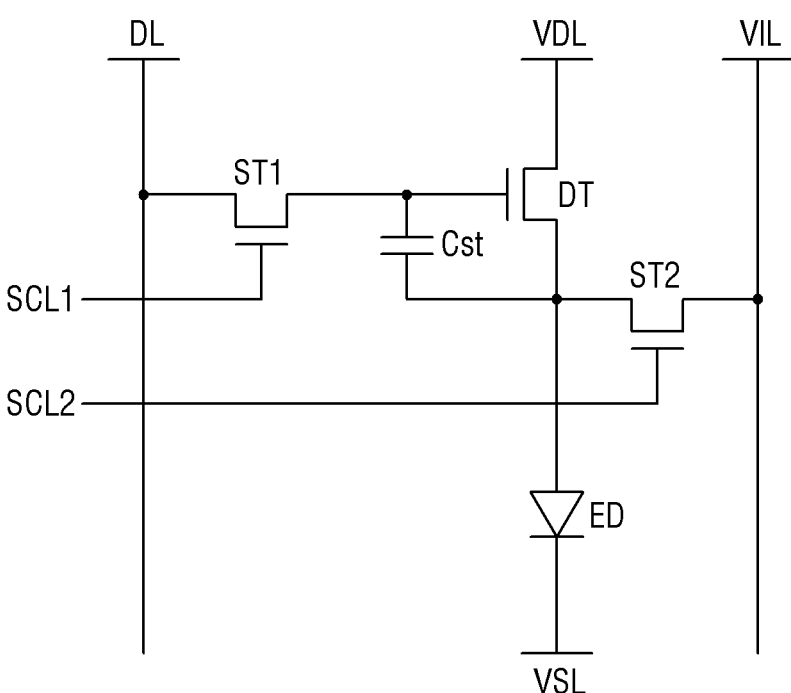
FIG. 35 is an equivalent circuit diagram of one pixel of a display device according to some embodiments.

FIG. 35 is an equivalent circuit diagram of one pixel of a display device according to some embodiments. In FIG. 35, an example of a pixel circuit diagram included in one pixel PX of FIG. 5 is illustrated.

Referring to FIG. 35, the light emitting element ED emits light according to a driving current. An amount of light emitted from the light emitting element ED may be proportional to the driving current. The light emitting element ED may be an inorganic light emitting element including an anode electrode, a cathode electrode, and an inorganic semiconductor located between the anode electrode and the cathode electrode.

The anode electrode of the light emitting element ED may be connected to a source electrode of a driving transistor DT, and the cathode electrode of the light emitting element ED may be connected to a second power line VSL to which a low potential voltage lower than a high potential voltage is supplied.

The driving transistor DT adjusts a current flowing from a first power line VDL, to which a first source voltage is supplied, to the light emitting element ED according to a voltage difference between a gate electrode and the source electrode thereof. The gate electrode of the driving transistor DT may be connected to a first electrode of a first transistor ST1, the source electrode of the driving transistor DT may be connected to the anode electrode of the light emitting element ED, and a drain electrode of the driving transistor DT may be connected to the first power line VDL to which the high potential voltage is applied.

The first transistor ST1 is turned on by a first scan signal of a first scan line SCL1 to connect a data line DL to the gate electrode of the driving transistor DT. A gate electrode of the first transistor ST1 may be connected to the first scan line SCL1, the first electrode of the first transistor ST1 may be connected to the gate electrode of the driving transistor DT, and a second electrode of the first transistor ST1 may be connected to the data line DL.

A second transistor ST2 is turned on by a second scan signal of a second scan line SCL2 to connect an initialization voltage line VIL to the source electrode of the driving transistor DT. A gate electrode of the second transistor ST2 may be connected to the second scan line SCL2, a first electrode of the second transistor ST2 may be connected to the initialization voltage line VIL, and a second electrode of the second transistor ST2 may be connected to the source electrode of the driving transistor DT.

The first electrode of each of the first and second transistors ST1 and ST2 may be a source electrode, and the second electrode of each of the first and second transistors ST1 and ST2 may be a drain electrode, but the disclosure is not limited thereto. That is, the first electrode of each of the first and second transistors ST1 and ST2 may be a drain electrode, and the second electrode of each of the first and second transistors ST1 and ST2 may be a source electrode.

A capacitor Cst is formed between the gate electrode and the source electrode of the driving transistor DT. The capacitor Cst stores a voltage difference between a gate voltage and a source voltage of the driving transistor DT.

It has been mainly described in FIG. 35 that the driving transistor DT and the first and second transistors ST1 and ST2 are formed as N-type metal oxide semiconductor field effect transistors (MOSFETs), but it is to be noted that the disclosure is not limited thereto. The driving transistor DT and the first and second transistors ST1 and ST2 may also be formed as P-type MOSFETs.

Meanwhile, a display device for displaying an image according to some embodiments may be applied to various devices and apparatuses.

Figure 36:
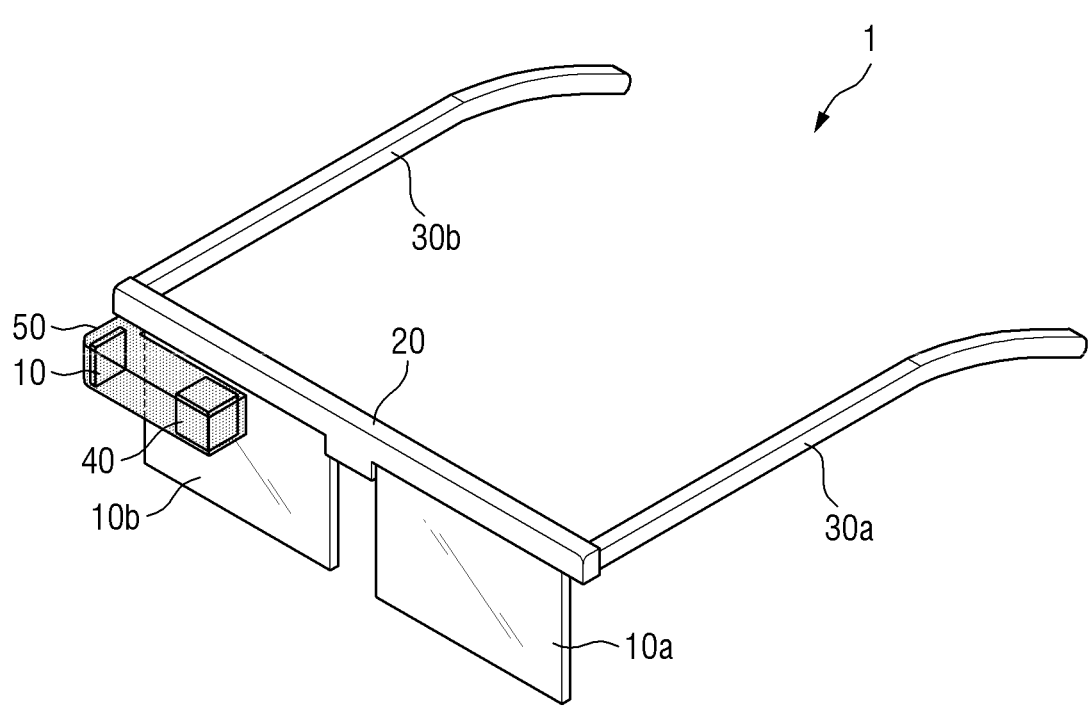
FIGS. 36 to 38 are schematic views illustrating a device including a display device according to some embodiments.
Figure 37:
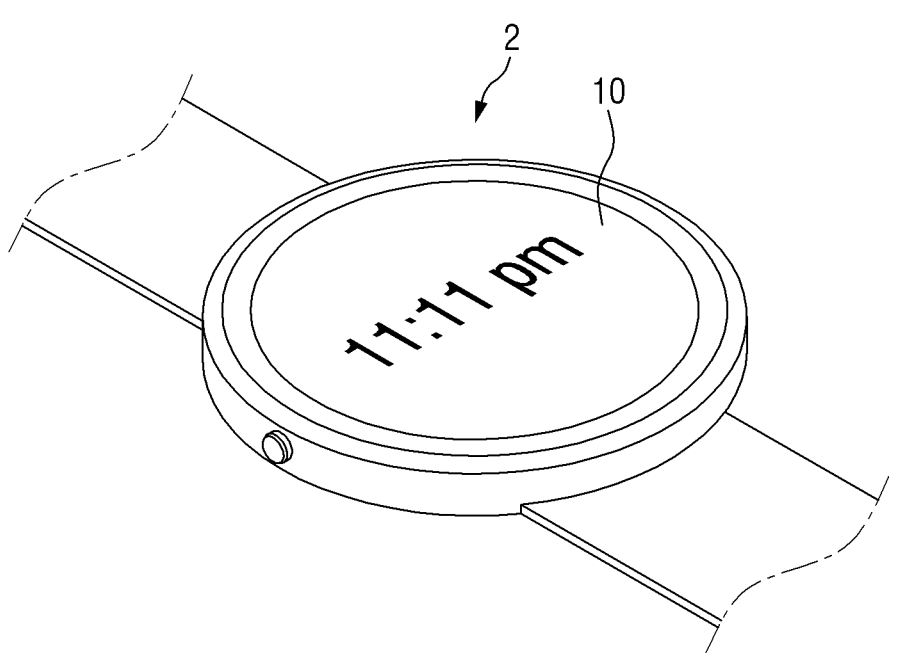
Figure 38:
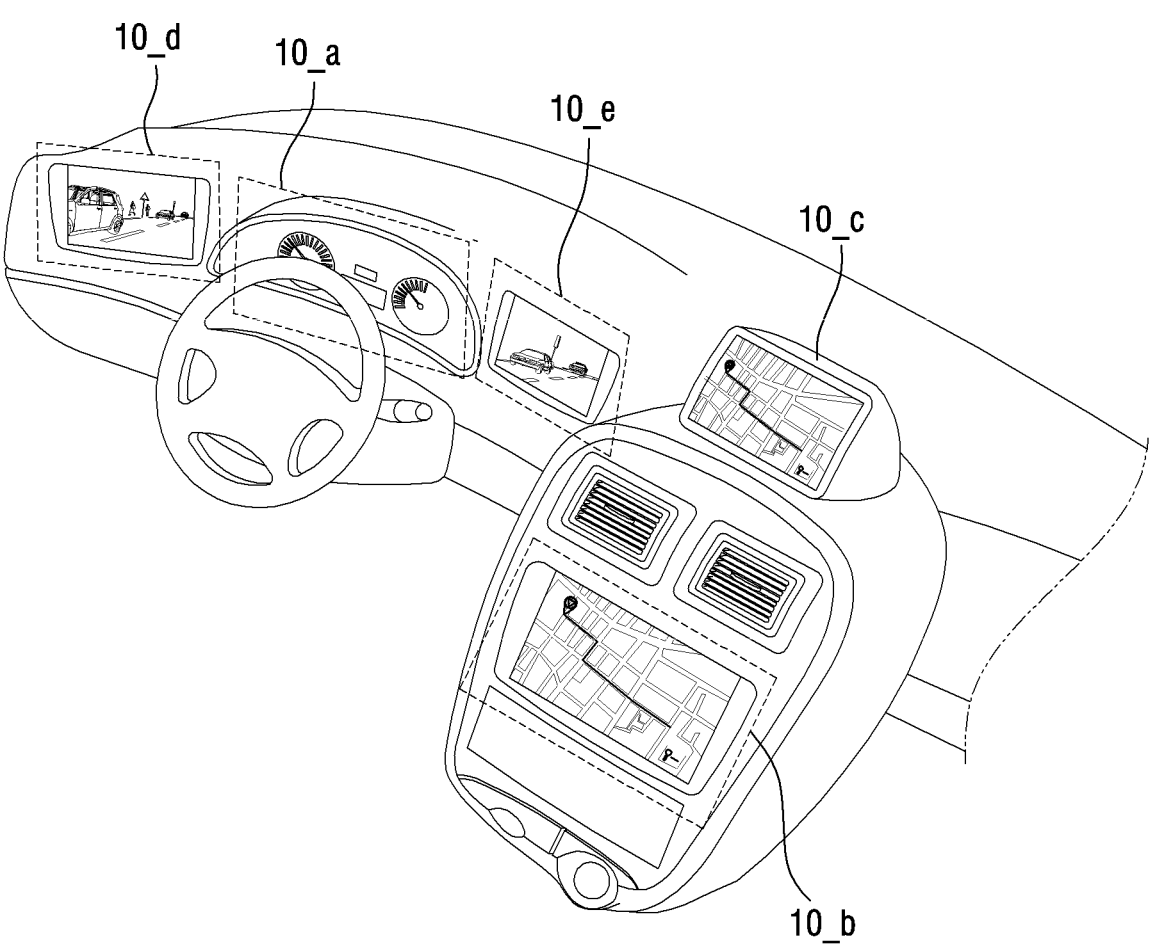

FIG. 36 illustrates a virtual reality device 1 to which the display device 10 according to some embodiments is applied, and FIG. 37 illustrates a smart watch 2 to which the display device 10 according to some embodiments is applied. FIG. 38 illustrates that display devices 10_a, 10_b, 10_c, 10_d, and 10_e according to some embodiments are applied to a display unit of a vehicle.

Referring to FIG. 36, the virtual reality device 1 according to some embodiments may be a glasses-type device. The virtual reality device 1 according to some embodiments may include the display device 10, a left eye lens 10a, a right eye lens 10b, a support frame 20, eyeglass frame legs 30a and 30b, a reflective member 40, and a display device accommodating part 50.

The virtual reality device 1 including the eyeglass frame legs 30a and 30b has been illustrated in FIG. 36, but the virtual reality device 1 according to some embodiments may also be applied to a head mounted display including a head mounted band that may be mounted on a user's head instead of the eyeglass frame legs 30a and 30b. The virtual reality device 1 according to some embodiments is not limited to a structure illustrated in FIG. 36, and may be applied in various forms to various other electronic devices.

The display device accommodating part 50 may include the display device 10 and the reflective member 40. An image displayed on the display device 10 may be reflected by the reflective member 40 and provided to a user's right eye through the right eye lens 10b. Accordingly, a user may view a virtual reality image displayed on the display device 10 through his/her right eye.

The display device accommodating part 50 may be located at a right distal end of the support frame 20, but is not limited thereto. For example, the display device accommodating part 50 may be located at a left distal end of the support frame 20, and an image displayed on the display device 10 may be reflected by the reflective member 40 and provided to a user's left eye through the left eye lens 10a. Accordingly, the user may view a virtual reality image displayed on the display device 10 through his/her left eye. Alternatively, the display device accommodating parts 50 may be located at both the left and right distal ends of the support frame 20. In this case, the user may view a virtual reality image displayed on the display device 10 through both his/her left and right eyes.

Referring to FIG. 37, the display device 10 according to some embodiments may be applied to a smart watch 2, which is one of the smart devices.

Referring to FIG. 38, display devices 10_a, 10_b, and 10_c according to some embodiments may be applied to an instrument board of the vehicle, applied to a center fascia of the vehicle, or applied to a center information display (CID) located on a dashboard of the vehicle. In addition, display devices 10_d and 10_e according to some embodiments may be applied to room mirror displays substituting for side mirrors of the vehicle.

Figure 39:
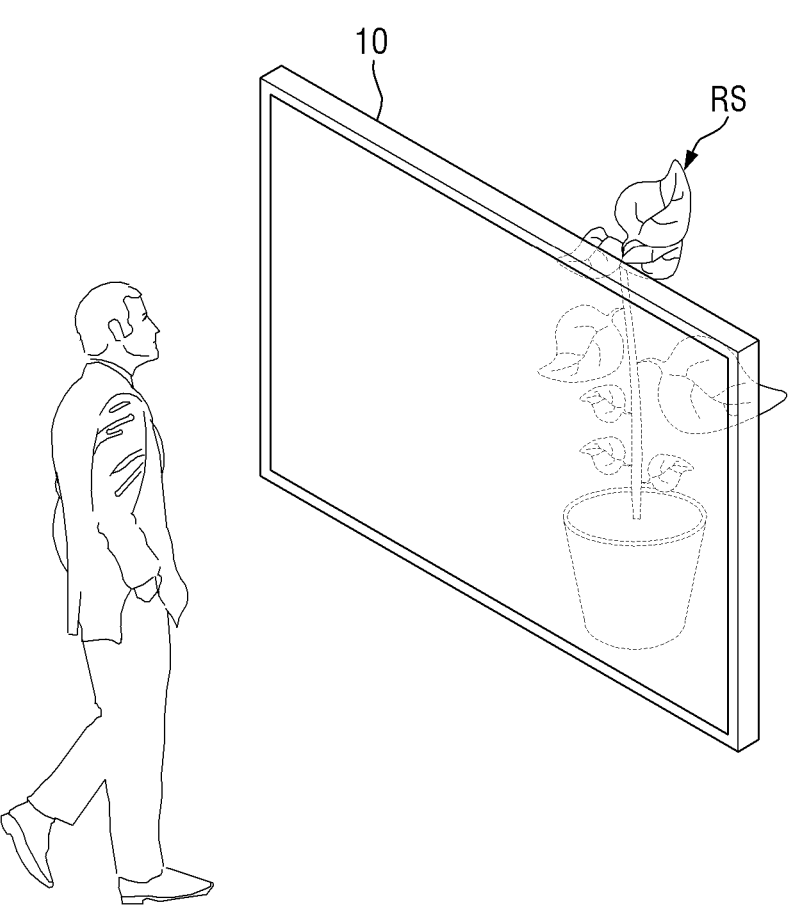
FIGS. 39 and 40 are views illustrating a transparent display device including a display device according to some embodiments.
Figure 40:
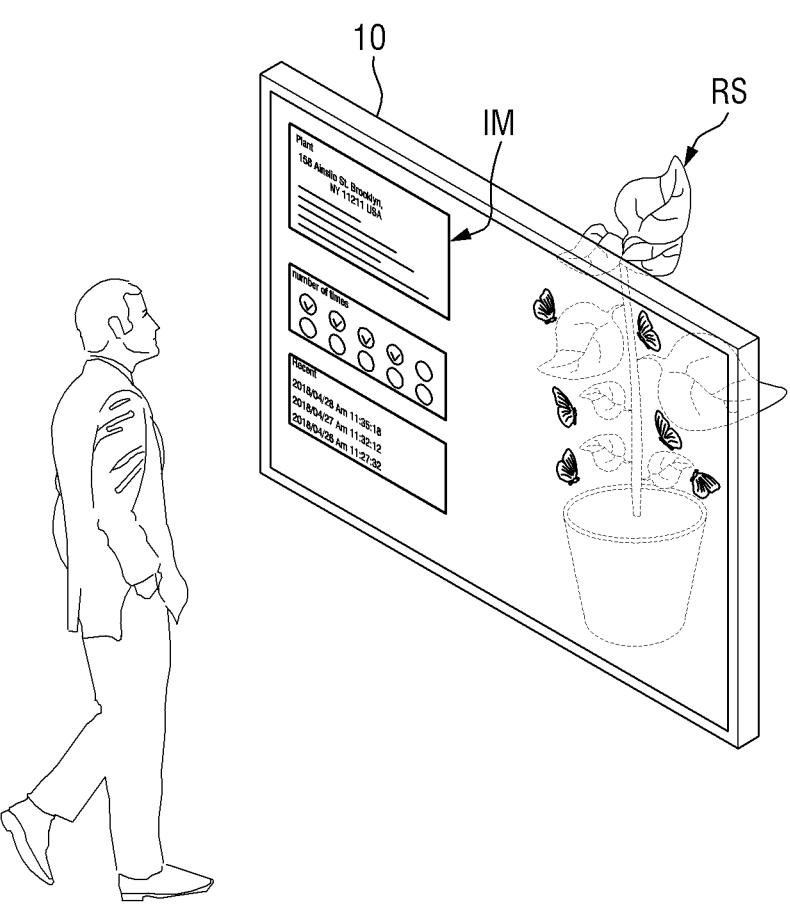

FIGS. 39 and 40 are views illustrating a transparent display device including a display device according to some embodiments.

Referring to FIGS. 39 and 40, the display device 10 according to some embodiments may be applied to a transparent display device. The transparent display device may transmit light while displaying an image IM. A user positioned on a front surface of the transparent display device may not only view the image IM displayed on the display device 10, but also see an object RS or a background positioned on a rear surface of the transparent display device.

In concluding the detailed description, those skilled in the art will appreciate that many variations and modifications can be made to the embodiments without substantially departing from the aspects of the present disclosure. Therefore, the disclosed embodiments of the present disclosure are used in a generic and descriptive sense only and not for purposes of limitation. Functional equivalents of the claims are intended to be included therein.

What is claimed is:

1. A display device comprising:
a first substrate;
pixel electrodes on the first substrate;
light emitting elements respectively on the pixel electrodes, and comprising:
    first semiconductor layers;
    second semiconductor layers;
    active layers respectively between the first semiconductor layers and the second semiconductor layers;
    a first light emitting element comprising a first active layer of the active layers;
    a second light emitting element comprising a second active layer of the active layers that is different from the first active layer;
    a third light emitting element comprising a third active layer of the active layers that is different from the first and second active layers; and
    a fourth light emitting element comprising a fourth active layer of the active layers that is different from the first to third active layers;
reflective layers surrounding side surfaces of the light emitting elements;
a common electrode layer on the light emitting elements;
first connection electrodes respectively on the first semiconductor layers;
second connection electrodes respectively between the first connection electrodes and the pixel electrodes; and
third connection electrodes on a surface of the common electrode layer on which the light emitting elements are located, and
wherein a length of each of the second connection electrodes in a thickness direction is less than a length of each of the third connection electrodes in the thickness direction.

2. The display device of claim 1, wherein the active layers comprise indium,
wherein a content of indium in the first active layer is higher than contents of indium in the second to fourth active layers,
wherein a content of indium in the second active layer is higher than contents of indium in the third and fourth active layers, and
wherein a content of indium in the third active layer is higher than a content of indium in the fourth active layer.

3. The display device of claim 1, wherein the first light emitting element is configured to emit light of a first color having a central wavelength band in a range of about 600 nm to about 750 nm,
wherein the second light emitting element is configured to emit light of a second color having a central wavelength band in a range of about 550 nm to about 600 nm,
wherein the third light emitting element is configured to emit light of a third color having a central wavelength band in a range of about 480 nm to about 560 nm, and
wherein the fourth light emitting element is configured to emit light of a fourth color having a central wavelength band in a range of about 370 nm to about 460 nm.

4. The display device of claim 1, wherein diameters of the first to fourth light emitting elements are the same.

5. The display device of claim 1, wherein a diameter of the first light emitting element is greater than diameters of the second to fourth light emitting elements, and
wherein the diameter of the fourth light emitting element is greater than the diameters of the second and third light emitting elements.

6. The display device of claim 5, wherein the diameters of the second light emitting element and the third light emitting element are the same.

7. The display device of claim 1, wherein the common electrode layer comprises a same material as the second semiconductor layers, and
wherein the second semiconductor layers are integrated with the common electrode layer.

8. The display device of claim 7,
wherein the second connection electrodes are in direct contact with the pixel electrodes, respectively, and the third connection electrodes are in direct contact with common electrode connection parts on the first substrate, respectively.

9. The display device of claim 1, further comprising an insulating layer surrounding the side surfaces of the light emitting elements, and having portions directly on the common electrode layer,
wherein the reflective layers are on the insulating layer.

10. The display device of claim 1, further comprising a base layer on the common electrode layer such that the common electrode layer is between the base layer and the light emitting elements, and comprising an undoped semiconductor.

11. A display device comprising:
a first substrate comprising a display area, and a non-display area surrounding the display area;
pixel electrodes on the first substrate in the display area;
light emitting elements respectively on the pixel electrodes, and comprising:
    first semiconductor layers;
    second semiconductor layers;
    active layers respectively between the first semiconductor layers and the second semiconductor layers;
    a first light emitting element configured to emit light of a first color having a central wavelength band in a range of about 600 nm to about 750 nm;
    a second light emitting element configured to emit light of a second color having a central wavelength band in a range of about 550 nm to about 600 nm;
    a third light emitting element configured to emit light of a third color having a central wavelength band in a range of about 480 nm to about 560 nm; and a fourth light emitting element configured to emit light of a fourth color having a central wavelength band in a range of about 370 nm to about 460 nm;

reflective layers surrounding side surfaces of the light emitting elements;

a common electrode layer in the display area and the non-display area, and connected to on the light emitting elements;

first connection electrodes respectively on the first semiconductor layers;

second connection electrodes respectively between the first connection electrodes and the pixel electrodes; and third connection electrodes on a surface of the common electrode layer on which the light emitting elements are located, wherein a length of each of the second connection electrodes in a thickness direction is less than a length of each of the third connection electrodes in the thickness direction.

12. The display device of claim 11, wherein the light emitting elements are spaced apart in a first direction, and in a second direction crossing the first direction, and wherein the first, second, third, and fourth light emitting elements are alternately in the second direction.

13. The display device of claim 11, wherein the second light emitting element and the third light emitting element are spaced apart in a first direction, wherein the first light emitting element and the fourth light emitting element are spaced apart in a second direction crossing the first direction, wherein the first light emitting element and the second light emitting element are spaced apart in a first diagonal direction between one side in the first direction and one side in the second direction, and wherein the third light emitting element and the fourth light emitting element are spaced apart in a second diagonal direction between one side in the first direction and another side in the second direction.

14. The display device of claim 13, wherein a diameter of the first light emitting element is greater than diameters of the second to fourth light emitting elements, wherein the diameter of the fourth light emitting element is greater than the diameters of the second and third light emitting elements, and wherein the diameters of the second light emitting element and the third light emitting element are the same.

15. The display device of claim 14, wherein an interval between the second light emitting element and the third light emitting element is greater than an interval between the first light emitting element and the fourth light emitting element, and wherein an interval between the first light emitting element and the second light emitting element is less than an interval between the third light emitting element and the fourth light emitting element.

16. The display device of claim 13, wherein diameters of the first light emitting element, the second light emitting element, the third light emitting element, and the fourth light emitting element are the same.

17. The display device of claim 11, wherein the first light emitting element and the third light emitting element are spaced apart in a first direction, wherein the second light emitting element and the fourth light emitting element are spaced apart in the first direction, wherein the first light emitting element and the fourth light emitting element are spaced apart in a first diagonal direction that is an oblique direction inclined from the first direction, and wherein the second light emitting element and the third light emitting element are spaced apart in a second diagonal direction crossing the first diagonal direction.

18. The display device of claim 17, wherein central portions of the first and third light emitting elements are positioned on a first reference line extending in the first direction, and wherein central portions of the second and fourth light emitting elements are positioned on a second reference line extending in the first direction.

19. The display device of claim 17, wherein a central portion of the second light emitting element is spaced apart from a third reference line in the first direction, the third reference line traversing a central portion of the first light emitting element in a second direction crossing the first direction, and wherein a central portion of the fourth light emitting element is spaced apart from a fourth reference line in the first direction, the fourth reference line traversing a central portion of the third light emitting element in the second direction.

20. A method for fabrication of a display device, the method comprising:

forming a support layer on a common electrode layer comprising an n-type semiconductor;

forming first, second, third, and fourth holes penetrating through the support layer;

forming light emitting elements comprising a first semiconductor layer that is a p-type semiconductor, a second semiconductor layer that is an n-type semiconductor, and an active layer between the first semiconductor layer and the second semiconductor layer;

forming reflective layers surrounding side surfaces of the light emitting elements; and disposing the light emitting elements on a circuit substrate on which pixel electrodes are located, wherein the light emitting elements comprise a first light emitting element comprising a first active layer, a second light emitting element comprising a second active layer, a third light emitting element comprising a third active layer, and a fourth light emitting element comprising a fourth active layer, wherein forming of the light emitting elements comprises:

forming the fourth light emitting element on the common electrode layer exposed by the first hole;

forming the third light emitting element on the common electrode layer exposed by the second hole;

forming the second light emitting element on the common electrode layer exposed by the third hole; and forming the first light emitting element on the common electrode layer exposed by the fourth hole, wherein first connection electrodes are respectively on the first semiconductor layers, second connection electrodes are respectively between the first connection electrodes and the pixel electrodes, and third connection electrodes are on a surface of the common electrode layer on which the light emitting elements are located, and wherein a length of each of the second connection electrodes in a thickness direction is less than a length of each of the third connection electrodes in the thickness direction.

* * * * *